United States Patent
Kubota et al.

(12)

(10) Patent No.: US 6,225,866 B1
(45) Date of Patent: May 1, 2001

(54) SERIES CONNECTED MULTI-STAGE LINEAR FET AMPLIFIER CIRCUIT

(75) Inventors: Yasushi Kubota, Sakurai; Ichiro Shiraki, Tenri, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/594,439

(22) Filed: Jun. 14, 2000

Related U.S. Application Data

(62) Division of application No. 09/012,424, filed on Jan. 23, 1998, now abandoned, which is a continuation of application No. 08/416,370, filed on Apr. 4, 1995, now abandoned.

(30) Foreign Application Priority Data

| May 31, 1994 | (JP) | 6-119225 |
| May 31, 1994 | (JP) | 6-119238 |
| Jun. 21, 1994 | (JP) | 6-139150 |
| Jul. 6, 1994 | (JP) | 6-155014 |

(51) Int. Cl.[7] .................................................... H03F 3/68
(52) U.S. Cl. ........................... 330/295; 330/310; 330/311; 330/277
(58) Field of Search .................................. 330/295, 277, 330/310, 311

(56) References Cited

U.S. PATENT DOCUMENTS

| 4,237,426 | 12/1980 | Sueyashi . |
| 4,321,554 | 3/1982 | Quilter . |
| 4,366,446 | 12/1982 | Henderson et al. . |
| 5,734,366 | 3/1998 | Kubota . |
| 6,157,258 | * 12/2000 | Adishian et al. ..................... 330/295 |

FOREIGN PATENT DOCUMENTS

| 59-43613 | 3/1984 | (JP) . |
| 62-29315 | 2/1987 | (JP) . |
| 62-85015 | 5/1987 | (JP) . |
| 02271388 | 11/1990 | (JP) . |
| 3-289718 | 12/1991 | (JP) . |
| 4-46713 | 4/1992 | (JP) . |
| 4-672299 | 6/1992 | (JP) . |
| 5-119741 | 5/1993 | (JP) . |
| 05150748 | 6/1993 | (JP) . |
| 06019429 | 1/1994 | (JP) . |
| 6-27439 | 2/1994 | (JP) . |

OTHER PUBLICATIONS

"A High Resolution 0.7–in.–Diagonal TFT–LCD", T. Maekawa et al, *SID 92 Digest*, pp. 55–58.

"Full–Color LCDs with Completely Integrated Drivers Utilizing Low–Temperature Poly–Is TFTs", H. Oshima et al, *SID 93 Digest*, pp. 387–390.

*Electronic Circuit (II) 2nd Edition*, published on Sep. 10, 1985 by McGraw–Hill Book Co., Japan, Ltd. pp. 323–327.

*Electronic Circuit (vol. 1) 7th Edition*, published on Feb. 25, 1977 by McGraw Hill Book Co., Japan. Ltd., pp. 174–175.

* cited by examiner

Primary Examiner—Michael B Shingleton
(74) Attorney, Agent, or Firm—Nixon & Vanderhye, PC

(57) ABSTRACT

A sampling circuit is arranged so that source voltages $V_{DD}$ and $V_{EE}$, which are to be applied to two inverters at the latter stages in a signal path on the p-channel transistor side, are shifted to the positive side with respect to source voltages $V_{CC}$ and $V_{SS}$ that are applied to the other inverters. With such a power supply construction, video signals on the low-potential side in a video signal line are picked up by the n-channel transistor and video signals on the high-potential side are picked up by the p-channel transistor, and the resulting signals are supplied to a data signal line. This arrangement makes it possible to reduce the gate input voltage upon conduction of the sampling switch. Moreover, by shifting the levels of the source voltages as described above, it becomes possible to ensure writing and holding operations even in the case of having signals with a small amplitude. Therefore, even in the case when devices having low withstand voltage are used, no damage is caused on the circuit characteristics.

9 Claims, 48 Drawing Sheets

SERIES CONNECTED MULTI-STAGE LINEAR FET AMPLIFIER CIRCUIT

This is a division of application Ser. No. 09/012,424, filed Jan. 23, 1998, now abandoned, which in turn was a continuation of application Ser. No. 08/416,370, filed Apr. 4, 1995, abandoned, the entire content of which is hereby incorporated by reference in this application.

FIELD OF THE INVENTION

The present invention relates to a sampling circuit for sampling analog signals such as video signals, a signal amplifier f or amplifying analog signals, and an image display.

BACKGROUND OF THE INVENTION

In recent years, sampling circuits for sampling analog signals have been utilized in various fields, and they are modified into various systems that are suitable for the respective fields. In particular, in image displays such as liquid crystal displays, sampling circuits for sampling video signals are adopted in data-signal-line driving circuits, which will be described below.

For example, in a liquid crystal display of the active-matrix driving system, multiple scanning signal lines and multiple data signal lines are installed in an intersecting manner, and a pixel is disposed in each area enclosed by the adjacent scanning signal lines and the adjacent data signal lines. Thus, multiple pixels are disposed in the form of matrix.

Each pixel is provided with a switching device consisting of an FET (Field Effect Transistor) of the MOS type, and a pixel capacity. The switching device is conducted by a signal given to the scanning signal line so that it receives data (video signal) given to the data signal line, and supplies the data to the pixel capacity.

The data signal lines receive video signals that have been sampled by a data-signal-line driving circuit, and the scanning signal lines are successively selected by the scanning-signal-line driving circuit. Through the selections of the scanning signal lines, the video signals, which are given to the respective data signal lines, are written to the pixels, and held therein.

This writing process of data to the data signal lines is carried out using the point-sequential driving method or the line-sequential driving method.

In the point-sequential driving method, the inputted video signals are written to the data signal lines by opening and closing the sampling switch installed in the sampling circuit in synchronism with pulses that are released from a plurality of outputs of a shift register. In this method, supposing that the number of data lines in the horizontal direction is n, the time that allows the video signals to be written to the data signal lines is only as short as a 1/n of an effective horizontal scanning period (approximately 80% of the horizontal scanning period). For this reason, when the time constant (product of capacity and resistance) of the data signal lines becomes greater upon adopting large screens to meet the current demands, it is difficult to maintain a sufficient writing process, thereby causing adverse effects on the quality of displayed images.

In particular, this problem is aggravated when the sampling switch is constituted of transistors with low driving performance, such as multi-crystal thin-film transistors which will be described later. Therefore, in conventional arrangements, the channel width of the transistors constituting the sampling switch is set to be greater in order to maintain a sufficient writing process.

In the line-sequential driving method, the sampling switch is opened and closed in synchronism with pulses that are released from a plurality of outputs of a shift register, in the same manner as the point-sequential driving method. Moreover, in the line-sequential driving method, the inputted video signals are temporarily stored in sampling capacities, and then released to the data signal lines through a buffer amplifier during the next horizontal scanning period.

In general, since the sampling capacities are smaller than the capacities of the data signal lines, the line-sequential driving method makes it possible to shorten the time during which the video signals are inputted from the video signal line and are written to the data signal lines. Further, the writing process to the data signal lines, which requires a greater load, is carried out during the horizontal scanning period; this allows a sufficient writing process to the data signal lines. As described above, the line-sequential driving method has less problems than the point-sequential driving method.

However, the disadvantage of the line-sequential driving method is that the electric charge held in the sampling capacity decreases due to leakage current in the sampling switch as time elapses and it also decreases due to capacity divisions upon transferring data to the buffer amplifier. In order to suppress these adverse effects, it is proposed that the sampling capacity be increased; however, this might cause an insufficient writing process in the same manner as caused in the point-sequential driving method. Therefore, in this case, also, it is necessary to increase the channel width of the transistors constituting the sampling switch in order to maintain a sufficient writing process.

Here, for example, as shown in FIG. 47, the above-mentioned sampling circuit is provided with a group of inverters 202 consisting of a plurality of stages of series connected inverters 201 and a sampling switch 203 consisting of only n-channel transistors. In this sampling circuit, when the video signal from the video signal line VL is written to the data signal line SL, an output signal from the shift register 204, which forms a timing signal, is amplified by the group of the inverters 202, and is inputted to the gate electrode of the sampling switch 203.

As shown in FIG. 48, the inverter 201 has a construction wherein an n-channel transistor 201a and a p-channel transistor 201b are connected in series with each other.

During the writing process, the sampling switch 203 requires a high-level signal $V_H$ that is sufficient to write the video signal on the high-voltage side in its conducted state, while it requires a low-level signal $V_L$ that allows the holding of the video signal on the low-voltage side in its cutoff state. Therefore, during the writing process, it is necessary to substantially increase the amplitude of the signal to be given to the gate electrode of the sampling switch 203.

More specifically, supposing that the amplitude of the video signal is $V_{sig}$, the threshold voltage of the sampling switch 203 is $V_{tn}$, and the on-margin and off-margin of the sampling switch 203 are $V_{on}$ and $V_{off}$ respectively, signals $V_H$ and $V_L$ are indicated as follows:

$$V_H = V_{sig} + V_{tn} + V_{on} \quad (1)$$

$$V_L = -V_{sig} + V_{tn} - V_{off} \quad (2)$$

Here, the on-margin represents a voltage to be added to the threshold voltage of the sampling switch 203 in order to provide a sufficient writing process, and the off-margin represents a voltage to be subtracted from the threshold voltage of the sampling switch 203 in order to substantially reduce the leakage current. For example, typical values for the respective voltages are: $V_{sig}=5(V)$, $V_{tn}=2(V)$, $V_{on}=4(V)$, and $V_{off}=5(V)$. In accordance with equations (1) and (2), signals $V_H$ and $V_L$ are represented as follows based on these values.

$$V_H=5+2+4=11(V)$$

$$V_L=-5+2-5=-8(V)$$

Therefore, it is necessary to provide a source voltage of 19V that is the voltage difference between $V_H$ and $V_L$. Accordingly, the elements need to have a withstand voltage of up to 19V.

Moreover, FIGS. 49 and 50 show other sampling circuits, each of which is provided with a group of inverters 205(206) consisting of a plurality of steps of inverters 201, and a sampling switch 207. The group of inverters 205(206) is branched into two signal paths from the inverter 201 at the second stage from the shift register 204, and a plurality of steps of inverters 201 are installed in each signal path.

The sampling switch 207 has a CMOS construction wherein n-channel and p-channel type transistors 207a and 207b are connected in parallel with each other. In this sampling switch 207, the video signal on the low-voltage side is written by the n-channel transistor 207a and the video signal on the high-voltage side is written by the p-channel transistor 207b.

During the writing process, the output signal of the shift register 204 is inputted to the n-channel transistor 207a and the p-channel transistor 207b through the inverters 201 and some logical circuits (not shown) which are installed as occasion demands. The inverters 201 are installed so as to drive the sampling switch 207 having a great channel width (having a great input load) by the use of the output of the shift register 204 having a small driving power as well as to adjust the phase (polarity) of signals. The later the stage of the inverter 201, the greater the channel width of the transistor that is used in the inverter 201. The logical circuits are installed so as to control the sampling timing so that only the minimum video signals required are sampled. It is necessary for the input signals to the n-channel transistor 207a and the p-channel transistor 207b to have phases that are reversed to each other. For this reason, the difference between the numbers of the inverters 201 in the signal path to the n-channel transistor 207a and the inverters 201 in the signal path to the p-channel transistor 207b is set to an odd number (normally set to one).

In general, the above-mentioned sampling circuit is driven by a single power supply (in this case, $V_{cc}$ and $V_{ss}$); therefore, the voltage levels of the input signals to the gate electrodes of the transistors 207a and 207b are kept the same. Then, the voltage level is given so that each transistor 207a (207b) is brought to a complete cutoff state.

The above-mentioned voltage level has to be set large enough to allow the video signal to be written to the data signal line SL upon conduction of the transistors 207a and 207b. The level is also set to a size that allows the written video signal to be held until the next writing process upon cutoff of the transistors 207a and 207b. Here, the leakage current of the transistors 207a and 207b is at a level that is not negligible even if it is below the threshold voltage; therefore, it is necessary to provide a certain amount of reversed bias voltage (negative bias voltage in the n-channel transistor 207a) in order to obtain a sufficient holding characteristic.

Normally, when such a bias voltage as to lead the complete cutoff is applied to one of the transistors (n or p) having one polarity, the other transistor having the other polarity is sufficiently conducted to allow a sufficient writing process of the video signal; therefore, it is not necessary to take into consideration voltages under normal conditions. In other words, it is only necessary to provide voltages that make the transistors cut off completely.

More specifically, supposing that the amplitude of the video signal is $V_{sig}$, the threshold voltage of the n-channel transistor 207a is $V_{tn}$, the threshold voltage of the p-channel transistor 207b is $V_{tp}$ and the off-margin of the sampling switch 207 is $V_{off}$, signals $V_H$ and $V_L$ are indicated as follows:

$$V_H=V_{sig}+V_{tp}+V_{off} \quad (3)$$

$$V_L=-V_{sig}+V_{tn}-V_{off} \quad (4)$$

For example, typical values for the respective voltages are: $V_{sig}=5(V)$, $V_{tn}=2(V)$, $V_{tp}=-2(V)$, and $V_{off}=5(V)$. In accordance with equations (3) and (4), signals $V_H$ and $V_L$ are represented as follows based on these values.

$$V_H=5-2+5=8(V)$$

$$V_L=-5+2-5=-8(V)$$

Therefore, it is necessary to provide a source voltage of 16V that is the voltage difference between $V_H$ and $V_L$. Accordingly, the elements need to have a withstand voltage of up to 16V.

In conventional active-matrix-type liquid crystal displays, an amorphous silicon thin-film formed on a transparent substrate is used as a substrate material for a switching device. Further, the liquid crystal display is provided with a scanning-signal-line driving circuit and a data-signal-line driving circuit as externally attached driving-use ICs.

In recent years, however, in order to meet demands for improvement in the driving performance of switching devices as well as for reduction in assembling costs of the above-mentioned driving-use ICs and other demands that are raised to satisfy the current trend for large screens, a technology has been suggested and already reported wherein a pixel array consisting of pixels disposed in the form of matrix and both of the driving circuits are monolithically formed on a polycrystal silicon thin film. Moreover, in order to achieve large screens and low costs, it has been proposed that switching devices and other devices are formed on a polycrystal silicon thin film on a glass substrate under processing temperatures not more than the distortion point of glass (about 600° C.).

However, in such a construction where sampling circuits are formed on a polycrystal silicon thin film, various problems have been raised because of inferior characteristics of the devices.

One problem is that the withstand voltage of those devices is low (that is, the devices deteriorate greatly when stress is applied), compared to that of the transistors formed on a mono-crystal silicon substrate. In particular, this problem is aggravated in the case of multi-crystal silicon thin-film transistors formed on a glass substrate. In fact, although it depends on the manufacturing process, the construction of the devices, the channel widths and other factors, the withstand voltage between the source and drain in these transistors is around 15V.

Moreover, compared to mono-crystal silicon transistors, the carrier mobility of multi-crystal silicon transistors is rather small, that is, about one-tenth thereof; this results in a far inferior driving performance. For this reason, signals with a higher level are required upon conduction, in order to provide a sufficient writing operation for video signals on the high-potential side. In addition, it is necessary to use devices of large size in order to obtain a driving power as high as that of the mono-crystal silicon transistors.

Furthermore, another problem is that since multi-crystal silicon thin-film transistors have a greater sub-threshold factor, a conventional off-margin causes a large leakage current. For this reason, signals with a lower level are required upon cutoff, in order to suppress the leakage current so that video signals on the low-potential side can be held.

Therefore, in the multi-crystal silicon thin-film transistors, it is necessary to provide signals having an amplitude greater than that in the mono-crystal silicon transistors, from the aspects the carrier mobility and the sub-threshold factor. However, in the case of constituting the group of inverters 202 and the sampling switch 203 by using multi-crystal silicon thin-film transistors, it is impossible to apply high voltages to the devices because of their low withstand voltage. As a result, problems, such as insufficient writing operation for video signals or fluctuations in video signals due to leakage current, might occur and the quality of displayed images might be diminished.

Here, the application of the sampling switch 207 makes the amplitude of required signals become smaller to a certain extent. However, there are still some cases in which the amplitude of the signals exceeds the withstand voltage of the multi-crystal silicon thin-film transistors, and as with the application of the sampling switch 203, the same problems, such as insufficient writing operation for video signals or fluctuations in video signals due to leakage current, might occur and the quality of displayed images might be diminished.

As described above, when a driving circuit, constituted by groups of transistors that are inferior in their characteristics to mono-crystal silicon transistors, is adopted, one of the conventional problems is that it is not possible to obtain a sufficient writing operation.

Moreover, in the sampling circuits having the constructions as shown in FIGS. 49 and 50, the numbers of the inverters 201 are different between the signal path to the n-channel transistor 207a and the signal path to the p-channel transistor 207b; this causes a slight difference in delay time upon transferring signals, and thus causes offsets in the timing of conduction and cutoff in the transistors 207a and 207b. As a result, fluctuations in signal levels tend to occur upon writing video signals, thereby causing an inaccurate writing operation. The following description will discuss the reasons for this problem in more detail.

When the transistors 207a and 207b are cut off, noise is generated between the source electrode and gate electrode of each transistor due to its parasitic capacity. This noise is caused by a potential change in the gate electrode after the cutoff of the transistor; therefore, the noise generated at the n-channel transistor 207a has negative polarity and the noise generated at the p-channel transistor 207b has positive polarity. The magnitude of the noise is proportional to the channel width of the transistor.

If the timings of the cutoffs coincide with each other between the n-channel transistor 207a and the p-channel transistor 207b, and if the magnitudes of the noises are the same between them, the noises are virtually cancelled. However, if there is an offset between the timings of the cutoffs, noise remains due to the transistor having the delayed timing of the cutoff. For example, in the sampling circuit shown in FIG. 50, the signal path to the p-channel transistor 207b has more inverters 201 than the signal path to the n-channel transistor 207a by one stage; therefore, it has a longer path by one stage, and this causes a delay in the timing of the cutoff. Consequently, the potential of the data signal line SL is shifted in the positive direction.

When such a sampling circuit is applied to a data-signal-line driving circuit, potential fluctuation occurs in video signals, thereby causing adverse effects on the liquid crystal displaying operation. In particular, in the case of multi-gradation displaying operation, it is difficult to obtain desired gradations. Further, in the case where transistors with greater channel widths are used to meet the demands for large screens and high resolution as described earlier, the adverse effects due to potential fluctuation are further aggravated. In addition, in the case of using devices having a small driving power, such as multi-crystal silicon thin-film transistors, it is necessary to widen the channel widths of the transistors, and the adverse effects due to potential fluctuation are further aggravated.

Here, as shown in FIG. 51, another method has been proposed (see SID 92 DIGEST pp.55–58) wherein a latch circuit consisting of two inverters 208 and 209 connected in parallel with each other in the reversed direction is inserted between two signal paths forming the input stages to inverters 201 that are disposed right before the transistors 207a and 207b, and this method aims to make the timings of the cutoffs coincide with each other between the n-channel transistor 207a and the p-channel transistor 207b.

In this method, however, it is necessary to increase the driving power for the inverters 208 and 209 constituting the latch circuit to a certain extent, in order to make the timings of signals in the two paths coincident with each other. In this case, there is a high possibility that the signal change becomes slow temporarily because of the input signals having different polarities and that a through current is caused temporarily since the intermediate potential has been maintained.

In the meantime, in the image displays of the active-matrix type as described earlier, a signal amplifier is installed at the output stage in order to amplify the signals in the data-signal-line driving circuit of the line-sequential type and other circuits. For use as such an amplifier, amplifiers having linear characteristics which allow an output that is proportional to an input are preferably used. Normally, operational amplifiers are used for this purpose, but cascode amplifiers, which require fewer devices, are sometimes used. In addition, the above-mentioned signal amplifier is also used in various apparatuses other than image displays, since it has characteristics which allow an output that is proportional to an input.

One example of such a cascade amplifier is described on page 324 in "Electronic Circuits for Transistors and ICs (II) 2nd. Edition" published by McGraw-Hill Book Company on Jul. 10, 1982. This cascode amplifier, which is constituted of two bipolar transistors of the same type connected in series with each other, features that although the dc levels are different between input and output, no attenuation occurs in the ac component.

FIG. 52 shows one example of a signal amplifier wherein cascode amplifiers consisting of FETs are used.

The signal amplifier is provided with two cascode amplifiers that are connected in series with each other. The cascode amplifier at the former stage is constituted of p-channel transistors 211 and 212 connected in series with each other that are disposed between the source terminal (voltage $V_{CC}$) on the high-potential side and the source terminal (voltage $V_{SS}$) on the low-potential side. Further, the cascode amplifier at the latter stage is constituted of n-channel transistors 213 and 214 connected in series with each other that are disposed between the above-mentioned source terminals. Predetermined bias voltages $V_{BP}$ and $V_{BN}$ are applied to the respective gate electrodes of the transistors 212 and 214 so that they function as constant current sources. The input signal is applied to the gate electrode of the transistor 211, and the output signal is drawn from the junction between the transistors 213 and 214.

With this arrangement where the two cascade amplifiers are installed in series with each other, the above-mentioned amplifier prevents the input level from being affected by the fluctuation in the output level.

However, the problem of the above-mentioned amplifier is that: upon receipt of an input signal with its level changing in an increasing fashion, an output responding to the level changes at high speeds is obtained; however, upon receipt of an input signal with its level changing in a decreasing fashion, it is not possible to obtain an input signal responding to the level changes at high speeds.

For this reason, even if the above-mentioned signal amplifier is applied to image displays of the active-matrix type, it is highly possible that the video signals are not written to the data signal line within a predetermined period of time. In particular, when it is applied to image displays with multi-gradation displaying function, the quality of the displayed images tends to be diminished.

Here, if the driving performance of the transistor 214 is increased, that is, if the stationary current in the transistor 214 is increased, it is possible to obtain an output responding to the level changes at high speeds, even upon receipt of decreases in the level of the input signal. However, increasing the driving performance of the transistor 214 causes an increase in power consumption.

In particular, in the case of transistors formed on a multi-crystal silicon thin film disposed on an insulating substrate, the carrier mobility is low, the threshold voltage is high, and the withstand voltage is low in comparison with transistors formed on a mono-crystal silicon substrate as described earlier; therefore, it is difficult to increase the driving performance of the transistor 214 beyond a certain limit.

Consequently, even if it is aimed to make high-quality image displays of the active-matrix type by monolithically forming pixel arrays and driving circuits on a multi-crystal silicon thin film disposed on an insulating substrate in order to meet the demands for large screens and inexpensive apparatuses, it is difficult to achieve this purpose as long as the conventional signal amplifiers are used.

In some conventional liquid crystal displays of the active-matrix driving type, switching devices, such as amorphous thin-film transistors, are provided on a light-transmitting type insulating substrate such as a glass substrate. In these liquid crystal displays, a display-use-electrode substrate, which has a construction where wiring, such as data signal lines and scanning signal lines, is formed together with switching devices, is used. The liquid crystal displays of this type have been widely used, because high-quality images are provided, because they have less limitation to the area on the light-transmitting type insulating substrate to be utilized as a display-use-electrode substrate, and because they are well suited for either type of liquid crystal displays of reflection-type and transmission-type.

In the above-mentioned liquid crystal displays, the driving circuits for supplying data signals and scanning signals to pixel portions having switching devices, that is, the data-signal-line driving circuit and the scanning-signal-line driving circuit, have to be connected to the display-use-electrode substrate. The following two methods and other methods are used as the connecting method: the film carrier method wherein a connecting film consisting of a polyimide-resin thin-film base or other bases whereon a number of copper-thin-film lines are formed is used; and the COG (Chip on Glass) method wherein driving circuits are directly packaged on the display-use-electrode substrate.

In recent years, the driver monolithic technique, which improves the packaging efficiency of circuit devices by integrally forming the driving circuits and switching devices, has been developed, as described earlier. However, as long as amorphous silicon thin-film transistors, which are currently being used, are adopted as the switching devices, it is difficult to fully realize the driver monolithic technique because of the deficiency in driving performance. Therefore, the driver monolithic technique wherein multi-crystal silicon thin-film transistors capable of improving the driving performance are adopted is currently being developed. These multi-crystal silicon thin-film transistors are formed by using multi-crystal silicon thin films as the semiconductor layers constituting the transistors.

As described above, it is essential to use the multi-crystal silicon thin films in order to realize the driver monolithic technique. However, the problems of the thin-film transistors are: only poor withstand voltage is available between the source and drain; a great difference exists between the threshold voltages of the NMOS transistor and the PMOS transistor; and the values of the threshold voltages themselves are great. Because of these problems in the thin-film transistors, signal amplifiers (buffer amplifiers), which are used in the driving circuits in a liquid crystal display, particularly, those used in the data-signal-line driving circuit as the output circuit at the last stage, have a problem that their linear-operation region is narrowed.

For example, a signal amplifier, shown in FIG. 53, is provided with two stages of source-follower-type linear circuits that function as the output circuit of the above-mentioned data-signal-line driving circuit. This signal amplifier is constituted of a linear circuit 221 of the NMOS type placed at the former stage and a linear circuit 222 of the PMOS type placed at the latter stage.

The linear circuit 221 is constituted of series connected n-channel transistors 223 and 224 that are placed between the source terminal (voltage $V_{dd}$) on the high-potential side and the source terminal (voltage $V_{ss}$) on the low-potential side. An input signal (input voltage) $V_{in}$ is inputted to the gate electrode of the transistor 223, and a bias voltage $V_{BN}$ is applied to the gate electrode of the n-channel transistor 224. Further, an output voltage $V_o$ to the linear circuit 222 is outputted from the junction of the transistors 223 and 224.

The linear circuit 222 is, on the other hand, constituted of series connected p-channel transistors 225 and 226 that are placed between the source terminal (voltage $V_{dd}$) on the high-potential side and the source terminal (voltage $V_{ss}'$) on the low-potential side. A bias voltage $V_{BP}$ is applied to the gate electrode of the p-channel transistor 225, and the output voltage $V_o$ is inputted to the gate electrode of the p-channel transistor 226. Further, an output voltage $V_{out}$ is outputted from the junction of the transistors 225 and 226.

Here, it is assumed that the n-channel transistors 223 and 224 and the p-channel transistors 225 and 226 have the same device characteristics respectively. Moreover, the bias voltage $V_{BN}$ is set to such a value that the n-channel transistor 224 operates within its saturated area. $V_{bn}$ is a potential difference between the gate and source when the bias voltage $V_{BN}$ is applied thereto. Similarly, the bias voltage $V_{BP}$ is set to such a value that the transistor 225 operates within its saturated area. $V_{bp}$ is a potential difference between the gate and source when the bias voltage $V_{BP}$ is applied thereto.

Supposing that the threshold voltage of the n-channel transistor 224 is $V_{thn}$ and the margin voltage for allowing the transistor 224 to operate within its saturated area with a certain amount of current is α, the following equations hold with respect to the transistor 224:

$$V_{bn}=V_{thn}+\alpha$$

$$V_{BN}-V_{ss}=V_{thn}+\alpha \quad (5)$$

Further, supposing that the threshold voltage of the transistor 225 is $V_{thp}$ and the margin voltage for allowing the transistor 225 to operate within its saturated area with a certain amount of current is a in the same manner as the transistor 224, the following equations hold with respect to the transistor 225:

$$V_{bp}=V_{thp}-\alpha$$

$$V_{BP-Vdd}=V_{thp}-\alpha \quad (6)$$

Normally, the margin voltage α is set to 1 to 2 V, and the margin voltage α of the same magnitude is used both in the NMOS transistor and the PMOS transistor.

Next, an explanation will be given on the operation of the signal amplifier.

In the linear circuit 221, the potential difference $V_{bn}$ is provided between the gate and source of the n-channel transistor 224 so that its operation is performed within its saturated area. In this case, a current $I_{sd^2}$ flowing between the source and drain of the n-channel transistor 224 is represented by the following equation, since the operation takes place within the saturated area.

$$I_{sd^2}=(\tfrac{1}{2})\cdot Cox\cdot \mu(W/L)\cdot (V_{bn}-V_{thn})^2$$

wherein

Cox: Capacity of gate insulating film
W: Channel width of transistor
μ: Carrier mobility
L: Channel length of transistor.

The path of current Isd1 flowing through the n-channel transistor 223 is branched toward the following stage at the junction between the n-channel transistors 223 and 224, and this branched current path is connected to the gate electrode of the transistor 226, thereby remaining in a virtually open state electrically. Therefore, in this stationary state, $I_{sd^1}$ is represented as $I_{sd^1}=I_{sd^2}$.

Since the potential difference between the gate and source, which allows the current $I_{sd^2}$ to flow through the transistor 224, is $V_{bn}$ and the device characteristics of the n-channel transistors 223 and 224 are the same, the potential difference between the gate and source of the n-channel transistor 223 is also represented by $V_{bn}$, and the output voltage $V_o$ of the first-stage circuit 1 is represented by:

$$V_o=V_{in}-V_{bn}.$$

As for the linear circuit 222 at the following stage, since the potential difference $V_{bp}$ is given between the gate and source of the p-channel transistor 225 so that its operation takes place within the saturated area, the same operation as in the preceding stage is carried out except for the difference in polarity. Therefore, $V_{out}$ is represented as follows:

$$V_{out}=V_o-V_{bp}.$$

Thus, $V_{out}$ satisfies the following relationship with respect to $V_{in}$:

$$V_{out}=V_{in}-V_{bn}-V_{bp} \quad (7)$$

Here, the ideal input-to-output characteristic in the signal amplifier is:

$$V_{out}=V_{in}.$$

Therefore, this signal amplifier has an offset of $-(V_{bn}+V_{bp})$.

FIG. 54 shows the input-to-output characteristics of the signal amplifier.

In FIG. 54, curve E indicates the input-to-output characteristic of the linear circuit 221, and curve F indicates the input-to-output characteristic of the linear circuit 222. The input voltage $V_{in}$ to the signal amplifier is indicated by line segment $L_1$, and the output voltage $V_o$ is, on the other hand, indicated by line segment $L_2$ that corresponds to a straight-line portion of curve E and that is given as an output range within the linear-operation region of the linear circuit 221.

Next, when the output voltage $V_o$ is indicated by line segment $M_1$ as an input signal to the linear circuit 222, the output voltage $V_{out}$ is indicated by line segment $M_2$ that corresponds to a straight-line portion of curve F and that is given as an output range within the linear-operation region of the signal amplifier. In this case, the output range (line segment $M_1$) within the linear-operation region of the linear circuit 221 has a large portion that exceeds an input range (line segment $M_3$) that corresponds to the linear-operation region of the linear circuit 222, and this exceeding portion is represented by the length of line segment N.

As explained above, the linear-operation region of the signal amplifier is narrowed. Further, the greater the absolute value of the threshold voltage, the greater the bias voltage $V_{BN}$ has to be set, and at the same time the smaller the bias voltage $V_{BP}$ has to be set. Moreover, the greater the difference between the absolute values of the threshold voltages of the NMOS transistor and the PMOS transistor, the longer the line segment N. Thus the linear-operation region of the signal amplifier is further narrowed.

Here, in order to expand the linear-operation region of the signal amplifier, it is proposed that the source voltage should be increased; however, this requires a higher withstand voltage in the transistors. As described earlier, it is generally known that multi-crystal silicon transistors, which are essential to the driver monolithic technique, are inferior to monocrystal silicon transistors in their withstand voltage, and it is difficult to increase the withstand voltage.

Moreover, in order to obtain optimum buffer characteristics, it is proposed that the above-mentioned offset, $-(V_{bn}+V_{bp})$, should be eliminated. This is satisfied when the absolute values of the threshold voltages of the NMOS transistor and the PMOS transistor are equal to each other. However, in general, the absolute value of the threshold voltage of the PMOS transistor is greater than that of the NMOS transistor.

Here, the above-mentioned condition can be satisfied by setting the margin voltage α within the potential difference $V_{bn}$ between the gate and source of the NMOS transistor to a value greater than required. However, the greater the potential difference $V_{bn}, V_{bp}$ between the gate and source of each transistor, the further the operation of the transistor is dislocated from the saturated area. This makes it impossible for the linear circuit to carry out a normal operation, thereby narrowing the linear-operation region that is required as the signal amplifier.

Therefore, the above-mentioned method cannot make an effective solution since the linear-operation region of the signal amplifier is extremely narrowed, although it satisfies $V_{out}=V_{in}$ by eliminating an offset with respect to a certain input voltage.

As described above, in the source-follower type linear circuit, when each transistor is driven by the same power supply, the linear area of the input-to-output characteristics is narrowed due to the bias voltage that has been affected by offsets. Moreover, the linear-operation region of the linear circuit can be expanded by increasing the source voltage; however, this method is limited by the withstand voltage of the transistors. Furthermore, the conventional signal amplifier is susceptible to offsets in the case when there are different threshold voltages between the NMOS transistor and the PMOS transistor.

SUMMARY OF THE INVENTION

The first object of the present invention is to provide a sampling circuit that enables sufficient writing and holding operations for video signals even by the use of devices having inferior performances and an image display wherein such sampling circuits are used. The second object of the present invention is to provide a sampling circuit which allows two transistors constituting a sampling switch to be synchronized with each other upon their cutoffs without using a latch circuit and which enables a high-precision writing operation for video signals, and an image display wherein such sampling circuits are used. The third object of the present invention is to provide a signal amplifier that is capable of making a high-speed response to a level change in an input signal, and an image display wherein such signal amplifiers are used. The fourth object of the present invention is provide a signal amplifier that is capable of expanding a linear region in input-to-output characteristics without the necessity of increasing withstand voltage in transistors and that is free from offsets, and a video display wherein such a signal amplifier is used.

In order to achieve the first object, the first sampling circuit of the present invention is provided with: a sampling switch having a CMOS construction for sampling an analog signal, the sampling switch being constituted of an n-channel transistor and a p-channel transistor that are connected in parallel with each other; and a branch circuit having inverters of a plurality of stages for inverting a timing signal having a constant period, the branch circuit being arranged so that the timing signal is directed into two paths and supplied to the gate electrode of the n-channel transistor and the gate electrode of the p-channel transistor with their polarities different from each other. In this circuit, the output level of the inverter is determined so that the timing signal, which passes through either of the two paths, has an input level to the sampling switch that is different from an input level of the timing signal to the inverter at the first stage.

In the first sampling circuit, the timing signal, which has been normally supplied from a timing signal generation circuit, is amplified by the inverters. Further, the timing signal, which has been directed through one line at the time of input, is divided into the two paths of the branch circuit, and the resulting signals are respectively supplied to the n-channel transistor and the p-channel transistor of the sampling switch. Further, in the branch circuit, the timing signal passing through one of the paths is shifted in its level by the inverters so that the input level to the sampling switch has a value different from the input level to the sampling circuit.

With this arrangement, for example, the gate input voltage of the p-channel transistor is set to be higher than the gate input voltage of the n-channel transistor, or the gate input voltage of the n-channel transistor is set to be lower than the gate input voltage of the p-channel transistor.

In the sampling switch, video signals on the low-potential side are written by the n-channel transistor, and video signals on the high-potential side are written by the p-channel transistor; therefore, it is not necessary to provide great voltages upon conduction of the transistors. Further, since the video signals in the vicinity of the center are written by both of the transistors, it is only necessary to write the center voltage of the video signals by the use of one-half of the on-margin.

When the video signals are located in the vicinity of the center voltage (0 V), both the n-channel transistor and the p-channel transistor are in the conductive state. Therefore, in the case when the n-channel transistor and the p-channel transistor have identical driving powers, either of them can carry out a sufficient writing operation by the use of one-half the driving power that is originally required.

Here, supposing that the amplitude of a video signal to be sampled is $V_{sig}$, the threshold voltages of the n-channel transistor and p-channel transistor are $V_{tn}$ and $V_{tp}$ respectively, and the on-margin and off-margin of the sampling switch are $V_{on}$ and $V_{off}$ respectively, the signals V(H) and V(L) that are to be supplied to the gate of the n-channel transistor (nMOS) and the gate of the p-channel transistor (pMOS) are represented as follows:

$$\text{nMOS: } V(H)=0+V_{tn}+V_{on}/2 \qquad (8)$$

$$V(L)=-V_{sig}+V_{tn}-V_{off} \qquad (9)$$

$$\text{pMOS: } V(H)=V_{sig}+V_{tp}+V_{off} \qquad (10)$$

$$V(L)=0+V_{tp}-V_{on}/2 \qquad (11)$$

For example, typical values for the above-mentioned voltages are: $V_{sig}=5(V)$, $V_{tn}=2(V)$, $V_{tp}=-2(V)$, $V_{on}=4(V)$, and $V_{off}=5(V)$. Therefore, based on these values, the signals V(H) and V(L) are represented as follows in accordance with equations (8) through (11):

$$\text{nMOS: } V(H)=0+2+4/2=4(V)$$

$$V(L)=-5+2-5=-8(V)$$

$$\text{pMOS: } V(H)=5-2+5=8(V)$$

$$V(L)=0-2-4/2=-4(V)$$

Therefore, both the n-channel transistor and the p-channel transistor are operable by the use of a source voltage of 12V which is a potential difference between V(H) and V(L). Consequently, it is only necessary for the elements to ensure a withstand voltage of up to 12V.

With this arrangement, for example, in the case where the input level of the timing signal to the inverter at the first stage (the output level of the timing generation circuit) is the same as the value of pMOS, the timing signal is shifted in its level to the value of nMOS only in the path that supplies the timing signal to the n-channel transistor. Moreover, in the case where the output level of the timing generation circuit is the same as the value of nMOS, the timing signal is shifted in its level to the value of pMOS only in the path that supplies the timing signal to the p-channel transistor.

By providing such a level-shifting operation, this arrangement makes it possible to reduce the voltages to be applied to the two transistors of the sampling switches to minimum values required, thereby reducing their voltage amplitudes.

Therefore, it is possible to lower the voltages to be applied to devices constituting the sampling switch and circuits at the preceding stages (inverters or other circuits), and it becomes possible to provide sufficient writing and holding operations for signals even in the case of using devices with low withstand voltage.

Moreover, in the first sampling circuit, it is preferable to apply source voltages that are different from each other to the inverter at the input stage and the inverter at the output stage in either of the two paths. In such a sampling circuit, the output level of the inverters is determined by the source voltages that are to be applied to the inverters. Thus, the timing signal is shifted in its level by applying the source voltages that are different from each other to the inverter at the input stage and inverter at the output stage in the path in which the level shifting is carried out.

For example, in an arrangement wherein V(H)=4V and V(L)=−8V are applied to the inverter at the input stage, and V(H)=8V and V(L)=−4V are applied to the inverter at the output stage (which is the same as that of the timing generation circuit), the timing signal is shifted in its level to an appropriate gate input voltage for the p-channel transistor. Thus, it is possible to easily shift the timing signal in its level by providing a plurality of lines for the output of the power supply for driving the inverters as described above.

In order to achieve the first object, the second sampling circuit of the present invention is provided with: a sampling switch having a CMOS construction for sampling an analog signal, the sampling switch being constituted of an n-channel transistor and a p-channel transistor that are connected in parallel with each other; and a branch circuit having inverters of a plurality of stages for inverting a timing signal having a constant period, the branch circuit being arranged so that the timing signal is directed into the first and second paths and supplied to the gate electrode of the n-channel transistor and the gate electrode of the p-channel transistor with their polarities different from each other. In this circuit, the output level of the inverter is determined so that the timing signals, which pass through the first and second paths, have input levels to the sampling switch that are different from an input level of the timing signal to the inverter at the first stage and that are different from each other.

In the second sampling circuit, the timing signals, which pass through the first and second paths in the branch circuit, are shifted in their levels by the inverters so that the input levels to the sampling switch are different from the input level to the sampling circuit. Further, the timing signals have values that are different from each other.

Therefore, in the same manner as in the first sampling circuit, the second sampling circuit makes it possible to operate both the n-channel transistor and the p-channel transistor by using low source voltages. Therefore, it becomes possible to lower the voltages to be applied to the devices, and it is possible to provide sufficient writing and holding operations for signals even in the case of using devices with low withstand voltage.

In the second sampling circuit, it is preferable to apply to the inverter at the input stage a voltage that is higher than that applied to the inverter at the output stage in the first path, and to apply to the inverter at the input stage a voltage that is lower than that applied to the inverter at the output stage in the second path. This sampling circuit is arranged based on the fact that the output level of the inverters is determined by the source voltages to the inverters. Therefore, in the first path, the timing signal is shifted by the inverter at the output stage to a level lower than that of the inverter at the input stage, and in the second path, the timing signal is shifted by the inverter at the output stage to a level higher than that of the inverter at the input stage. Thus, it is possible to easily shift the timing signal in its level by providing a plurality of lines for the output of the power supply for driving the inverters as described above.

Moreover, in an image display to which the first or the second sampling circuit is applied, it becomes possible to carry out sufficient writing and holding operations for the video signals by utilizing the above-mentioned features of the sampling circuit, and to display high-quality images.

As for the above-mentioned image display, it is preferable to use an image display wherein at least the pixels and the data-signal-line driving circuits are formed on a multi-crystal silicon thin film or a mono-crystal silicon thin film that is disposed on an insulating substrate. The pixels and the data-signal-line driving circuits that are formed on a multi-crystal silicon thin film or a mono-crystal silicon thin film disposed on an insulating substrate are inferior compared to silicon transistors formed on a mono-crystal substrate. For this reason, the adoption of this arrangement makes it possible to compensate for low withstand voltage of such devices used in the sampling circuits.

In order to achieve the second object, the third sampling circuit of the present invention is provided with: a sampling switch having a CMOS construction for sampling an analog signal, the sampling switch being constituted of an n-channel transistor and a p-channel transistor that are connected in parallel with each other; and a branch circuit having inverters of a plurality of stages for inverting a timing signal having a constant period and at least one synchronous-type inverter which has the same inverting function as the inverters and which is controlled in its operation by a synchronous signal, the branch circuit being arranged so that the timing signal is directed into two paths and supplied to the gate electrode of the n-channel transistor and the gate electrode of the p-channel transistor with their polarities different from each other.

In the third sampling circuit, since the synchronous-type inverters are installed in the respective signal paths, it is possible to make the sampling signals in the two paths synchronous to each other. Thus, it becomes possible to suppress potential fluctuations in the sampling switch at the time of its cutoff, and this arrangement allows the analog signal to be written with high precision.

Moreover, in the third sampling circuit, it is preferable to install devices and circuits, such as capacitors, that hold signals, right after the synchronous-type inverters. Even at the time of the cutoff of the output from the synchronous-type inverter, this arrangement makes it possible to hold signal information immediately before the cutoff; therefore, the operation of the sampling circuit is further stabilized.

In order to achieve the second object, the fourth sampling circuit of the present invention is provided with: a sampling switch having a CMOS construction for sampling an analog signal, the sampling switch being constituted of an n-channel transistor and a p-channel transistor that are connected in parallel with each other; and a branch circuit having inverters of a plurality of stages for inverting a timing signal having a constant period and at least one transfer switch which is controlled in its operation by a synchronous signal, the branch circuit being arranged so that the timing signal is directed into two paths and supplied to the gate electrode of the n-channel transistor and the gate electrode of the p-channel transistor with their polarities different from each other.

In the fourth sampling circuit, since the transfer switches are installed in the respective signal paths of the two routes, it is possible to make the sampling signals in the two routes synchronous to each other. Thus, it becomes possible to suppress potential fluctuations in the sampling switch at the time of its cutoff, and this arrangement allows the analog signal to be written with high precision.

Moreover, in the fourth sampling circuit, it is preferable to install devices and circuits, such as capacitors, that hold signals, right after the transfer switches. Even at the time of the cutoff of the output from the transfer switch, this arrangement makes it possible to hold signal information immediately before the cutoff; therefore, the operation of the sampling circuit is further stabilized.

In order to achieve the second object, the fifth sampling circuit of the present invention is provided with: a sampling switch having a CMOS construction for sampling an analog signal, the sampling switch being constituted of an n-channel transistor and a p-channel transistor that are connected in parallel with each other; and a branch circuit having inverters of a plurality of stages for inverting a timing signal having a constant period, the branch circuit being arranged so that the timing signal is directed into two paths and supplied to the gate electrode of the n-channel transistor and the gate electrode of the p-channel transistor with their polarities different from each other, one of the inverters in one of the two paths having an output connected to a capacitor.

In the fifth sampling circuit, since a capacitor is inserted right after the inverter in one of the paths, it is possible to make the sampling signals in the two routes synchronous to each other. Thus, even at the time of the cutoff of the output from the inverter, this arrangement makes it possible to hold signal information immediately before the cutoff; therefore, the operation of the sampling circuit is further stabilized.

In order to achieve the second object, the sixth sampling circuit of the present invention is provided with: a sampling switch having a CMOS construction for sampling an analog signal, the sampling switch being constituted of an n-channel transistor and a p-channel transistor that are connected in parallel with each other; and a branch circuit having inverters of a plurality of stages for inverting a timing signal having a constant period, the branch circuit being arranged so that the timing signal is directed into two paths and supplied to the gate electrode of the n-channel transistor and the gate electrode of the p-channel transistor with their polarities different from each other, one of the inverters in one of the two paths being provided with a sub-inverter at the following stage thereof, the sub-inverter having an input capacity larger than that of said inverter.

In the sixth sampling circuit, since a sub-inverter is installed in one of the two paths, it is possible to make the sampling signals in the two routes synchronous to each other. Thus, even at the time of the cutoff of the output from the inverter, this arrangement makes it possible to hold signal information immediately before the cutoff; therefore, the operation of the sampling circuit is further stabilized.

In order to achieve the second object, the seventh sampling circuit of the present invention is provided with: a sampling switch having a CMOS construction for sampling an analog signal, the sampling switch being constituted of an n-channel transistor and a p-channel transistor that are connected in parallel with each other; and a branch circuit having inverters of a plurality of stages for inverting a timing signal having a constant period, the branch circuit being arranged so that the timing signal is directed into two paths and supplied to the gate electrode of the n-channel transistor and the gate electrode of the p-channel transistor with their polarities different from each other, each of the two paths being provided with at least one operation-control-type inverter which is controlled in its operation by a timing signal derived from the opposite path.

In the seventh sampling circuit, since the operation-control-type inverters are installed in the respective paths of the two routes, it is possible to make the sampling signals in the two routes synchronous to each other. Thus, it becomes possible to suppress potential fluctuations in the sampling switch at the time of its cutoff, and this arrangement allows the analog signal to be written with high precision.

Moreover, in the seventh sampling circuit, it is preferable to install devices and circuits, such as capacitors, that hold signals, right after the operation-control-type inverters. Even at the time of the cutoff of the output from the operation-control-type inverter, this arrangement makes it possible to hold signal information immediately before the cutoff; therefore, the operation of the sampling circuit is further stabilized.

Consequently, in an image display to which one of the third through seventh sampling circuits is applied, it becomes possible to carry out sufficient writing and holding operations for the video signals by utilizing the above-mentioned features of the sampling circuit, and to display high-quality images.

As for the above-mentioned image display, it is preferable to use an image display wherein at least the pixels and the data-signal-line driving circuits are formed on a multi-crystal silicon thin film or a mono-crystal silicon thin film that is disposed on an insulating substrate. In the same manner as the image display wherein the first or second sampling circuit is adopted, the adoption of this arrangement makes it possible to compensate for low withstand voltage of such devices used in the sampling circuits.

In order to achieve the third object, the first signal amplifier of the present invention is provided with the first and second amplification circuits for amplifying respective input signals almost linearly, the first and second amplification circuits being connected in parallel with each other. The first signal amplifier is arranged so that upon receipt of an increasing level change in the input signal, the first amplification circuit has a response speed that is greater than that of the second amplification circuit, and upon receipt of a decreasing level change in the input signal, the second amplification circuit has a response speed that is greater than that of the first amplification circuit.

In accordance with the first signal amplifier, the input signal is linearly amplified. In addition, when there is an increasing level change in the input signal, the first amplification circuit makes a high-speed response to the level change and releases the resulting output. When there is a decreasing level change in the input signal, the second amplification circuit makes a high-speed response to the level change and releases the resulting output. In other words, it is possible to obtain an output that has been made by responding to the input signal at high speeds irrespective of level changes in the input signal.

Moreover, in the first signal amplifier, the first amplification circuit is preferably provided with the first linear circuit, made of p-channel transistors, for amplifying an input signal almost linearly and the second linear circuit, made of n-channel transistors, for amplifying an output signal from the first linear circuit almost linearly, and the second amplification circuit is preferably provided with the third linear circuit, made of n-channel transistors, for amplifying an input signal almost linearly and the fourth linear circuit, made of p-channel transistors for amplifying an output signal from the third linear circuit almost linearly.

With this arrangement, the characteristics of the first amplification circuit and the second amplification circuit become symmetrical in the polarities of their transistors. For this reason, an offset which occurs in the first amplification circuit becomes identical to an offset which occurs in the second amplification circuit. In other words, it is possible to make the output levels of the first and second amplification circuits coincident with each other. This reduces interference between the output signal of the first amplification circuit and the output signal of the second amplification circuit, thereby making it possible to improve the linear characteristic of the output signal with respect to an input signal.

In order to achieve the third object, the second signal amplifier of the present invention is provided with a linear circuit, made of p-channel transistors of MOS type, for amplifying an input signal almost linearly and a linear circuit, made of n-channel transistors of MOS type, the linear circuits being connected in series with each other. Further, in this arrangement, the linear circuit that contains the transistors having a greater conductance per channel width of the n-channel transistors and the p-channel transistors is disposed at the last stage.

In the second signal amplifier, the transistors having a greater conductance per channel width have a greater driving power per unit area compared to the transistors having a smaller conductance per channel width. Therefore, by disposing the linear circuit that contains the transistors having a greater conductance per channel width at the last stage, it becomes possible to increase the driving power per unit area of the linear circuit at the last stage. Thus, it is possible to achieve a signal amplifier which can make a high-speed response with less occupied area of the transistors.

Moreover, in an image display to which the first or second signal amplifier is applied, it becomes possible to release image signals to the data signal line in a short period by utilizing the above-mentioned features of the signal amplifier. Thus, it is possible to provide an image display with high working frequencies, that is, an image display that is capable of displaying high-quality images.

In order to achieve the fourth object, the third signal amplifier of the present invention is provided with a plurality of linear circuits for amplifying an input signal almost linearly. The linear circuits, which are connected in series with one after another, are driven by source voltages that are different from one another.

In the third linear signal amplifier, the linear circuits are driven by the source voltages that are different from one another; therefore, it is possible to expand the linear area of the input-to-output characteristic of the signal amplifier without the necessity of increasing the withstand voltage of the transistors.

In order to achieve the fourth object, the fourth signal amplifier of the present invention is provided with a plurality of linear circuits for amplifying an input signal almost linearly. The linear circuits, which are connected in series with one after another, are driven by the same source voltage, and have respective voltage limiters for limiting the source voltage to predetermined voltages.

In accordance with the fourth signal amplifier, since the source voltage is limited by the voltage limiters, it is possible to expand the linear area of the input-to-output characteristic of the signal amplifier without the necessity of increasing the withstand voltage of the transistors, in the same manner as the third signal amplifier. In addition, it is possible to simplify the construction of the power supply by using the same source voltage.

In order to achieve the fourth object, the fifth signal amplifier of the present invention is provided with NMOS linear circuits made of n-channel transistors of MOS type and PMOS linear circuits made of p-channel transistors of MOS type that are connected in series with one after the other. In this signal amplifier, the number n of the stages of the NMOS linear circuits and the number m of the stages of the PMOS linear circuits (wherein n and m are positive integers) are set so as to satisfy an equation, $n \cdot V_{bn} + m \cdot V_{bp} = 0$, in relation to the shift voltage $V_{bn}$ of the NMOS transistor and the shift voltage $V_{bp}$ of the PMOS transistor.

In the fifth signal amplifier, the number n of the stages of the NMOS linear circuits and the number m of the stages of the PMOS linear circuits satisfy the above-mentioned relationship; therefore, the offset, which is caused by shift voltages in the transistors, becomes zero with the linear characteristic being maintained in a wide area. Consequently, it becomes possible to expand the linear area of the input-to-output characteristic of the signal amplifier without the necessity of increasing the withstand voltage of the transistors.

In order to achieve the fourth object, the sixth signal amplifier of the present invention is provided with an NMOS linear circuit made of n-channel transistors of MOS type and a PMOS linear circuit made of p-channel transistors of MOS type that are connected in series with each other, and the n-channel transistors and the p-channel transistors are transistors of depletion type.

In the sixth signal amplifier, since the n-channel transistors and the p-channel transistors are transistors of depletion type, the n- and p-transistors operate within a saturated area even if the voltage between the gate and source of the n- and p-transistors is zero. This makes it possible to eliminate the offset of the signal amplifier. In particular, this arrangement is effective in the case when the absolute values of the threshold voltages of the n- and p-transistors are great, or in the case when the difference between these values is great.

Moreover, in an image display to which any of the third through sixth signal amplifiers is applied, it becomes possible to expand the linear-operation region of the driving circuit in the image display by utilizing the above-mentioned features of the signal amplifier.

For a fuller understanding of the nature and advantages of the invention, reference should be made to the ensuing detailed description taken in conjunction with the accompanying drawings.

BRIEF DESCRIPTION OF THE DRAWINGS

FIG. 34($b$) is a circuit diagram showing a construction of a cascode-type linear circuit that is preferably applied to the other amplifiers in the first signal amplifier as well as in the second signal amplifier in the third embodiment of the present invention.

FIG. 35($b$) is a circuit diagram showing a construction of another operational-amplifier-type linear circuit that is preferably applied to the other amplification circuit in the first signal amplifier.

FIG. 38($b$), which shows comparative examples to the response characteristics of FIG. 37, is a graph that shows response characteristics of a signal amplifier which has slow response speeds with respect to an input signal with an increasing level.

DESCRIPTION OF THE EMBODIMENTS
(EMBODIMENT 1)

Referring to FIGS. 1 through 13, the following description will discuss the first embodiment of the present invention.

BASIC CONSTRUCTION OF AN IMAGE DISPLAY

Figure 1:
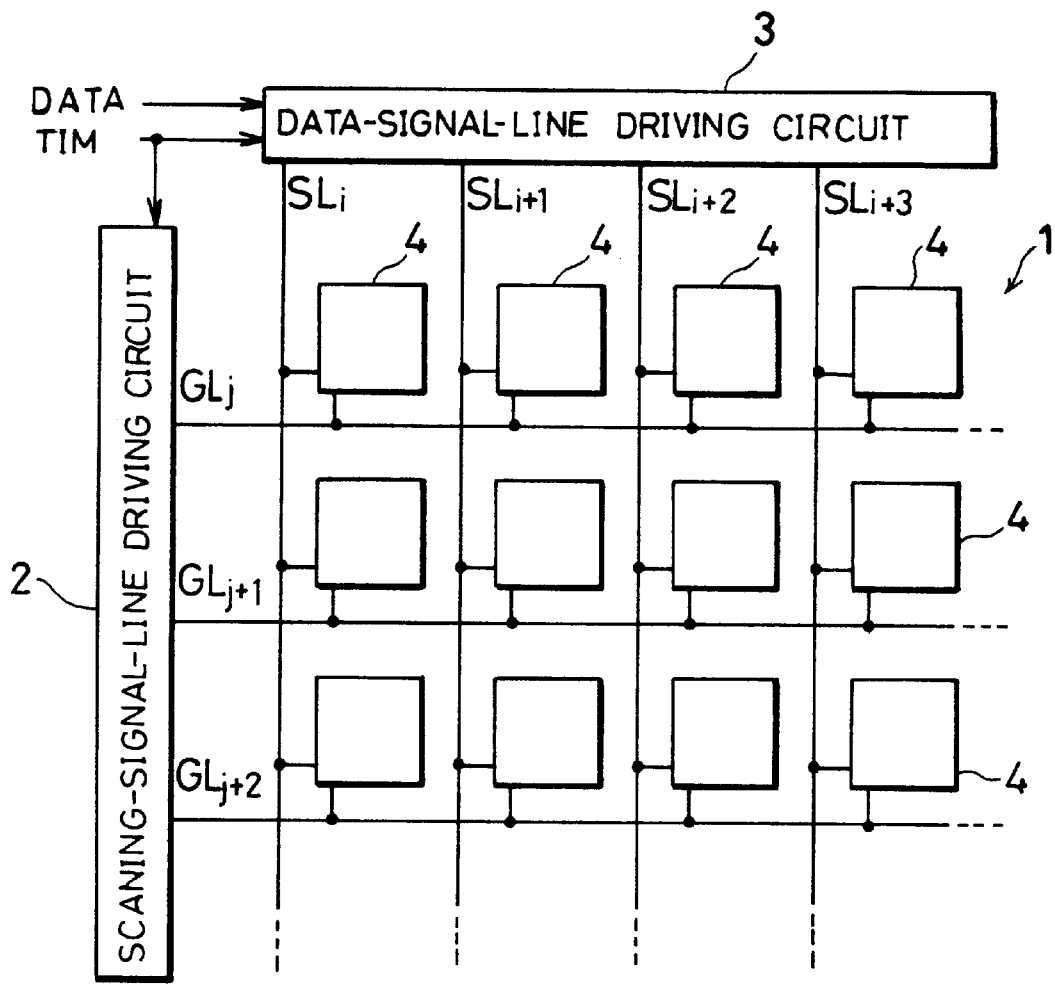
FIG. 1 is a block diagram showing a construction of an image display that is commonly exemplified in the first through fourth embodiments of the present invention.

As shown in FIG. 1, an image display in accordance with the present invention, which is a liquid crystal display of the active-matrix driving system, is provided with a pixel array 1, a scanning-signal-line driving circuit 2, and a data-signal-line driving circuit 3. In the pixel array 1, there are a number of scanning signal lines $GL_j$, $GL_{j+1}$, . . . and so on and a number of data signal lines $SL_i$, $SL_{i+1}$, . . . and so on that orthogonally intersect one another. In each area enclosed by the adjacent scanning lines GL and the adjacent data signal lines SL, a pixel 4 is disposed one by one; thus, the pixels 4 are disposed in a matrix shape as an entire structure.

Figure 2:
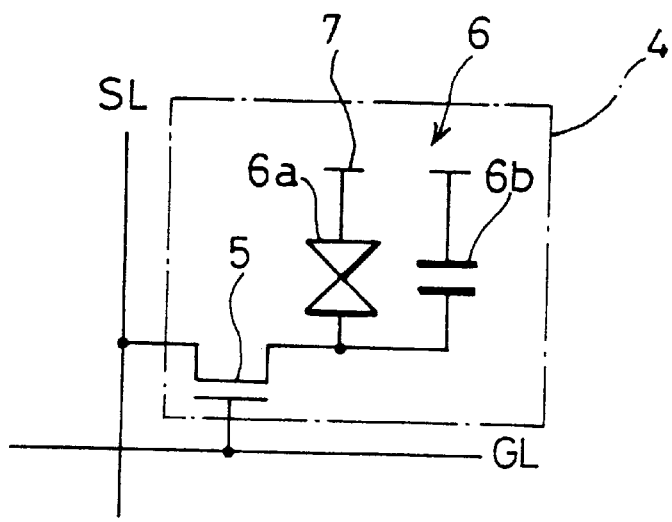
FIG. 2 is a circuit diagram showing a construction of pixels in the image display of FIG. 1.

As shown in FIG. 2, the pixel 4 is provided with a switching device 5 and a pixel capacity 6. The switching device 5 is constituted of, for example, an FET of the MOS type, and its gate is connected to the scanning signal line GL. The pixel capacity 6 is constituted of a liquid crystal capacity 6a that functions as a liquid crystal element and an auxiliary capacity 6b.

One of the electrodes of the liquid crystal capacity 6a and one of the electrodes of the auxiliary capacity 6b are connected to the data signal line SL through the drain and source of the switching device 5. The other electrode of the liquid crystal capacity 6a is connected to a common electrode line 7 that is commonly used by all the pixels 4, and the other electrode of the auxiliary capacity 6b is connected to the scanning signal line GL at the next stage of the scanning signal line GL to which the gate of the switching device 5 is connected, or to the common electrode line 7.

The pixels 4, arranged as described above, are modulated in transmittance or reflectance of its liquid crystal by voltages applied to their liquid crystal capacity 6a, thereby allowing images to be displayed.

The data-signal-line driving circuit 3 samples an inputted analog video signal DATA in synchronism with a timing signal TIM having a constant period, amplifies the resulting signal if necessary, and then feeds it to the respective data signal lines $SL_i$, $SL_{i+1}$, . . . and so on. The scanning-signal-line driving circuit 2 successively selects the scanning signal lines $GL_j$, $GL_{j+1}$, . . . and so on in synchronism with the timing signal TIM, and allows the sampling data (video signals) given to the respective data signal lines $SL_i$, $SL_{i+1}$, . . . and so on to be written to the respective pixels 4, as well as allowing the written data to be held therein.

The data-signal-line driving circuit 3 is classified into two types, analog type and digital type, and that of analog type is more advantageous in the case of providing a multi-gradation displaying operation. As for the analog type, the point-sequential driving method and the line-sequential driving method, having respectively different constructions, are listed as will be described below.

Figure 3:
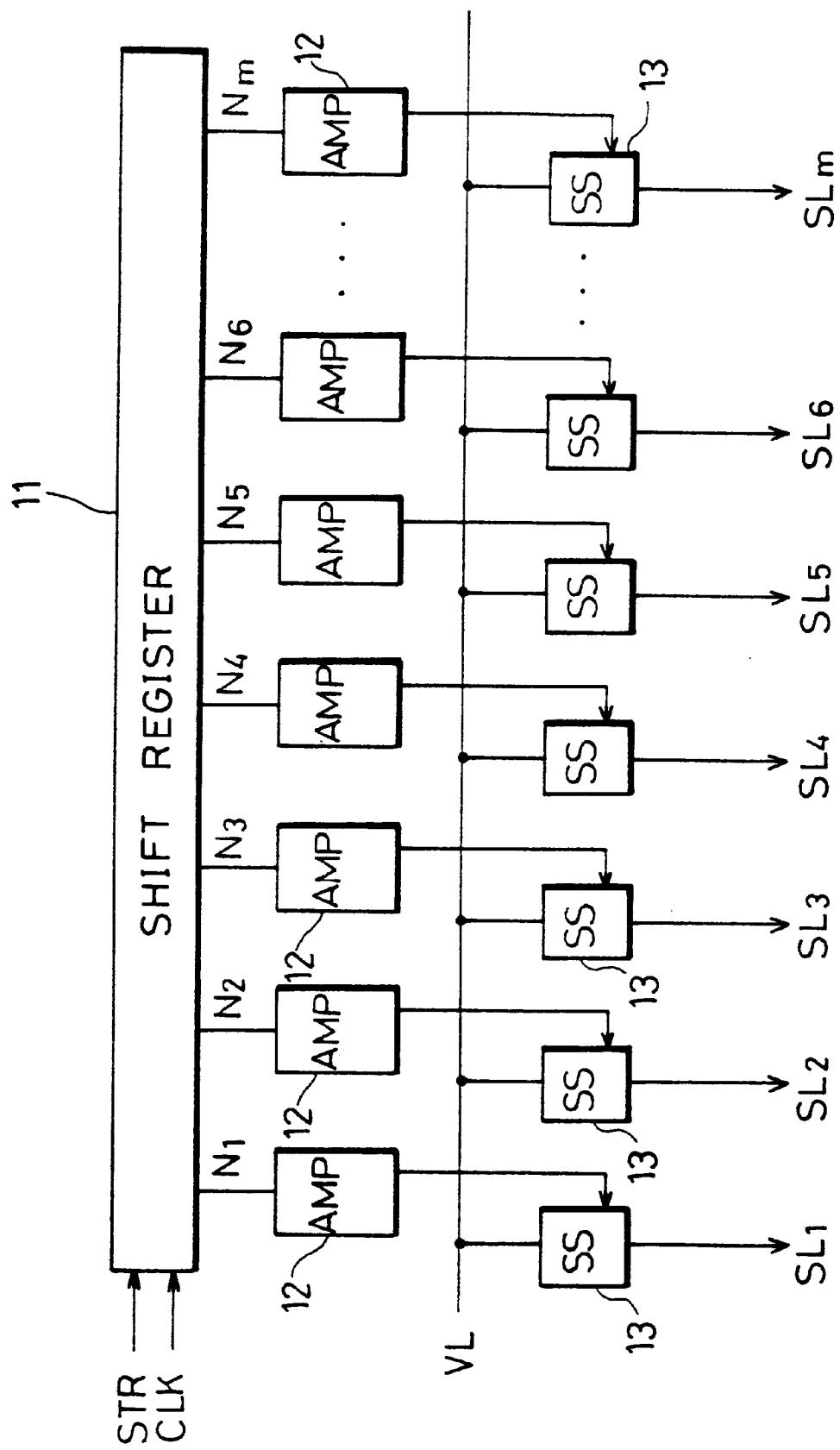
FIG. 3 is a block diagram showing a construction of a data-signal-line driving circuit of the point-sequential driving type that is applied to the image display of FIG. 1 and that is commonly exemplified in the first through fourth embodiments of the present invention.

As shown in FIG. 3, the data-signal-line driving circuit 3 using the point-sequential driving method is provided with a shift register 11, a plurality of amplification circuits (indicated as AMP in the drawing) 12, and a plurality of sampling switches (indicated as SS in the drawing) 13.

The shift register 11, which functions as a timing generation circuit, shifts an inputted start pulse STR in synchronism with a rise or a drop in a clock signal CLK so that shift pulses $N_1$ through $N_m$ are released from a m-number of its output terminals.

Figure 4:
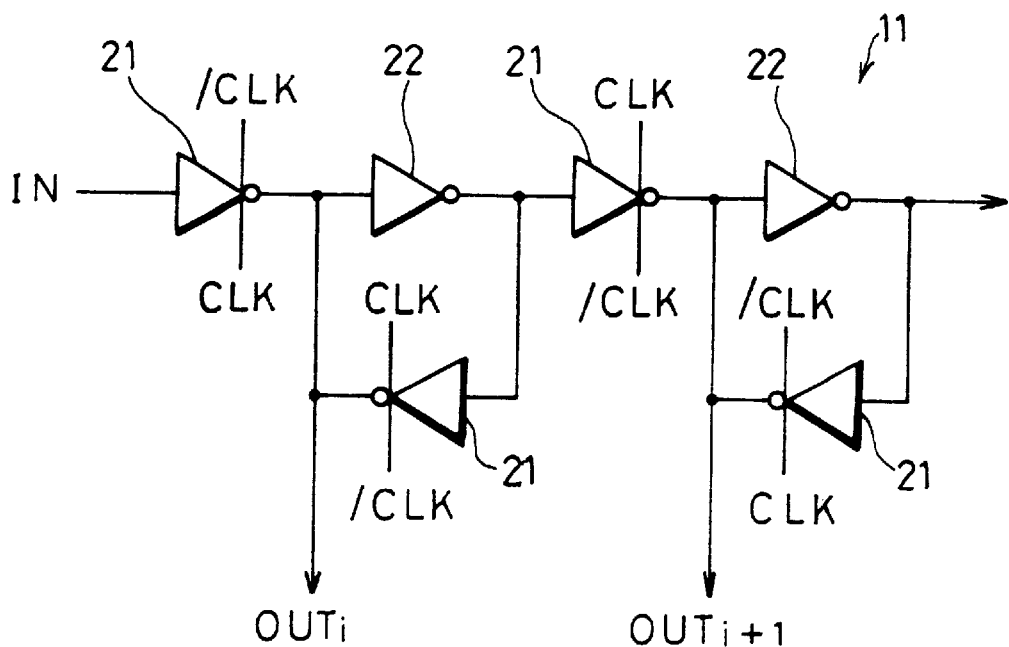
FIG. 4 is a circuit diagram showing a construction of a shift register that is installed in the data-signal-line driving circuit in the image display of FIG. 1.

As shown in FIG. 4, each stage of the shift register 11 is constituted of a pair of clocked inverters 21 and an inverter 22. FIG. 4 shows the construction up to the second stage; the same circuits are also installed in the following stages. One of the clocked inverter 21 and the inverter 22 are connected in series with each other, and the inverter 22 and the other clocked inverter 21 are connected in parallel with each other with their input and output reversed to each other. Thus, output terminals $OUT_i$, $OUT_{i+1}$ . . . and so on are outputted between the pairs of the clocked inverter 21 and the inverter 22 that are connected in series with each other.

The shift register 11 repeats signal-receiving and holding operations in synchronism with a rise or a drop of the clock signal CLK. In other words, the inputted signal is shifted stage by stage toward the output side in synchronism with a rise or a drop of the clock signal CLK.

Figure 5:
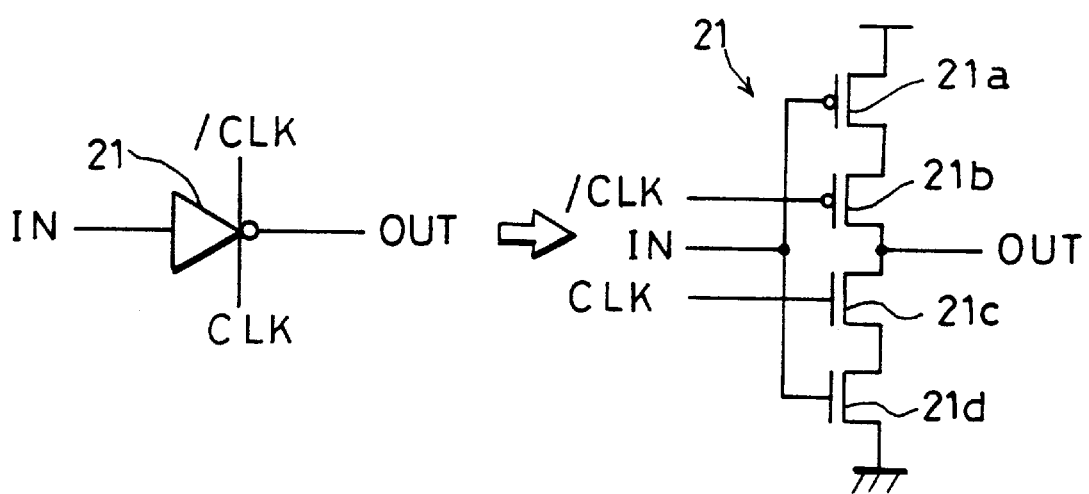
FIG. 5 is a circuit diagram showing a construction of a clocked inverter that is used in the shift register of FIG. 4 and that is commonly exemplified in the first and second embodiments of the present invention.

The clocked inverter 21 is constituted as shown in FIG. 5 in more detail. The clocked inverter 21 is constituted of a pair of p-channel transistors 21a and 21b and a pair of n-channel transistors 21c and 21d that are connected in series. The clocked inverter 21 releases an inverted signal only when the clock signal CLK is inputted thereto, and remains in the open state when the clock signal CLK is not inputted thereto.

The gate of the p-channel transistor 21a connected to power supply and the gate of the n-channel transistor 21d connected to ground form input sections for signals. The p-channel transistor 21b and the n-channel transistor 21c are adjacent with each other, and connected to each other, and one of the electrodes of the p-channel transistor 21b and one of the electrodes of the n-channel transistor 21c are connected to each other, thereby forming an output section for signals. Here, the inverted clock signal/CLK is inputted to the gate of the p-channel transistor 21b, and the clock signal CLK is inputted to the gate of the n-channel transistor 21c.

The amplification circuits 12 amplify shift pulses $N_1$ through $N_m$ that are released from the shift register 11 as timing signals, and release inverted signals derived from the shift pulses $N_1$ through $N_m$, as occasion demands.

The sampling switches 13, which are switching devices that open and close in synchronism with the shift pulses $N_1$ through $N_m$ transmitted through the amplification circuits 12, are constituted of transistors of the CMOS construction, as will be described later. When closed by the shift pulses $N_1$ through $N_m$, the sampling switches 13 supply the video signal inputted from the video signal line VL to the data signal lines $SL_1$ through $SL_m$.

Figure 6:
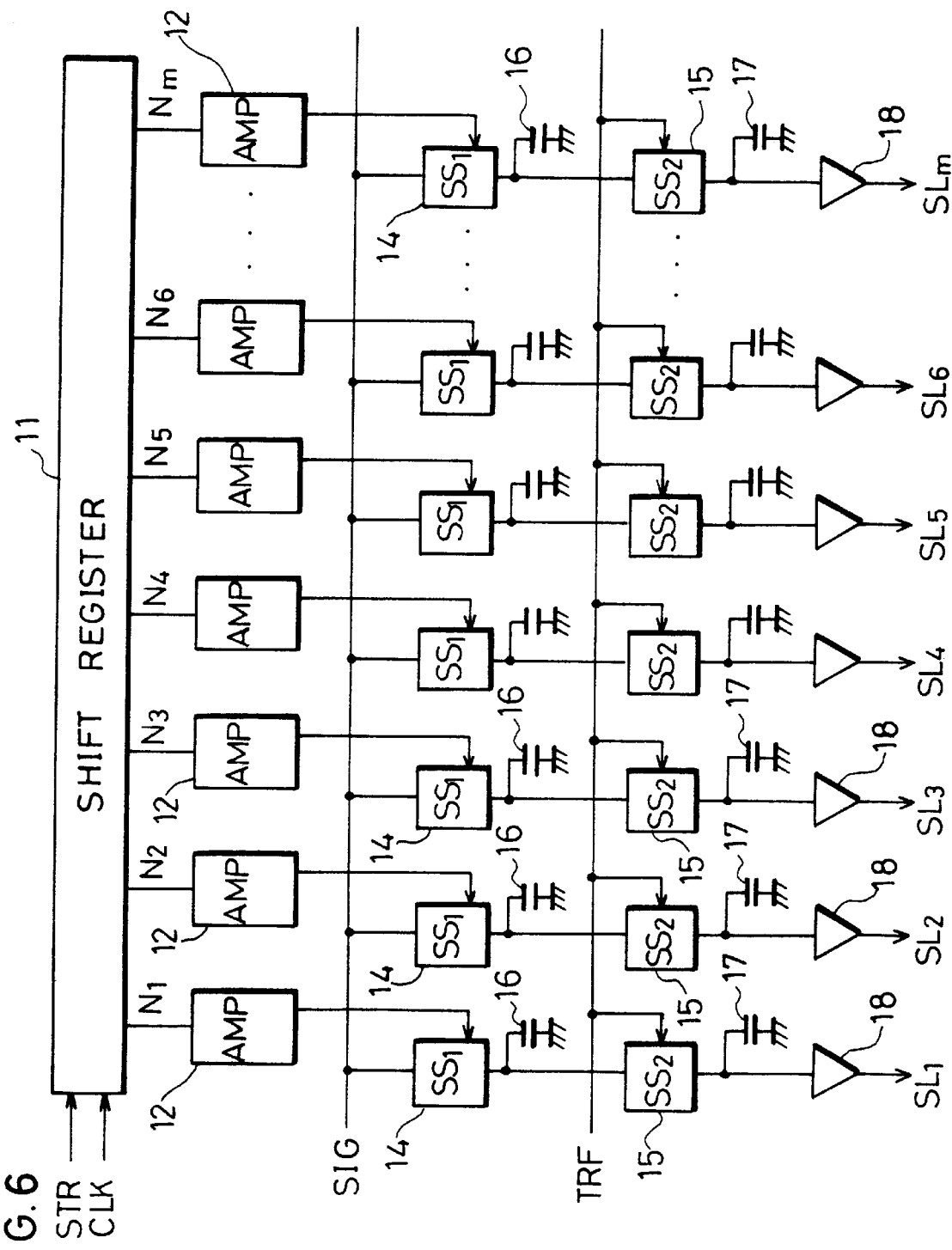
FIG. 6 is a block diagram showing a construction of a data-signal-line driving circuit of the line-sequential driving type that is applied to the image display of FIG. 1 and that is commonly exemplified in the first and second embodiments of the present invention.

As shown in FIG. 6, the data-signal-line driving circuit 3 using the line-sequential driving method is provided with a shift register 11, a plurality of amplification circuits (indicated as AMP in the drawing) 12, a plurality of sampling switches (indicated as $SS_1$ in the drawing) 14, a plurality of sampling switches (indicated as $SS_2$) 15, sampling capacities 16, holding capacities 17, and buffer amplifiers 18.

The sampling switches 14 and 15 are the same type of switching devices as the aforementioned sampling switches 13, and each sampling switch 14 is connected in series with each sampling switch 15. Each sampling switch 14 opens and closes in synchronism with the shift pulses $N_1$ through $N_m$ transmitted through the amplification circuits 12, and each sampling switch 15 opens and closes in synchronism with control signals that have been transferred by a data-transferring signal line TRF.

Each sampling capacity 16, which is disposed at the output stage of the sampling switch 14, stores data (video signal) that have been sampled by the sampling switch 14. Further, each holding capacity 17, which is disposed at the output stage of the sampling switch 15, stores data (video signal) that has been transferred from the sampling capacity 16 by the sampling switch 15. Moreover, each buffer amplifier 18 is disposed at the following stage of the holding capacity 17.

In the data-signal-line driving circuit 3 having the above-mentioned arrangement, a video signal, which is inputted to the video signal line VL during a certain horizontal scanning period, is sampled by the sampling switches 14, and is temporarily stored in the sampling capacities 16. Then, the sampling data (electric charge) thus stored is transferred to the holding capacities 17 through the sampling switches 15 during the next horizontal scanning period, and is held therein.

Further, during the next horizontal scanning period, signals, each having the same level as the voltage held in the holding capacity 17, are released to the data signal lines $SL_1$ through $SL_m$ through the buffer amplifiers 18. The holding capacity 17 is comparatively smaller than the capacity of each of the signal lines $SL_1$ through $SL_m$; therefore, the level of each signal to be written to the corresponding one of the data signal lines $SL_1$ through $SL_m$ is decreased due to capacity division of electric charge. For this reason, the signal is amplified by the buffer amplifier 18.

The following description will discuss in detail the first through sixth sampling circuits in relation to their sampling circuits, each consisting of the above-mentioned shift register 11, amplification circuit 12 and sampling switch 13.

FIRST SAMPLING CIRCUIT

Figure 7:
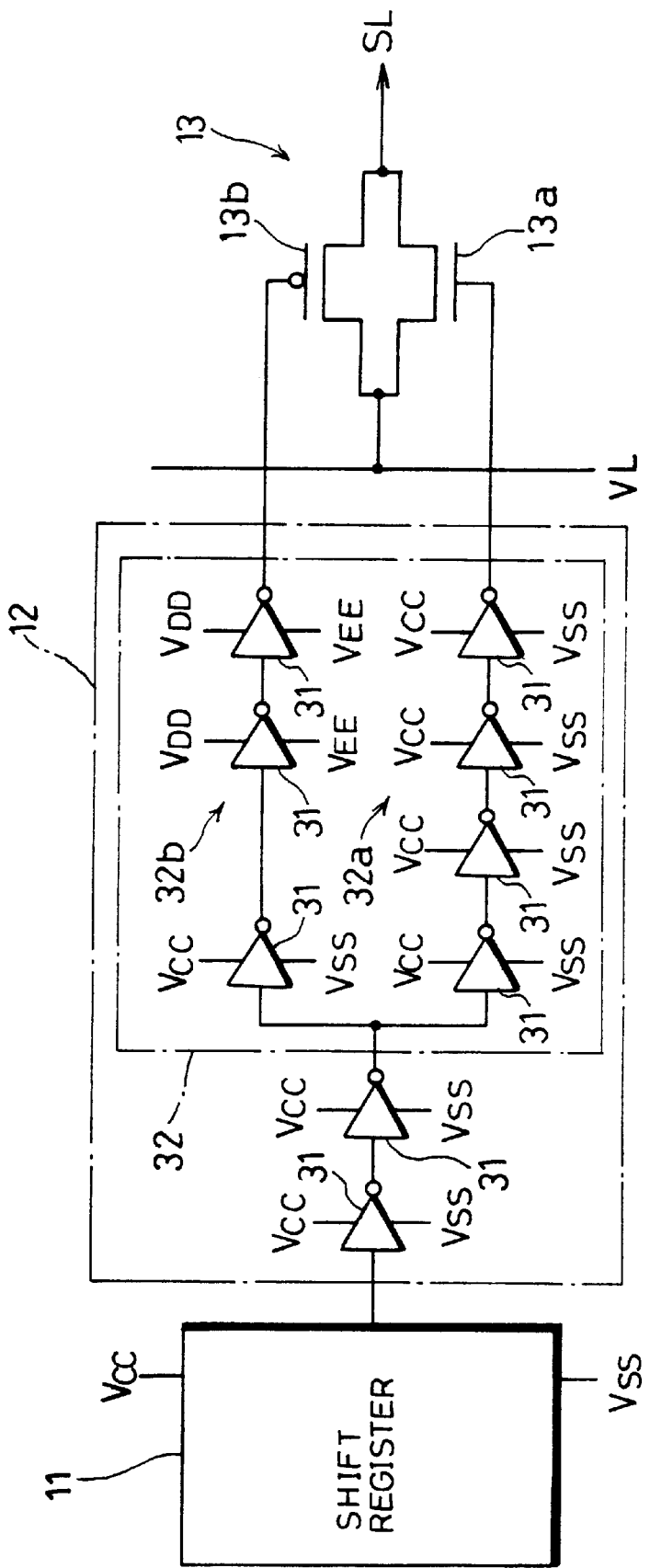
FIG. 7 is a circuit diagram showing a construction of the first sampling circuit in the first embodiment of the present invention.

As shown in FIG. 7, the amplification circuit 12 of the first sampling circuit is provided with a plurality of inverters 31. In this amplification circuit 12, two stages of the inverters 31 are installed after one of the output terminals of the shift register 11, and source voltages $V_{CC}$ and $V_{SS}$ are supplied to these inverters 31.

Moreover, at the following stage is installed a branch circuit 32 having the first branch path 32a and the second branch path 32b. Four stages of the inverters 31 are installed in the first branch path 32a, and three stages of the inverters 31 are installed in the second branch path 32b.

In the first branch path 32a, source voltages $V_{CC}$ and $V_{SS}$ are supplied to all the inverters 31. In the second branch path 32b, on the other hand, source voltages $V_{CC}$ and $V_{SS}$ are supplied to the first stage of the inverter 31, and source voltages $V_{DD}$ and $V_{EE}$ are supplied to the succeeding two stages of the inverters 31. The potential difference between source voltages $V_{DD}$ and $V_{EE}$ is set to be equal to the potential difference between source voltages $V_{CC}$ and $V_{DD}$, and source voltages $V_{DD}$ and $V_{EE}$ are set to values that are slightly shifted toward the plus side with respect to the values of source voltages $V_{CC}$ and $V_{SS}$.

The sampling switch 13 is a switching device of the CMOS construction wherein an n-channel transistor 13a and a p-channel transistor 13b are connected in parallel with each other. The inverter 31 at the output stage of the first branch path 32a is connected to the gate of the n-channel transistor 13a. The inverter 31 at the output stage of the second branch path 32b is connected to the gate of the p-channel transistor 13b. Further, both the drain of the n-channel transistor 13a and the source of the p-channel transistor 13b are connected to the video signal line VL, and both the source of the n-channel transistor 13a and the drain of the p-channel transistor 13b are connected to the data signal line SL.

Here, an explanation will be given on a specific example of source voltages $V_{CC}$, $V_{SS}$, $V_{DD}$ and $V_{EE}$. Supposing that the amplitude of the video signal is $V_{sig}$, the threshold voltages of the transistors 13a and 13b are $V_{tn}$ and $V_{tp}$ respectively, and the on-margin and off-margin of the sampling switch 13 are $V_{on}$ and $V_{off}$ respectively, source voltages $V_{CC}$, $V_{SS}$, $V_{DD}$ and $V_{EE}$ are indicated as follows:

$$V_{CC}=0+V_{tn}+V_{on}/2 \tag{12}$$

$$V_{SS}=-V_{sig}+V_{tn}-V_{off} \tag{13}$$

$$V_{DD}=V_{sig}+V_{tp}+V_{off} \tag{14}$$

$$V_{EE}=0+V_{tp}-V_{on}/2 \tag{15}$$

Typical values for the above-mentioned voltages are, for example, $V_{sig}$=5(V), $V_{tn}$=2(V), $V_{tp}$=−2(V), $V_{on}$=4(V), $V_{off}$=5(V). Therefore, in accordance with equations (12) through (15), source voltages $V_{CC}$, $V_{SS}$, $V_{DD}$ and $V_{EE}$ are calculated as follows based on these values.

$$V_{CC}=0+2+4/2=4(V)$$

$$V_{SS}=-5+2-5=-8(V)$$

$$V_{DD}=5-2+5=8(V)$$

$$V_{EE}=0-2-4/2=-4(V)$$

As indicated above, both the potential difference between source voltages $V_{CC}$ and $V_{SS}$ and the potential difference between source voltages $V_{DD}$ and $V_{EE}$ are set to 12 V; therefore, it is possible to operate the first sampling circuit by using low source voltages. Thus, the necessary withstand voltage of the devices is achieved by mere the setting of 12 V.

In the first sampling circuit having the above-mentioned arrangement, the output signal of the shift register is amplified by the first branch path 32a in the amplification circuit 12 to form a gate input voltage with the same polarity, which is applied to the gate of the n-channel transistor 13a. Further, the output signal of the shift register 11 is also amplified and inverted by the second branch path 32b in the amplification circuit 12 to form a gate input voltage with the reversed polarity, which is applied to the gate of the p-channel transistor 13b.

Then, video signals, which have been supplied to the video signal line VL, are sampled by the conduction of the sampling switch 13, and are supplied to the data signal line SL. At this time, in the sampling switch 13, video signals on the low-voltage side are sampled by the n-channel transistor 13a, and video signals on the high-voltage side are sampled by the p-channel transistor 13b.

As described above, in the first sampling circuit, source voltages $V_{DD}$ and $V_{EE}$ to be applied to the two inverters 31 located at the latter stage in the second branch path 32b are set to be different from source voltages $V_{CC}$ and $V_{SS}$ to be applied to the other inverters 31; this makes it possible to reduce the gate input voltage at the time of conduction of the sampling switch 13. Further, it is possible to write and hold even signals with small amplitudes by shifting the levels of the source voltages as described above. Therefore, it is possible to maintain the circuit characteristics even in the case of using devices with low withstand voltage.

Moreover, the first sampling circuit, which has a source voltage of 12 V, can be driven by voltages that are lower than those used in conventional sampling circuits. Therefore, it is possible to reduce the channel lengths of the sampling circuit as long as its withstand voltage can be maintained, as well as increasing the driving power per channel width of the device. This makes it possible to configure the circuits by using smaller devices, thereby achieving miniaturization and low power consumption of the circuits and the systems.

Additionally, in the first sampling circuit, the numbers of the inverters 31 that are disposed in the proceeding stage, the first branch path 32a and the second branch path 32b of the amplification circuit 12 are set to be 2, 4, and 3 respectively. However, the present invention is not limited to these numbers: any combinations of numbers may be used as long as the difference between the numbers of the inverters 31 that are respectively disposed in the first branch path 32a and the second branch path 32b makes an odd number so that the gate input voltages to be supplied to the n-channel transistor 13a and the p-channel transistor 13b have the polarities that are reverse to each other.

SECOND SAMPLING CIRCUIT

Figure 8:
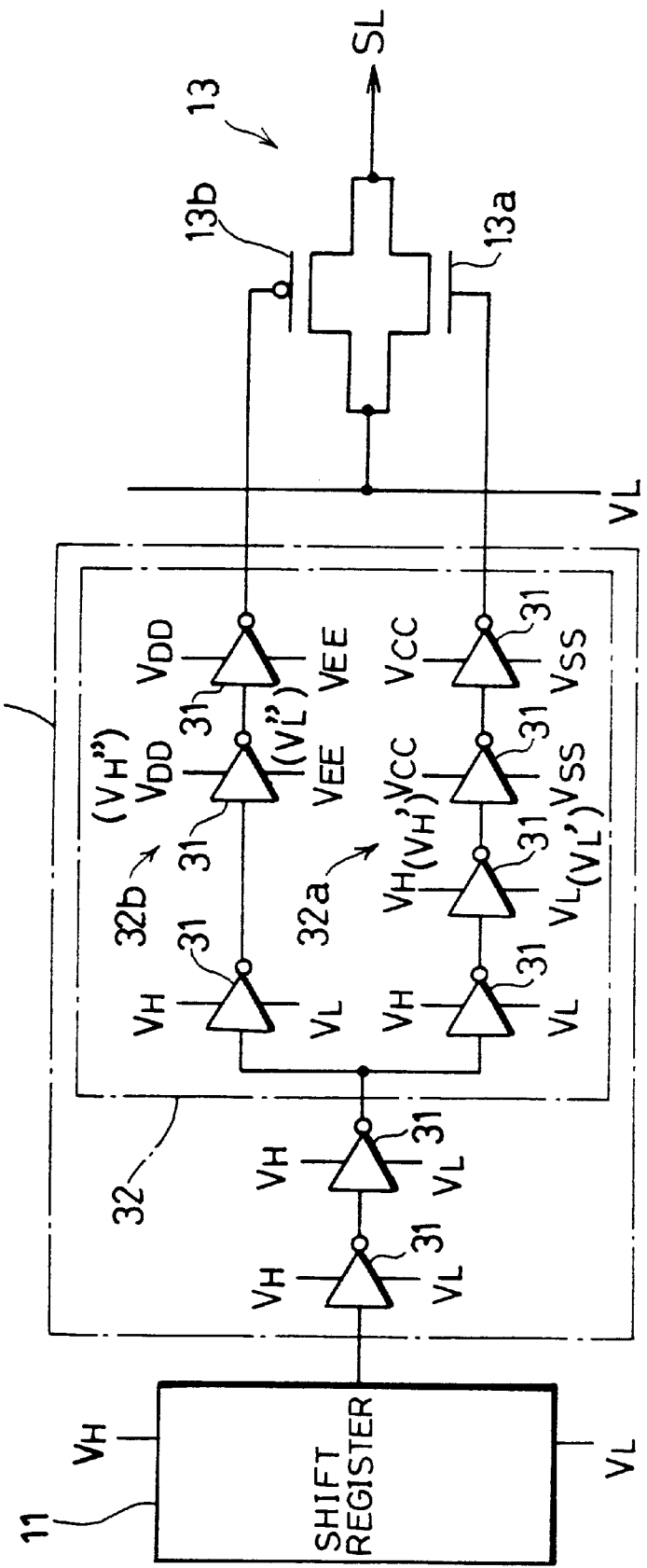
FIG. 8 is a circuit diagram showing a construction of the second sampling circuit in the first embodiment of the present invention.

As shown in FIG. 8, although it has basically the same arrangement as the first sampling circuit, the second sampling circuit is different from the first sampling circuit in its power-supply construction.

In the first branch path 32a, source voltages $V_{CC}$ and $V_{SS}$ are supplied to the two inverters 31 at the latter stages, and in the second branch path 32b, source voltages $V_{DD}$ and $V_{EE}$ are supplied to the two inverters 31 at the latter stages. Further, source voltages $V_H$ and $V_L$ are supplied to the shift register 11. Moreover, source voltages $V_H$ and $V_L$ are also supplied to the two stages of the inverters 31 following the shift register 11, to the two inverters 31 at the former stages of the first branch path 32a, and to the one inverters 31 at the former stage of the second branch path 32b. This arrangement is made so that the level of signals to be transferred to the above-mentioned inverters 31 are desirably set to be the same as that of the signals released from the shift register 11.

Power-source voltages $V_H$ and $V_L$ are respectively set to medium values between source voltages $V_{CC}, V_{SS}$ and source voltages $V_{DD}, V_{EE}$. Further, source voltages $V_{CC}$ and $V_{SS}$ are set to values that are slightly shifted toward the minus side with respect to the values of source voltages $V_H$ and $V_L$, and source voltages $V_{DD}$ and $V_{EE}$ are set to values that are slightly shifted toward the plus side with respect to the values of source voltages $V_H$ and $V_L$.

More specifically, source voltages $V_{CC}$, $V_{SS}$, $V_{DD}$, and $V_{EE}$ are indicated by equations (12) through (15), and have values, for example, $V_{CC}=4(V)$, $V_{SS}=-8(V)$, $V_{DD}=8(V)$, and $V_{EE}=-4(V)$, as described earlier. Moreover, source voltages $V_H$ and $V_L$ are indicated as follows:

$$V_H=(V_{CC}+V_{DD})/2 \tag{16}$$

$$V_L=(V_{SS}+V_{EE})/2 \tag{17}$$

Therefore, in accordance with equations (16) and (17), source voltages $V_H$ and $V_L$ are calculated as follows based on the above mentioned typical values.

$$V_H=(4+8)/2=6(V)$$

$$V_L=(-8-4)/2=-6(V)$$

Thus, the power-source voltage is set to 12V; this ensures superior sampling performance as long as devices having a withstand voltage of not less than 12V are adopted.

As described above, source voltages $V_{CC}$ and $V_{SS}$, source voltages $V_{DD}$ and $V_{EE}$, and source voltages $V_H$ and $V_L$ are set to different voltages respectively in the second sampling circuit; this makes it possible to write and hold even signals with small amplitudes in the same manner as the first sampling circuit. Therefore, it is possible to maintain the circuit characteristics even in the case of using devices with low withstand voltage.

In particular, in the second sampling circuit, the amount of shift of the source voltages is reduced to half (2V) that of the first sampling circuit (4V) by the use of the arrangement wherein source voltages $V_H$ and $V_L$ are respectively set to medium values between source voltages $V_{CC} \cdot V_{SS}$ and source voltages $V_{DD} \cdot V_{EE}$.

The shift of signal levels is achieved by driving the inverters 31 using a signal level different from the input signal level. Compared to the case where no change is made in the signal level, this operation tends to cause waveform distortions and differences in delay time in signals. For this reason, the above-mentioned arrangement reduces the waveform distortions and the differences in delay time in signals by minimizing the amount of shift as well as shifting the signal levels in the first branch path 32a and the second branch path 32b. Moreover, since the amount of shift of the source voltages is reduced to half that of the first sampling circuit, it becomes possible to suppress an increase in power consumption due to currents flowing through the inverters 31.

THIRD SAMPLING CIRCUIT

Figure 9:
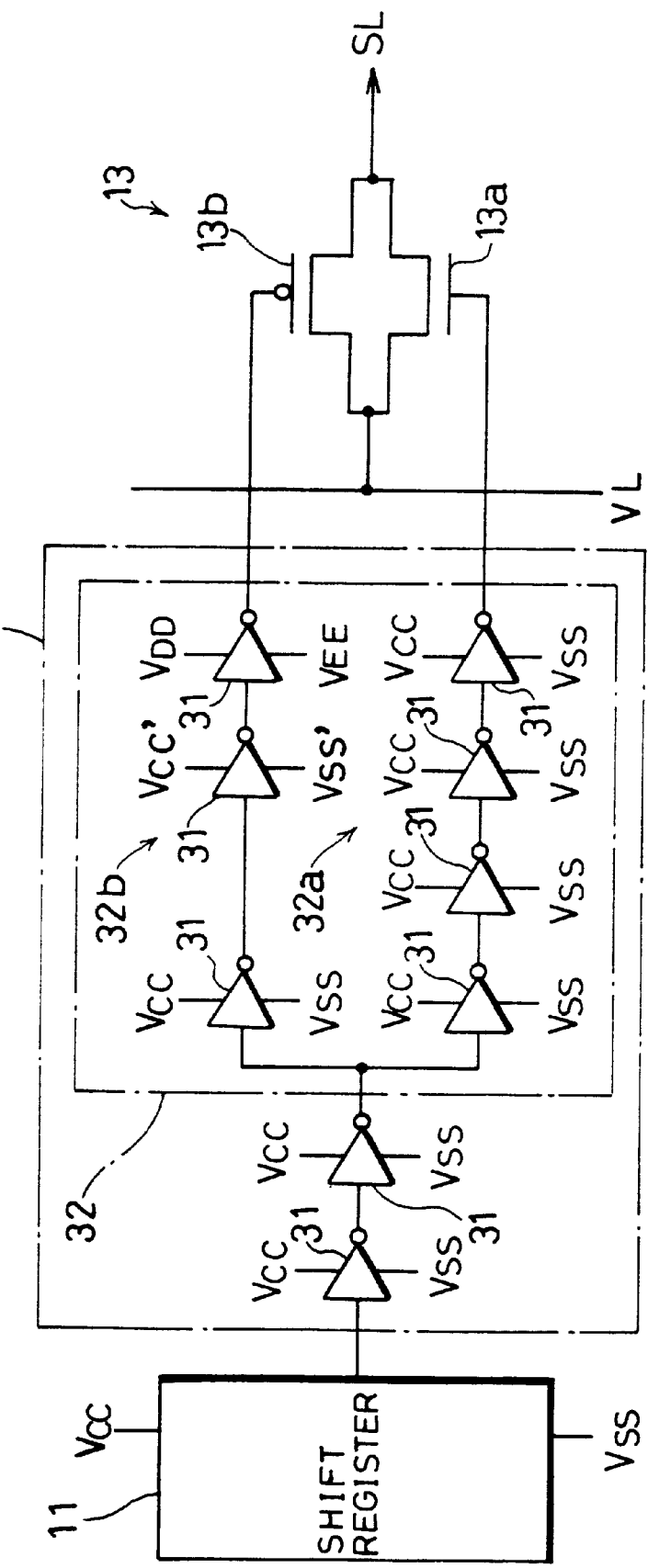
FIG. 9 is a circuit diagram showing a construction of the third sampling circuit in the first embodiment of the present invention.

As shown in FIG. 9, although it has basically the same arrangement as the first sampling circuit, the third sampling circuit has an arrangement wherein the second stage of the inverter 31 in the second branch path 32b is driven by source voltages $V_{CC'}$ and $V_{SS'}$ that are different from source voltages $V_{CC}, V_{SS}$ and $V_{DD}, V_{EE}$.

Power-source voltages $V_{CC'}$ and $V_{SS'}$ are respectively set to medium values between source voltages $V_{CC}, V_{SS}$ and source voltages $V_{DD}, V_{EE}$. Therefore, a signal passing through the second branch path 32b is temporarily shifted to the medium level by the second stage of the inverter 31 and then shifted by the output stage of the inverter 31 to a predetermined input level for the sampling switch 13.

As described above, in the third sampling circuit, the power-supply levels differ in such a manner that it is possible to maintain the circuit reliability even in the case of using devices with low withstand voltage in the same manner as the first sampling circuit. Moreover, since the third sampling circuit shifts the level of signals temporarily to the medium level in the second branch path 32b, the amount of shift per stage of the inverter 31 is reduced. Therefore, in the same manner as the second sampling circuit, the third sampling circuit makes it possible to reduce the waveform distortions and the differences in delay time in signals, as well as making it possible to suppress an increase in power consumption.

Here, specific source voltages $V_{CC}$, $V_{SS}$, $V_{DD}$, and $V_{EE}$ are indicated by equations (12) through (15), and have values, for example, $V_{CC}$=4(V), $V_{SS}$=−8(V), $V_{DD}$=8(V), and $V_{EE}$=−4(V). Moreover, source voltages $V_{CC'}$ and $V_{SS'}$ are indicated as follows:

$$V_{CC'}=(V_{CC}+V_{DD})/2 \quad (18)$$

$$V_{SS'}=(V_{SS}+V_{EE})/2 \quad (19)$$

Therefore, in accordance with equations (18) and (19), source voltages $V_{CC'}$ and $V_{SS'}$ are calculated as follows based on the above mentioned typical values.

$$V_{CC'}=(4+8)/2=6(V)$$

$$V_{SS'}=(-8-4)/2=-6(V)$$

Thus, the power-source voltage is set to 12V; this ensures superior sampling performance as long as devices having a withstand voltage of not less than 12V are adopted.

Additionally, in the third sampling circuit, only one stage of the inverter 31 is driven by using the center values (medium values); however, the present invention is not limited to this arrangement. In other words, another arrangement wherein a plurality of stages of the inverters 31 are driven by using the same or different medium voltages may be adopted, and it functions in the same manner as the third sampling circuit.

Moreover, the arrangement of the third sampling circuit is made by applying source voltages having the medium values to the arrangement of the first sampling circuit, and the source voltages having the medium values is also applied to the arrangement of the second sampling circuit.

More specifically, the second stage of the inverter 31 in the first branch path 32a, shown in FIG. 8, is driven by using source voltages $V_{H'}$ and $V_{L'}$ that are set to medium values between source voltages $V_H, V_L$ and source voltages $V_{CC}$, $V_{SS}$. Moreover, for example, the third stage of the inverter 31 in the second branch path 32b is driven by using source voltages $V_{H''}$ and $V_{L''}$ that are set to medium, values between source voltages $V_H, V_L$ and source voltages $V_{DD}, V_{EE}$.

Therefore, a signal passing through the first branch path 32a is temporarily shifted to the medium level by the inverter 31 of the second stage and then shifted by the inverter 31 of the output stage to a predetermined input level for the n-channel transistor 13a. On the other hand, a signal passing through the second branch path 32b is temporarily shifted to the medium level by the second stage of the inverter 31 and then shifted by the output stage of the inverter 31 to a predetermined input level for the p-channel transistor 13b.

FOURTH SAMPLING CIRCUIT

Figure 10:
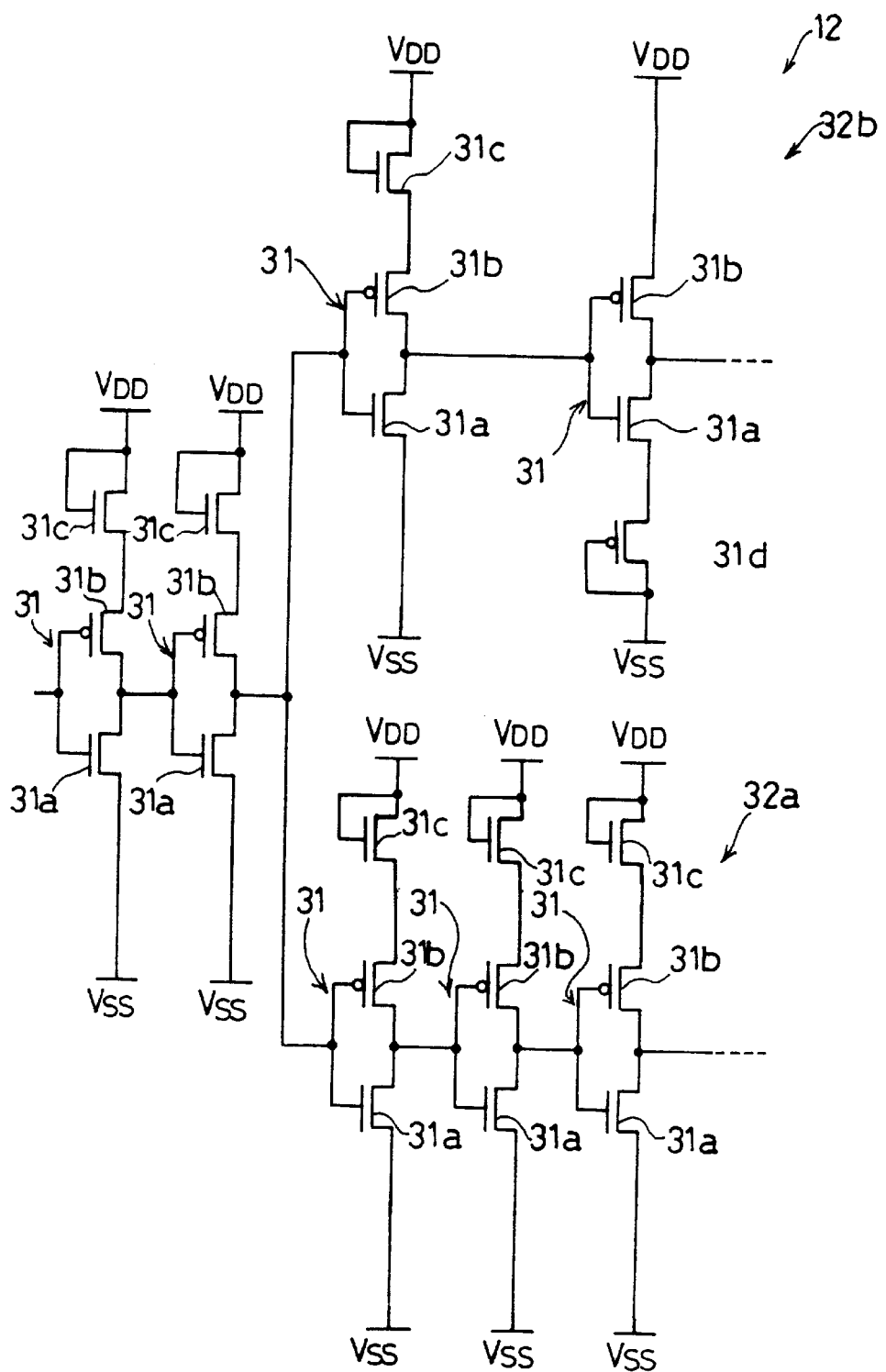
FIG. 10 is a circuit diagram showing a construction of the fourth sampling circuit in the first embodiment of the present invention.

As shown in FIG. 10, although it has basically the same arrangement as the first sampling circuit, the fourth sampling circuit has an arrangement wherein all the inverters 31 are driven by using the same source voltages $V_{DD}$ and $V_{SS}$. Further, in the same manner as the first sampling circuit, the signal level is shifted in the second branch path 32b. Here, in FIG. 10, only parts of circuits inside the amplification circuit 12 (wherein signals are divided and the signal level is changed) are illustrated.

In the fourth sampling circuit, each inverter 31 is provided with an n-channel transistor 31a and a p-channel transistor 31b that are connected in series with each other and that have an inverting function. Further, a voltage limiter is provided inside the inverter 31, and the output level is limited by this voltage limiter. The voltage limiter has an n-channel transistor 31c and a p-channel transistor 31d with their gate and drain being short-circuited. These transistors are disposed on the high-potential power-supply side of the transistors 31a and 31b, or on the low-potential power-supply side of thereof, or they are disposed on both sides thereof. In this case, the n-channel transistor 31c is disposed on the high-potential power-supply side, and the p-channel transistor 31d is disposed on the low-potential power-supply side.

The above-mentioned limiter functions so as to generate voltages whose levels are shifted by respective portions corresponding to the threshold voltages of the n-channel transistor 31c and the p-channel transistor 31d. Thus, voltages that are lower than the driving voltage for the inverters 31 are applied to the n-channel transistor 31a and the p-channel transistor 31b. Therefore, the output level of the inverters 31 is virtually coincident with the level of the voltages that were applied to the transistors 31a and 31b.

In the case of incorporating the voltage limiters into the clocked inverter 21 and the inverter 22 that constitute the shift register 11, source voltages to be applied to the shift register 11 are set to $V_{DD}$ and $V_{SS}$ that are the same as those applied to the inverters 31. Further, in the case of no voltage limiters in the inverters 21 and 22, source voltages to be applied to the shift register 11 are set to $V_H$ and $V_L$ that are the same as those used in the first sampling circuit.

As described above, in the fourth sampling circuit, the virtual driving voltage for the inverters 31 in the second branch path 32b, that is, a voltage limited by the voltage limiter, is shifted toward the plus side with respect to the virtual driving voltage for the other circuits (such as the shift register 11). Therefore, the voltage shift is carried out in the same manner as the first sampling circuit, and it becomes possible to maintain the circuit reliability even in the case of using devices with low withstand voltage.

Moreover, the fourth sampling circuit necessitates only one system of power supply for the amplification circuit 12; this makes it possible to simplify the power supply system such as power-supply circuits and power-supply lines. In addition, it is possible to simplify the power-supply systems for the shift register 11 and the amplification circuit 12 by installing the voltage limiters in the shift register 11.

Additionally, the number of the voltage limiters to be incorporated into the inverter 31 is not necessarily limited to one; a plurality of limiters may be connected in series with one another so as to obtain a shift to a desired voltage level. Further, there may be a difference in the numbers of the voltage limiters between the high-potential power-supply side and the low-potential power-supply side. Moreover, the fourth sampling circuit may be applied not only to the first sampling circuit, but also to the third sampling circuit.

FIFTH SAMPLING CIRCUIT

Figure 11:
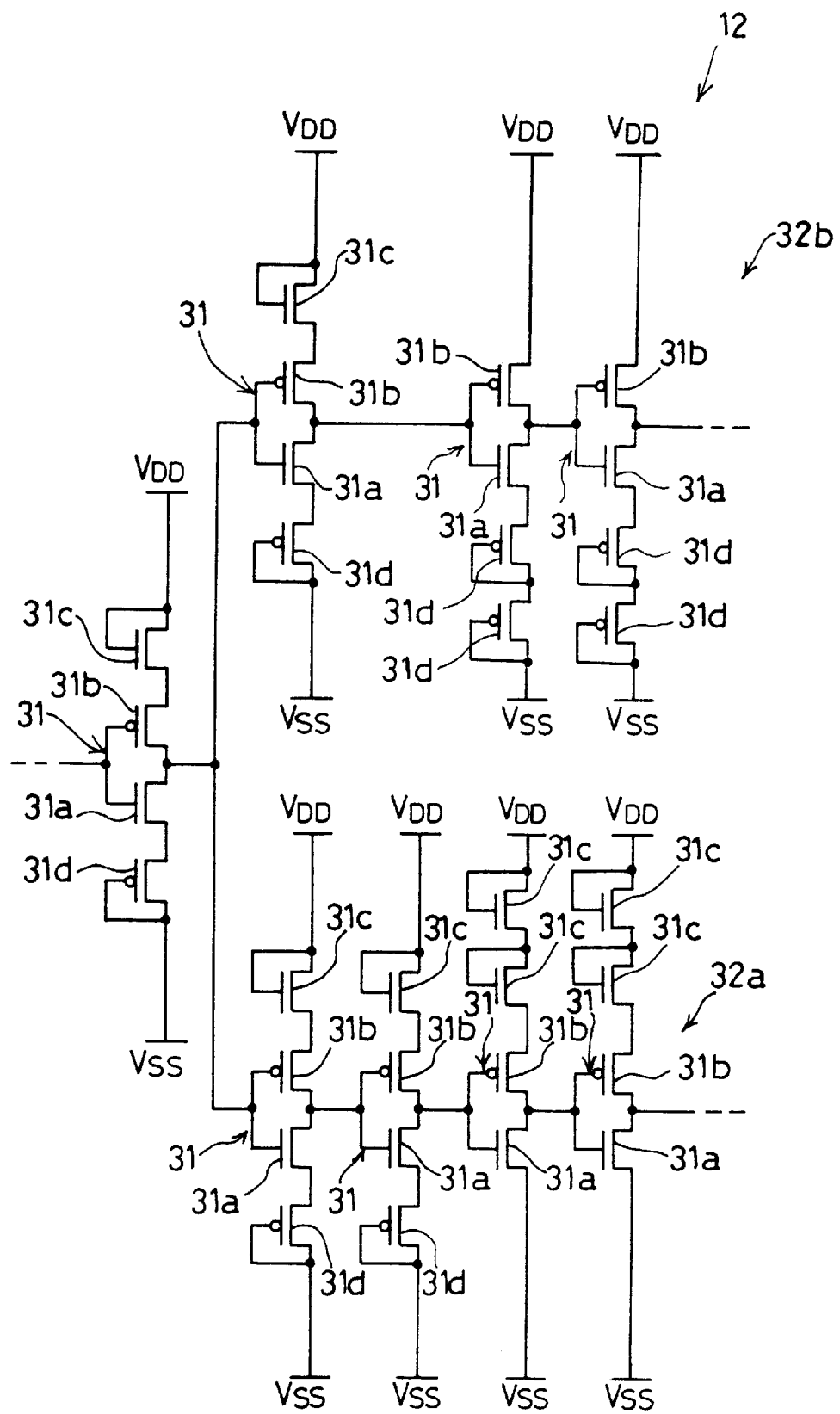
FIG. 11 is a circuit diagram showing a construction of the fifth sampling circuit in the first embodiment of the present invention.

As shown in FIG. 11, although it has basically the same arrangement as the second sampling circuit, the fifth sampling circuit has an arrangement wherein all the inverters 31 are driven by using the same source voltages $V_{DD}$ and $V_{SS}$. Further, in the same manner as the second sampling circuit, the signal level is shifted in the first branch path 32a as well as in the second branch path 32b. Here, in FIG. 11, only parts of circuits inside the amplification circuit 12 (wherein signals are diverged and the signal level is changed) are illustrated.

In the fifth sampling circuit also, a voltage limiter is provided inside each inverter 31 in the same manner as the fourth sampling circuit, and the output level is limited by this voltage limiter. Therefore, the output level of the inverters 31 is virtually coincident with the level of the voltages that were applied to the transistors 31a and 31b.

In the case of incorporating the voltage limiters into the clocked inverter 21 and the inverter 22 that constitute the shift register 11, source voltages to be applied to the shift register 11 are set to $V_{DD}$ and $V_{SS}$. Further, in the case of no voltage limiters in the inverters 21 and 22, source voltages to be applied to the shift register 11 are set to $V_H$ and $V_L$ that are the same as those used in the second sampling circuit.

In the fifth sampling circuit, the virtual driving voltages for the inverters 31 in the first branch path 32a and the second branch path 32b (that is, a voltage limited by the voltage limiter) are respectively shifted toward the minus side and the plus side with respect to the virtual driving voltage for the other circuits (such as the shift register 11). Therefore, the voltage shift is carried out in the same manner as the second sampling circuit, and it becomes possible to maintain the circuit reliability even in the case of using devices with low withstand voltage. Further, since the amount of shift in source voltages is kept small, it is possible to reduce the waveform distortions and the differences in delay time in signals, as well as making it possible to suppress an increase in power consumption.

Moreover, as in the fourth sampling circuit, the fifth sampling circuit necessitates only one system of power supply for the amplification circuit 12; this makes it possible to simplify the power supply system such as power-supply circuits and power-supply lines. In addition, it is possible to further simplify the power-supply systems by installing the voltage limiters in the shift register 11.

Additionally, in the fifth sampling circuit also, the number of the voltage limiters to be incorporated into the inverter 31 is not necessarily limited to one; a plurality of limiters may be connected in series with one another so as to obtain a shift to a desired voltage level. Further, there may be a difference in the numbers of the voltage limiters between the high-potential power-supply side and the low-potential power-supply side. Moreover, the fifth sampling circuit may be applied not only to the second sampling circuit, but also to the third sampling circuit that is applicable to the second sampling circuit.

SIXTH SAMPLING CIRCUIT

Figure 12:
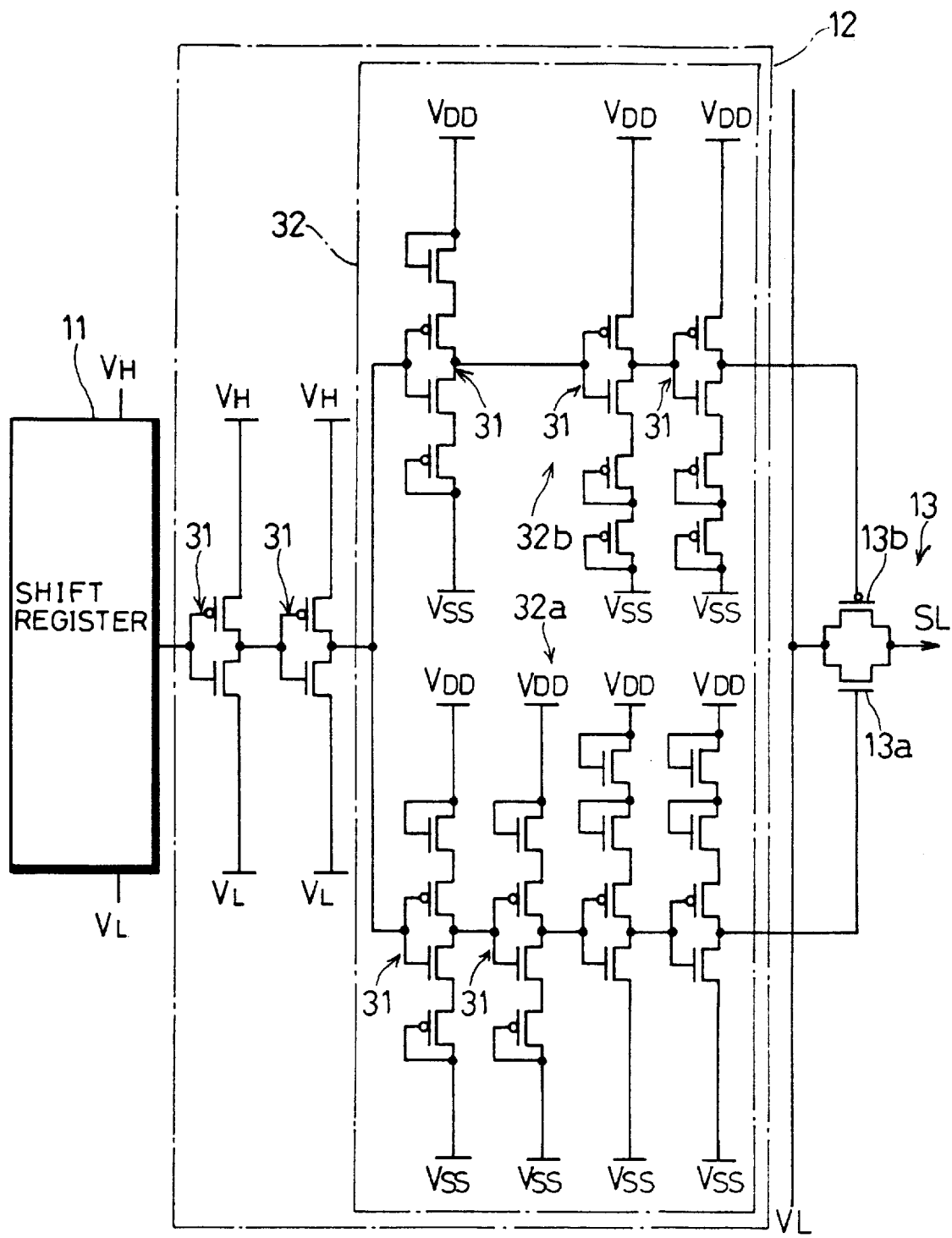
FIG. 12 is a circuit diagram showing a construction of the sixth sampling circuit in the first embodiment of the present invention.

As shown in FIG. 12, in the sixth sampling circuit, source voltages $V_H$ and $V_L$ are applied to the shift register 11 as well as to the two stages of the inverters 31 that are connected to the shift register 11, and source voltages $V_{DD}$ and $V_{SS}$ are applied to all the inverters 31 in the branch circuit 32. Further, each of the inverters 31 in the branch circuit 32 is provided with a voltage limiter in the same manner as the inverter 31 in the fifth sampling circuit. Therefore, the sixth sampling circuit is considered to be a combination that is made by partially incorporating the second and fifth sampling circuits.

In the sixth sampling circuit also, the virtual driving voltages for the inverters 31 in the first branch path 32a and the second branch path 32b are respectively shifted toward the minus side and the plus side with respect to the virtual driving voltage for the other circuits. Therefore, the voltage shift is carried out in the same manner as the second sampling circuit, and it is possible to obtain the same effects as the second sampling circuit. Further, it is possible to obtain the same effects as the fifth sampling circuit by incorporating the voltage limiters.

In the case of incorporating the voltage limiters into the inverters and other devices, the voltage limiters also limit supply currents; this tends to cause longer delay time in the circuits. Here, in the sixth sampling circuit, no voltage limiters are installed in the circuits constituting the shift register 11; therefore, it is possible to maintain high-speed operation without delay in operation speed. Moreover, in the circuits located after the shift register 11, even if a delay occurs, it is properly settled by shifting the respective sampling timings for the video signal as long as the delay is uniformly imposed on the outputs of the shift register 11. Therefore, no adverse effects are given on the performance of the sixth sampling circuit.

Additionally, in the sixth sampling circuit also, the number and location of the voltage limiters to be incorporated into the inverters 31 are not necessarily limited to those used in the above-mentioned arrangement.

Moreover, in the sixth sampling circuit, source voltages to be applied to the two stages of the inverters 31 following the shift register 11 are not necessarily limited to $V_H$ and $V_L$. For example, source voltages $V_{DD}$ and $V_{SS}$ are applied to these inverters 31 and the voltage limiters are installed therein in the same manner as the first stage of the inverter 31 in the first branch path 32a.

TRANSISTORS FOR USE IN SAMPLING CIRCUITS

Next, an explanation will be given on transistors that constitute the first through sixth sampling circuits. Additionally, the aforementioned pixel 4 may be constituted by using these transistors, or may be otherwise constituted.

Figure 13:
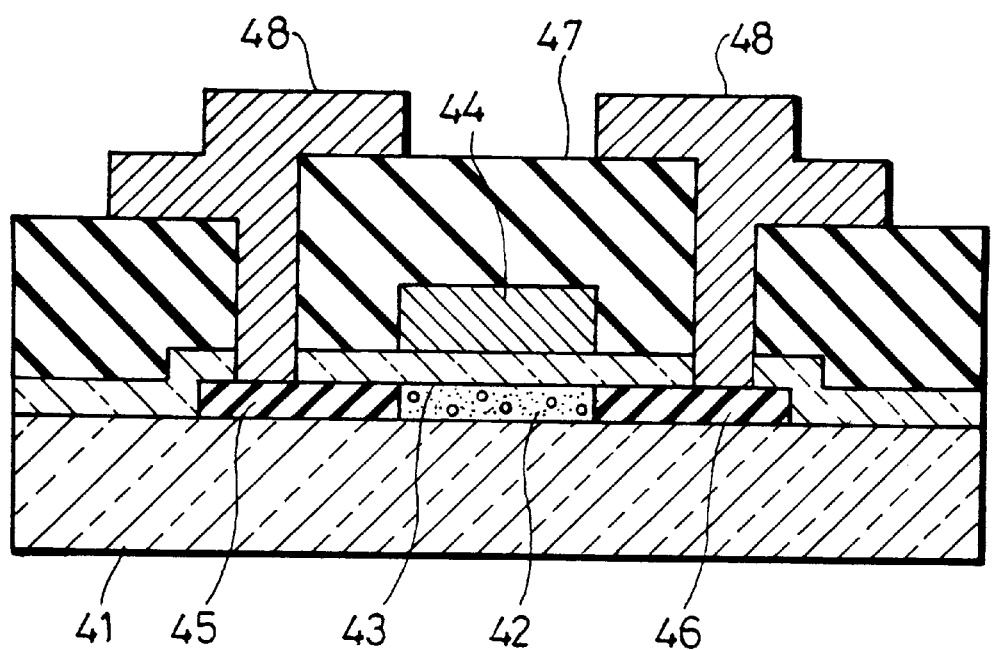
FIG. 13 is a vertical cross-sectional view showing a construction of a thin-film transistor that is used in the first through sixth sampling circuits in the first embodiment of the present invention.

As shown in FIG. 13, these transistors are polycrystal silicon thin-film transistors (hereinafter referred to as p-Si thin-film transistors), and have an arrangement wherein MIS(Metal Insulator Semiconductor) field effect transistors are formed on a polycrystal silicon thin-film (hereinafter referred to as p-Si thin-film) 42 that is formed on a glass substrate 41.

On the p-Si thin film 42, is formed a gate electrode 44 with a silicon oxide film 43 functioning as a gate insulating film located in between. Ions of impurities are injected into areas of the p-Si thin film 42 other than the area covered with the gate electrode 44, thereby forming a source electrode 45 and a drain electrode 46. Further, a silicon nitride film 47, which functions as an interlayer insulating film, is formed to cover the silicon oxide film 43 and the gate electrode 44, and metal wires 48 are installed to reach the source electrode 45 and the drain electrode 46 through the gaps of the silicon nitride film 47.

The p-Si thin-film transistors, arranged as described above, do not require substrates that are required in arranging ICs; therefore, they are free from so-called substrate effects by which the threshold value of transistors is varied due to the source potential. Thus, even if the effective voltage to be applied to the inverters 31 is varied by the application of the voltage limiters, the inversion characteristics of the inverters 31 are not adversely effected by the substrate effects.

Conventionally, since p-Si thin-film transistors have low withstand voltage in their devices, it is difficult to configure sampling circuits with superb characteristics by using them. In contrast, those devices with low withstand voltage are suitably applied to the first through sixth sampling circuits, and the above-mentioned features of the p-Si thin-film transistors are effectively demonstrated.

Additionally, p-Si thin-film transistors are used for exemplifying the above-mentioned arrangement; however, the present invention is not intended to be limited to this arrangement. Any transistors using a material other than polycrystal silicon may be adopted as long as they are thin-film transistors. For example, mono-crystal silicon thin-film transistors may be adopted, wherein a mono-crystal silicon thin-film is used in place of the p-Si thin-film 42 in the p-Si thin-film transistor. In this case, the construction of the thin-film transistor is not intended to be limited to the stagger construction that is shown in FIG. 13: other constructions, such as the reversed stagger construction, may be adopted.

APPLICATION OF THE SAMPLING CIRCUITS TO LIQUID CRYSTAL DISPLAYS

In an active-matrix-type liquid crystal display using the point-sequential driving method shown in FIG. 3, the writing period in which the video signal is written to the data signal line SL is very short, that is, it is in the order of several tens to several hundreds of nanoseconds. In contrast, the holding time in the data signal line SL needs to be not less than several tens of micro seconds.

Further, in a liquid crystal display, the liquid crystal needs to be driven while inverting its phase in order to prevent deterioration of the liquid crystal. Here, supposing that the liquid-crystal driving voltage is 5V, the amplitude of the video signal is required to be 10V. In order to write such signals with great amplitude at high speeds and hold them for a long time, it is necessary to supply a greater driving signal to the sampling switch 13. In this case, the amplification circuit 12 is not allowed to produce a greater driving signal, unless the withstand voltage of the respective devices installed therein is sufficiently high.

Here, the application of the first through sixth sampling circuits to a liquid crystal display makes it possible to reduce voltages to be applied to the transistors 13a and 13b in the sampling switch 13. Therefore, even in the case of using devices having low withstand voltage, it is possible to maintain sufficient writing and holding performances.

Similarly, in an active-matrix-type liquid crystal display using the line-sequential driving method shown in FIG. 6, the writing period in which the video signal is written to the sampling capacity 16 is very short, that is, it is in the order of several tens to several hundreds of nanoseconds. In contrast, the holding time in the sampling capacity 16 needs to be not less than several tens of micro seconds. In the line-sequential driving method, although the writing operation is easily carried out since its load capacity is small compared to the point-sequential driving method, it becomes hard to carry out the holding operation. Therefore, the application of the first through sixth sampling circuits to the liquid crystal display using the line-sequential driving method makes it possible to provide the same effects that are obtained in the point-sequential driving method.

By adopting the first through sixth sampling circuits, the writing and holding operations of video signal are carried out with high precision, and consequently the liquid crystal display is allowed to display high-quality images with multi-gradation. In particular, in liquid crystal displays having a newly developed monolithic construction, that is, a construction wherein pixel arrays and driving circuits are integrally formed on the same substrate, the arrangement of the present embodiment is more effectively applied, since thin-film transistors having inferior characteristics are applicable as the devices of the driving circuits.

Moreover, in the case of using inexpensive glass substrates to meet the demand for large liquid crystal displays having the monolithic construction, the devices have to be manufactured below the distortion point (about 600° C.), and the devices manufactured under such processes are inferior in their performances. Therefore, the above-mentioned effects are demonstrated also in this case. In addition, the same effects can be obtained in the case where the above-mentioned driving circuits are formed on a glass substrate and the substrate is assembled on a substrate whereon pixel arrays are disposed.

In the above-mentioned embodiments, the descriptions have been given mainly on the application of the sampling circuits to liquid crystal displays of the active-matrix type; however, the present invention is not intended to be limited to this application, and can be applied to other display apparatuses as long as they are of the active-matrix driving type. Those display apparatuses include, for example, plasma displays, LED displays, and EL displays.

(EMBODIMENT 2)

Referring to FIGS. 1, 3, 5, and 6, as well as FIGS. 14 through 32, the following description will discuss the second embodiment of the present invention. Here, in the present embodiment, those members that have the same functions and that are described in embodiment 1 are indicated by the same reference numerals and the description thereof is omitted.

FIRST SAMPLING CIRCUIT

Figure 14:
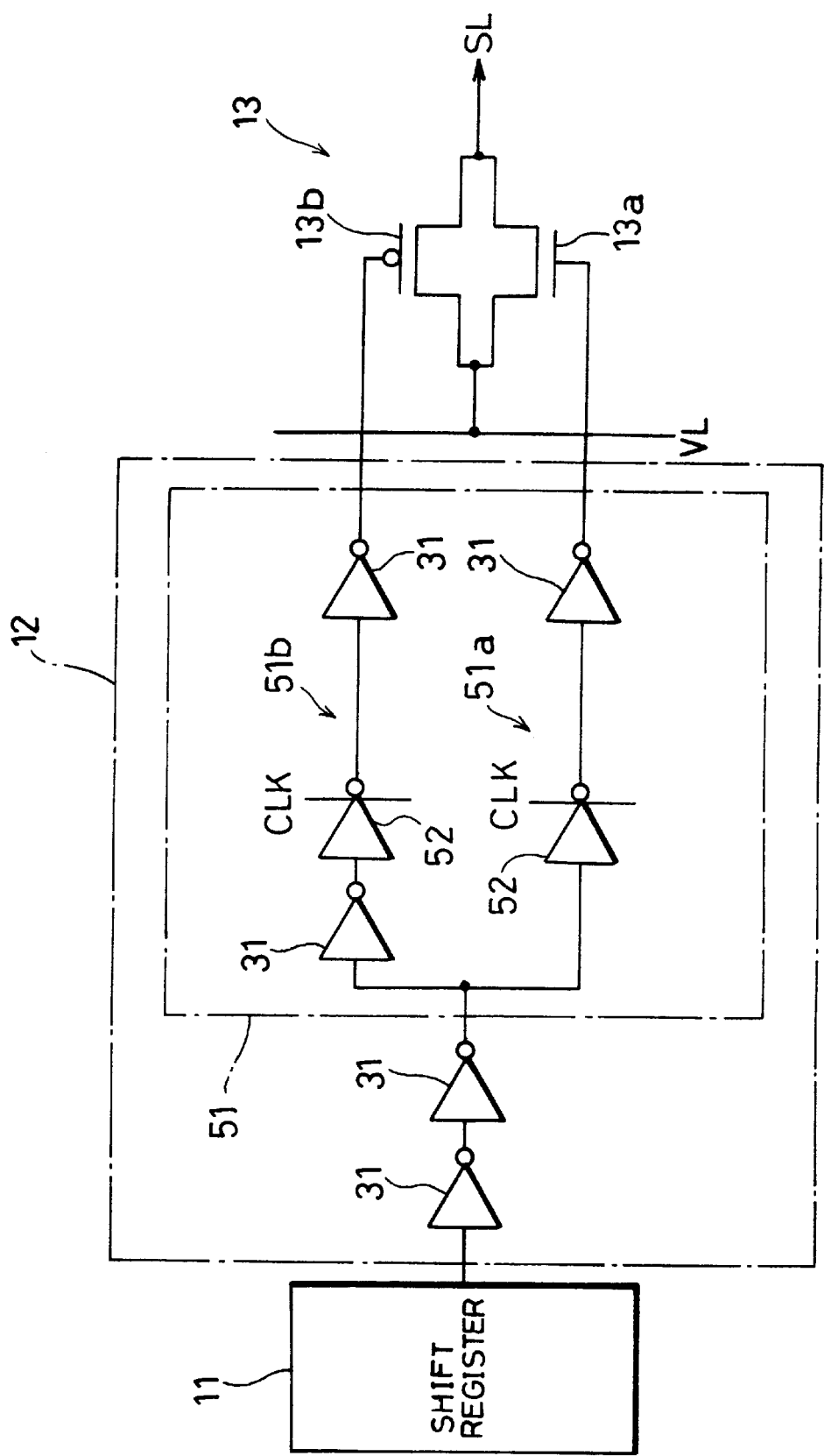
FIG. 14 is a circuit diagram showing a construction of the first sampling circuit in the second embodiment of the present invention.
Figure 15:
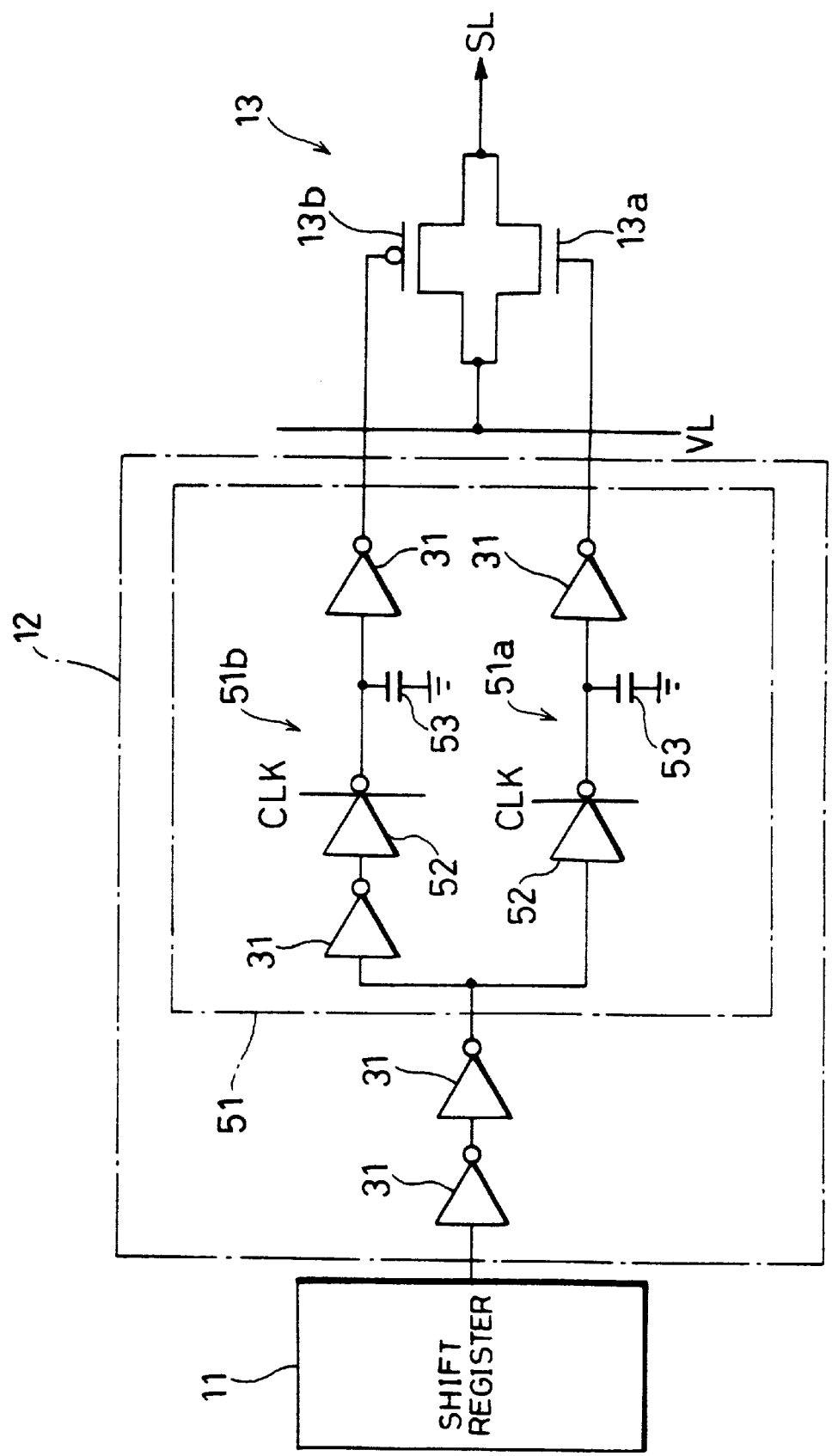
FIG. 15 is a circuit diagram showing a sampling circuit in accordance with the first modified example of the first sampling circuit.

As shown in FIG. 14, in an amplification circuit 12 of the first sampling circuit, two stages of inverters 31 are disposed following one of the output terminals of a shift register 11. At the following stages, a branch circuit 51 having the branched first path 51a and second path 51b. The first path 51a is provided with an inverter 31, a clocked inverter 52, and an inverter 31 that are aligned in this order. The second path 51b is provided with a clocked inverter 52 and an inverter 31 that are aligned in this order.

The inverter 31 at the output stage of the first path 51a is connected to the gate of an n-channel transistor 13a, and the inverter 31 at the output stage of the second path 51b is connected to the gate of a p-channel transistor 13b. Further, the clocked inverter 52, which functions as a synchronous inverter and has an arrangement as shown in FIG. 5, has functions identical to the clocked inverter 21 that constitutes the shift register 11.

In the first sampling circuit having the above-mentioned arrangement, an output signal (timing signal) from the shift register 11, which has been amplified through the two stages of the inverters 31, is separately directed to two systems through the branch circuit 51. One of the timing signals thus branched is inputted to the gate electrode of the n-channel transistor 13a after passing through the clocked inverter 52 and the inverter 31 in the first path 51a. The other timing signal is inputted to the gate electrode of the p-channel transistor 13b after passing through the inverter 31, the clocked inverter 52 and the inverter 31 in the second path 51b. Thus, the video signal is written to a data signal line SL from a video signal line VL by the use of the sampling switch 13.

At this time, the clocked inverters 52 in the first and second paths 51a and 51b are operated by the same synchronous signal (timing signal) CLK; this allows the inversions of signals to occur at the same time at the following stages. Therefore, noises, which occur in both the transistors 13a and 13b at the time of cutoff, are cancelled, thereby making it possible to write analog signal to the data signal line SL with high accuracy.

Here, in the state of no operation of the clocked inverters 52, there is a possibility of unstable operation since no input is made to the inverters 31 at the following stages. In order to solve this problem, a modified example of the first sampling circuit is given in FIG. 15. In this sampling circuit, capacitors 53 are installed between the output of the clocked inverters 52 and ground. With this arrangement, the output signals of the clocked inverters 52 can be held, although it is a short period of time, thereby making it possible to stabilize the operation.

Figure 16:
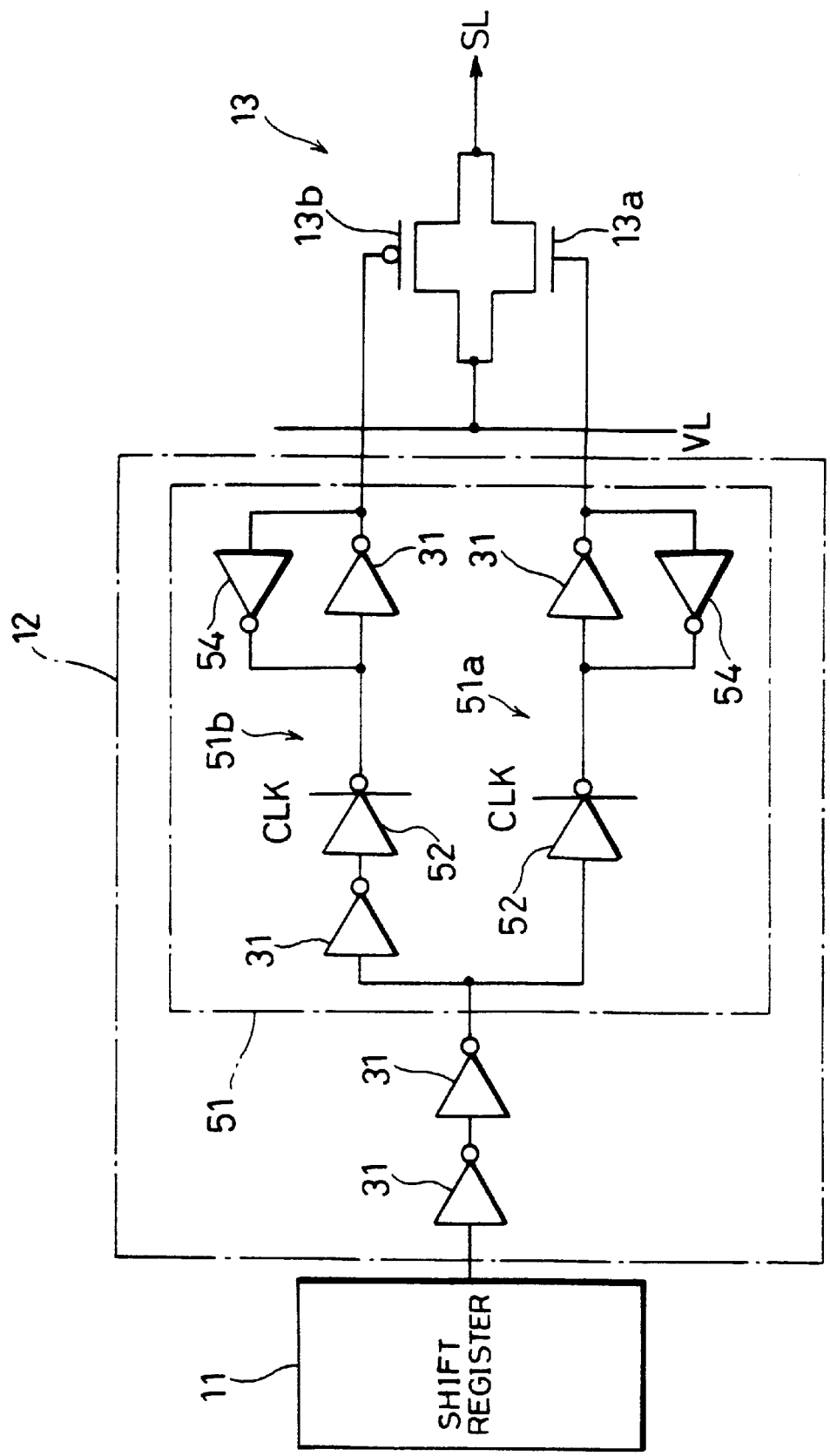
FIG. 16 is a circuit diagram showing a sampling circuit in accordance with the second modified example of the first sampling circuit.

Moreover, FIG. 16 shows the second modified example of the first sampling circuit. In this sampling circuit, inverters 54 are connected in parallel and in the reversed direction with the inverters 31 that are located right after the clocked inverters 52. Since this arrangement forms a latch circuit by the inverters 31 and 54, it becomes possible to stabilize the operation. In this case, it is necessary to minimize the driving power of the inverters 54 in order not to affect the operation of the clocked inverters 52.

Figure 17:
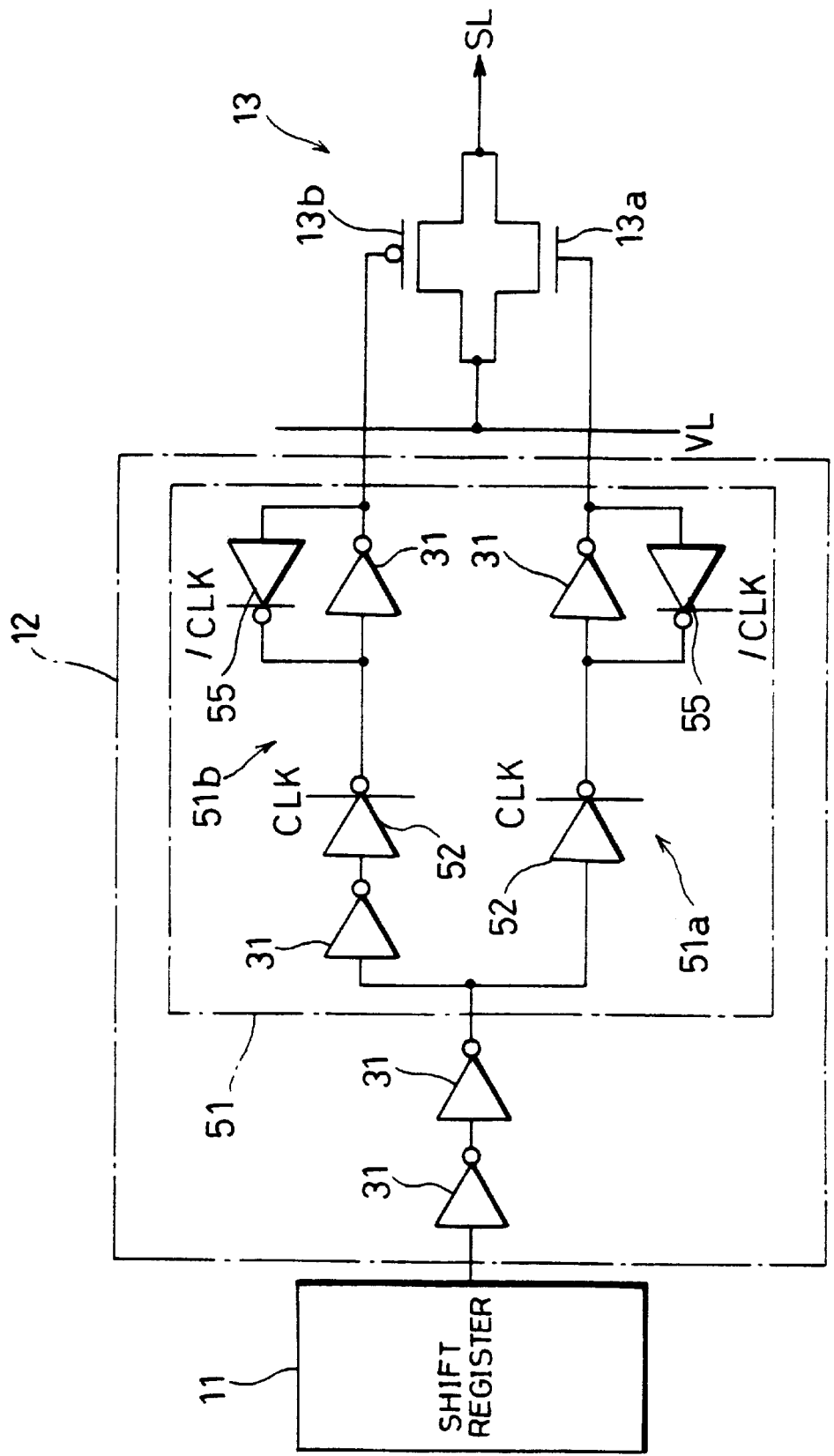
FIG. 17 is a circuit diagram showing a sampling circuit in accordance with the third modified example of the first sampling circuit.

Furthermore, FIG. 17 shows the third modified example of the first sampling circuit. In this sampling circuit, clocked inverters 55 are connected in parallel and in the reversed direction with the inverters 31 that are located right after the clocked inverters 52. The clocked inverters 55 are operated by a synchronous signal/CLK having a phase reversed to that of the synchronous signal of the clocked inverters 52. Since this arrangement also forms a latch circuit by the inverter circuit 31 and the clocked inverter 55, it is possible to stabilize the operation.

SECOND SAMPLING CIRCUIT

Figure 18:
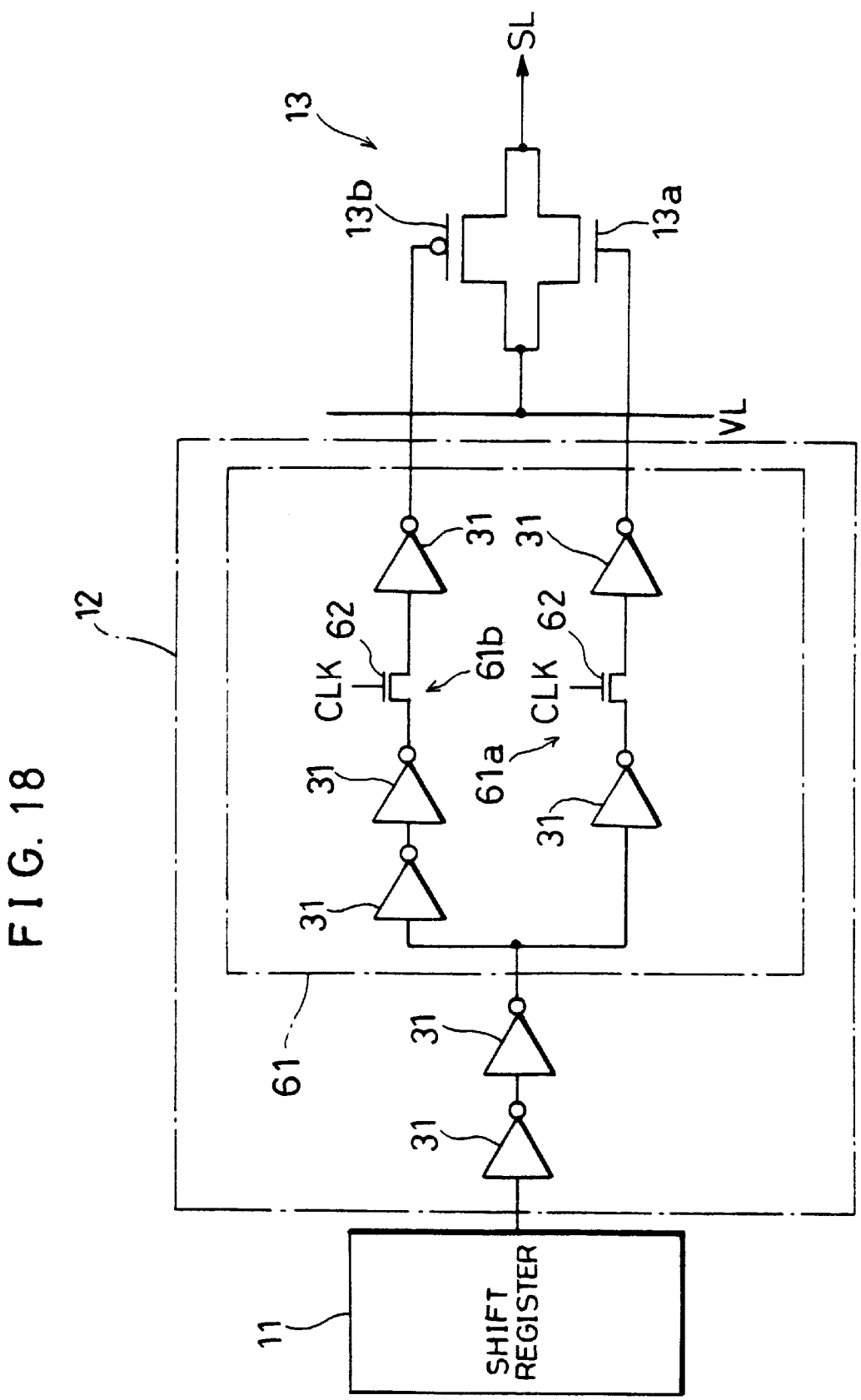
FIG. 18 is a circuit diagram showing a construction of the second sampling circuit in the second embodiment of the present invention.

As shown in FIG. 18, the second sampling circuit is provided with a branch circuit 61 having the first path 61a and the second path 61b that is installed in an amplification circuit 12. The first path 61a has an inverter 31, a transfer switch 62 consisting of an n-channel transistor, and an inverter 31 that are aligned in this order. The second path 61b has two inverters 31, a transfer switch 62, and an inverter 31 that are aligned in this order. In other words, the present sampling circuit has an arrangement wherein the clocked inverter 52 of the first sampling circuit is replaced with a circuit that consists of the inverter 31 and the transfer switch 62.

In the second sampling circuit having the above-mentioned arrangement, an output signal (timing signal) from the shift register 11, which has been amplified through the two stages of the inverters 31, is separately directed to two systems. One of the timing signals thus diverged is inputted to the gate electrode of the n-channel transistor 13a after passing through the inverter 31, the transfer switch 62 and the inverter 31 in the first path 61a. The other timing signal is inputted to the gate electrode of the p-channel transistor 13b after passing through the two stages of the inverters 31, the transfer switch 62 and the inverter 31 in the second path 61b. Thus, the video signal is written to the data signal line SL from the video signal line VL by the use of the sampling switch 13.

At this time, the transfer switches 62 in the first and second paths 61a and 61b are operated by the same synchronous signal (timing signal) CLK; this allows the inversions of signals to occur at the same time at the following stages. Therefore, noises at the time of cutoff in the sampling transistors 13a and 13b are cancelled, thereby making it possible to write analog signal to the data signal line SL with high accuracy.

Here, when the transfer switches 62 are cut off, there is a possibility of unstable operation since no input is made to the inverters 31 at the following stages. As with the first sampling circuit, the following modified examples of the sampling circuit may be adopted in order to solve this problem.

Figure 19:
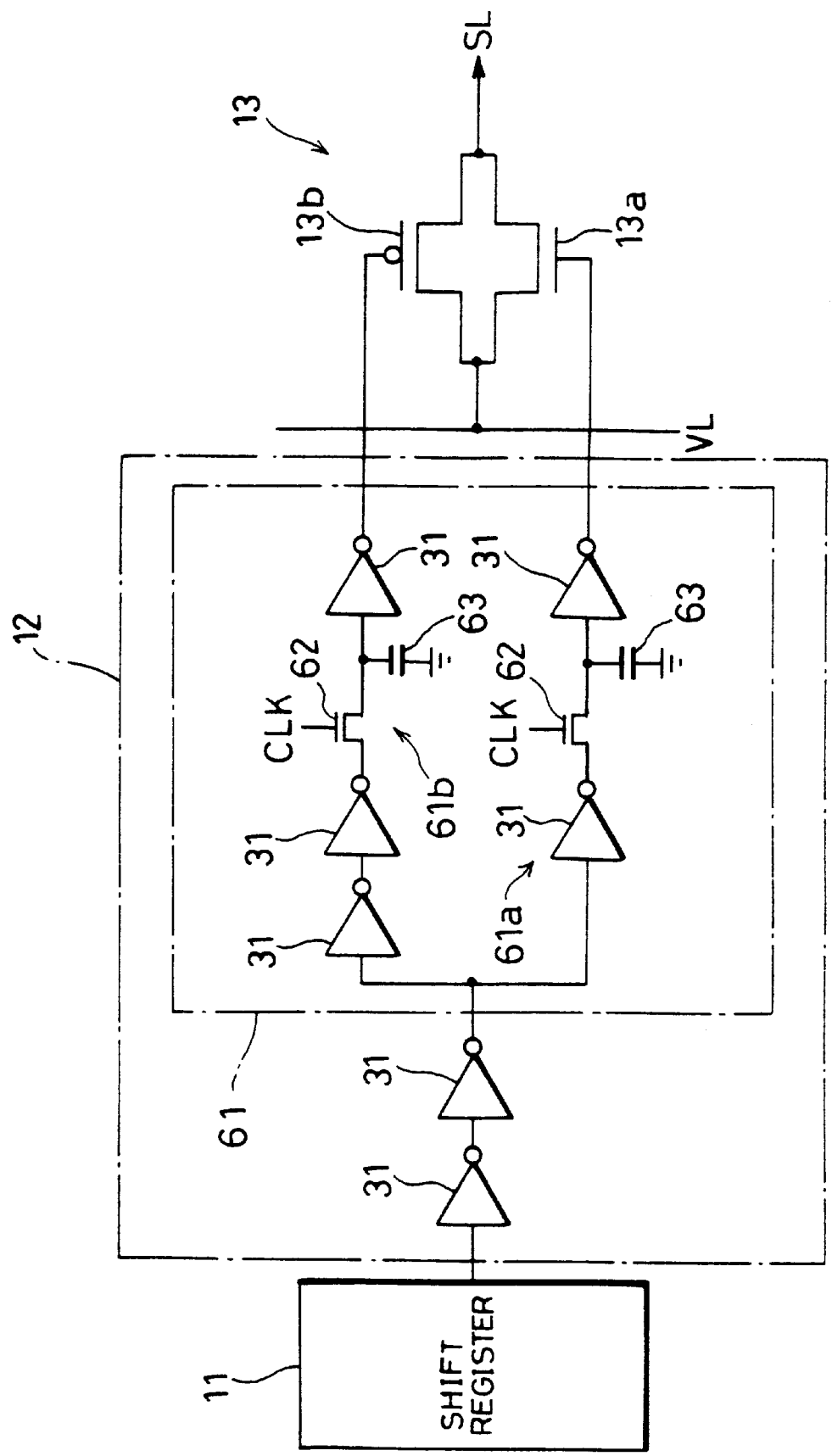
FIG. 19 is a circuit diagram showing a sampling circuit in accordance with the first modified example of the second sampling circuit.

As shown in FIG. 19, in a sampling circuit related to the first modified example of the second sampling circuit, capacitors 63 are respectively installed between the outputs of the transfer switches 62 and ground. With this arrangement, the output signals of the transfer switches 62 can be held, although it is a short period of time, thereby making it possible to hold the output signals of the transfer switches 62 and stabilize the operation.

Figure 20:
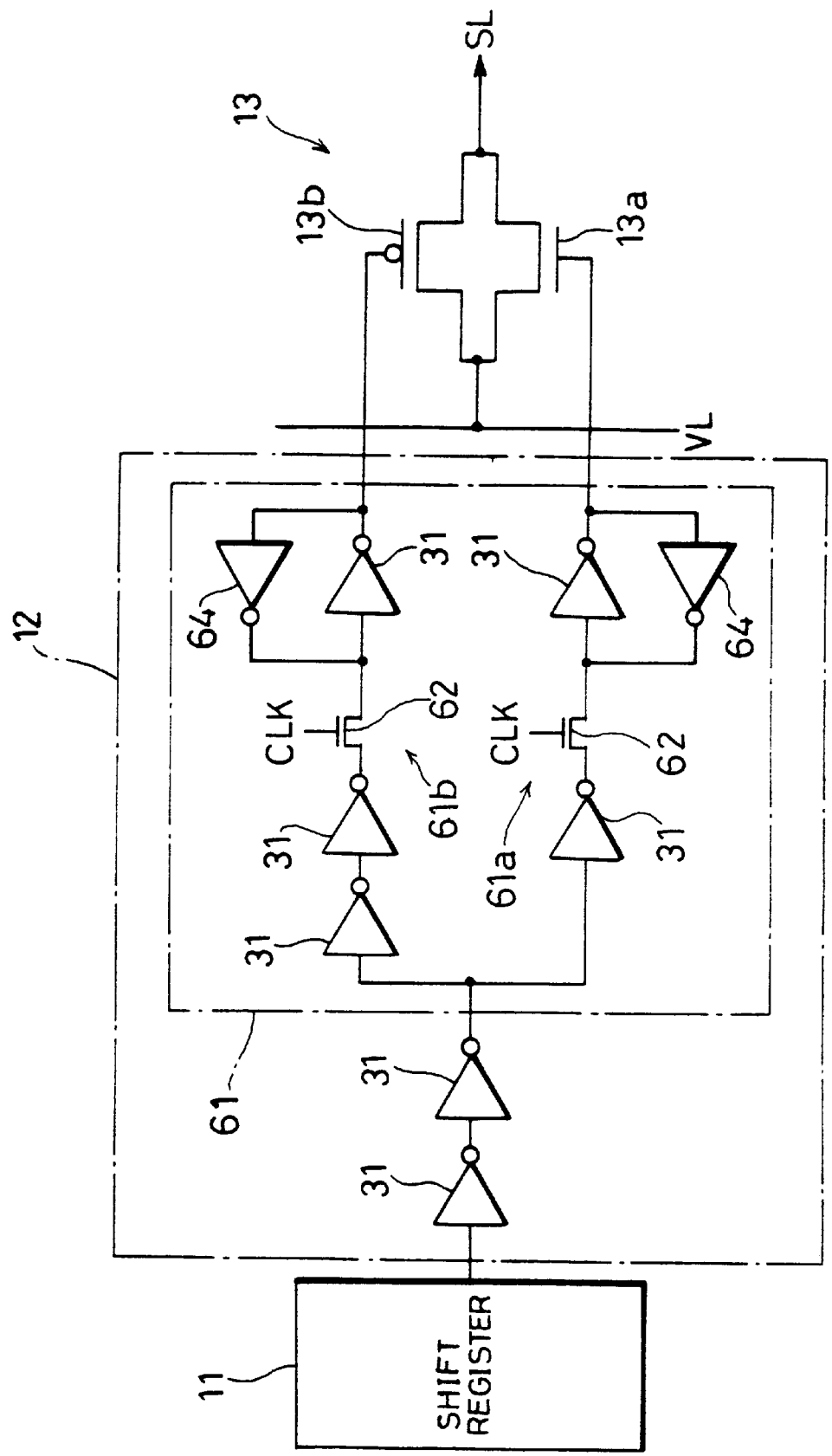
FIG. 20 is a circuit diagram showing a sampling circuit in accordance with the second modified example of the second sampling circuit.

Moreover, as shown in FIG. 20, in a sampling circuit related to the second modified example of the second sampling circuit, inverters 64 are connected in parallel and in the reversed direction with the inverters 31 that are located right after the transfer switches 62. Since a latch circuit is formed by the inverters 31 and 64, it becomes possible to stabilize the operation. In this case, it is necessary to minimize the driving power of the inverters 64 in order not to affect the operations of the transfer switches 62.

Figure 21:
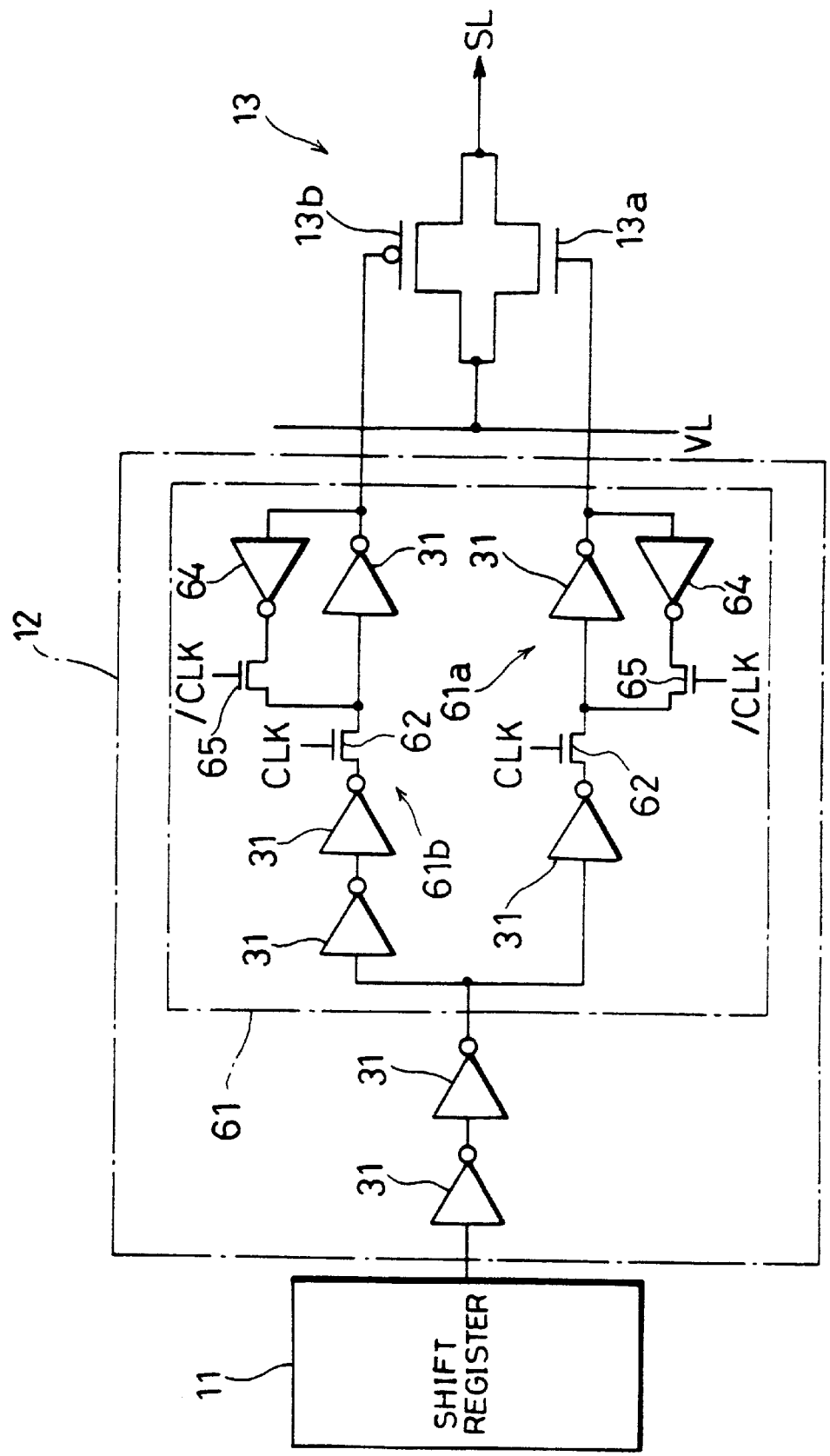
FIG. 21 is a circuit diagram showing a sampling circuit in accordance with the third modified example of the second sampling circuit.

Furthermore, FIG. 21 shows a sampling circuit related to the third modified example of the second sampling circuit. This sampling circuit has an arrangement wherein in each of the first and second paths 61a and 61b of the sampling circuit of FIG. 20, a transfer switch 65, which is operated by a synchronous signal/CLK having a phase reversed to that of the transfer switch 62, is inserted between the transfer switch 62 and the inverter 64. Since this arrangement also forms a latch circuit, it is possible to stabilize the operation.

Figure 22:
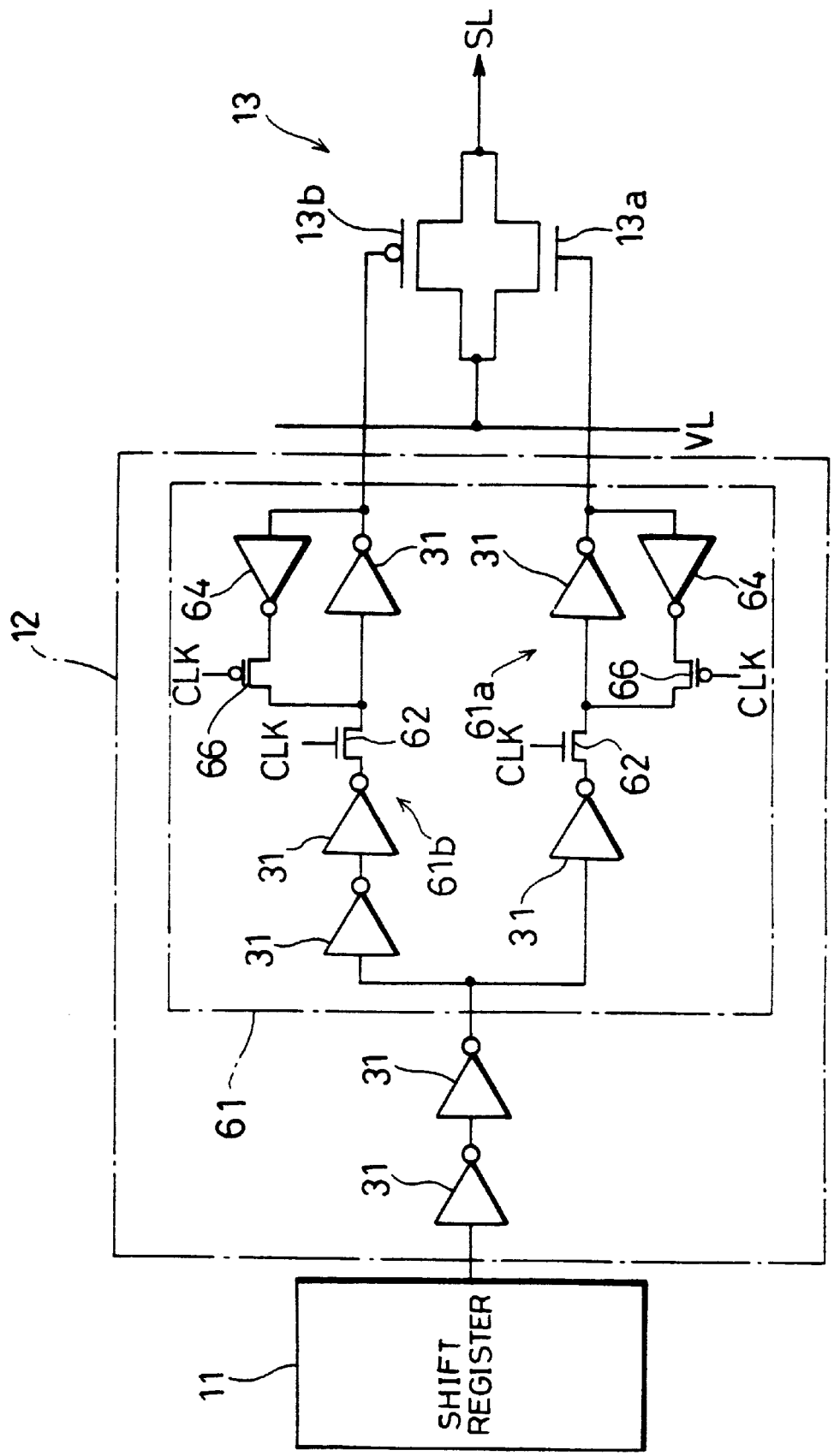
FIG. 22 is a circuit diagram showing a construction that is obtained by replacing the transfer switch of an n-channel transistor with a transfer switch of a p-channel transistor in the latch circuit of the sampling circuit of FIG. 21.

In addition, as shown in FIG. 22, in the same circuit construction as the sampling circuit shown in FIG. 21, the transfer switches 65 may be replaced by transfer switches 66 consisting of p-channel transistors 66. In this sampling circuit, the transfer switches 66 are driven by the same synchronous signal (timing signal) CLK as the transfer switches 62. This arrangement makes it possible to achieve stable operation even by the use of a single synchronous signal.

Figure 23:
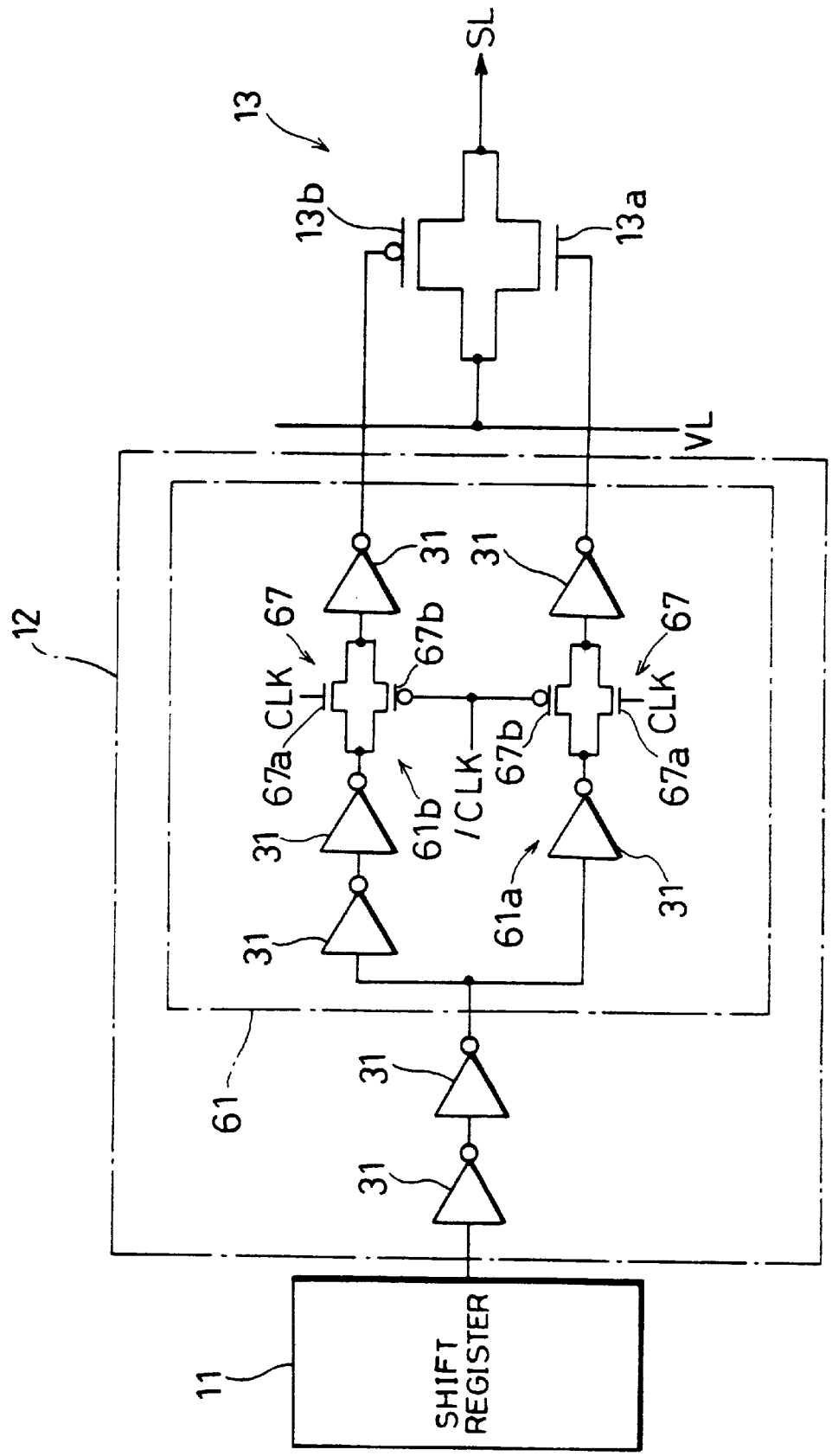
FIG. 23 is a circuit diagram showing a sampling circuit in accordance with the fourth modified example of the second sampling circuit.

Moreover, FIG. 23 shows a sampling circuit related to the fourth modified example of the second sampling circuit. This sampling circuit has an arrangement wherein in each of the first and second paths 61a and 61b of the sampling circuit of FIG. 18, the transfer switch 62 is replaced by a transfer switch 67. The transfer switch 67 has a CMOS construction wherein an n-channel transistor 67a and a p-channel type transistor 67b are connected in parallel with each other.

In this transfer switch 67, the synchronous signal CLK is inputted to the gate electrode of the n-channel transistor 67a, and the synchronous signal/CLK whose phase is reversed to that of the synchronous signal CLK is inputted to the gate electrode of the p-channel transistor 67*b*. Because of the CMOS construction of the transfer switches, this sampling circuit ensures transferring operation for sampling signals, and makes it possible to reduce an expansion of the difference between the transfer speeds of the sampling signals at the high-voltage side and the low-voltage side.

Additionally, the sampling circuit of this modified example may be applied to the sampling circuits shown in FIGS. 19 through 22.

THIRD SAMPLING CIRCUIT

Figure 24:
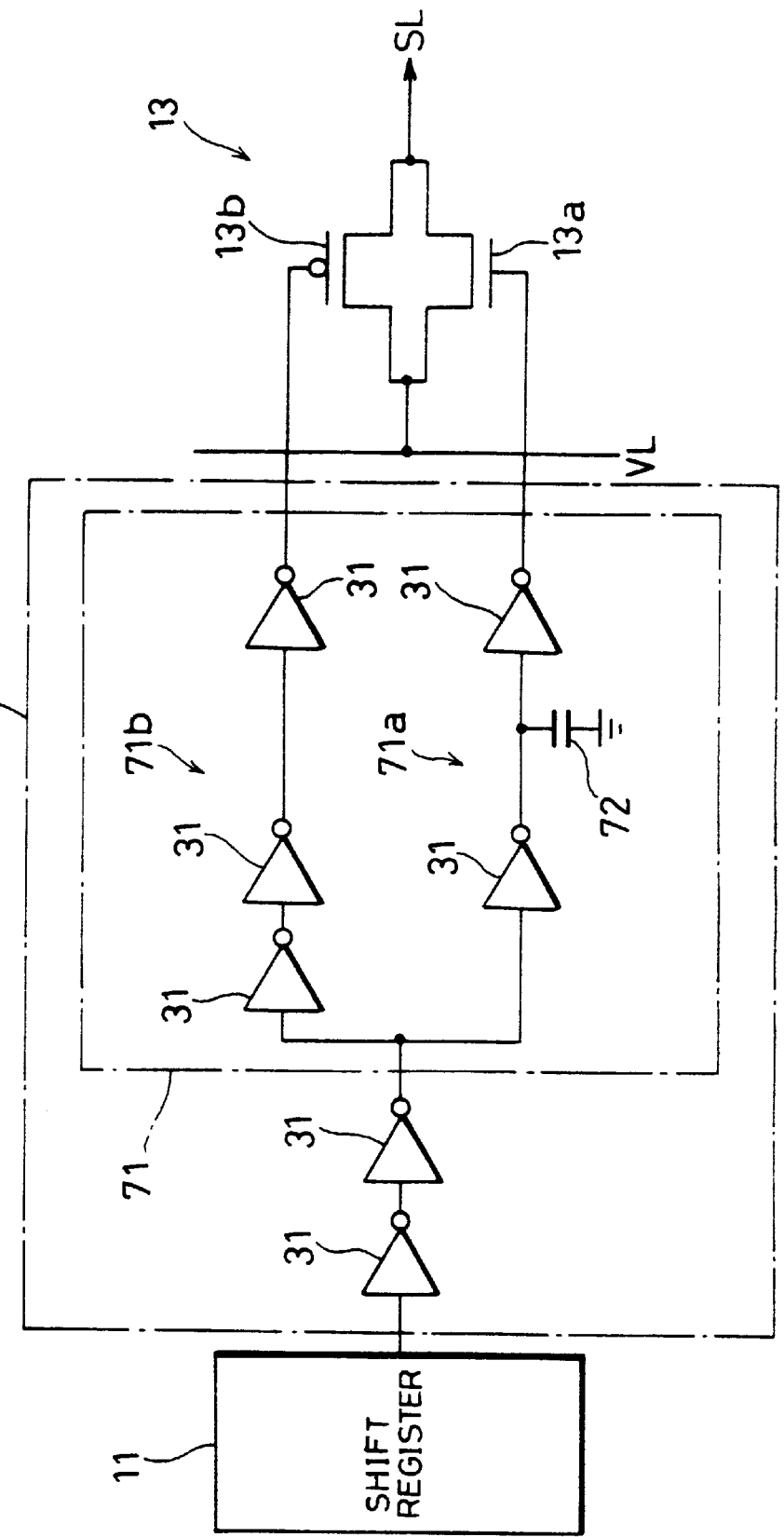
FIG. 24 is a circuit diagram showing a construction of the third sampling circuit in the second embodiment of the present invention.

As shown in FIG. 24, the third sampling circuit is provided with a branch circuit 71 having the first path 71*a* and the second path 71*b* that is installed in an amplification circuit 12. The first path 71*a* has two stages of inverters 31 and the second path 71*b* has three stages of inverters 31. Further, in the second path 71*b*, a capacitor 72 having an appropriate capacity is installed between the output of the inverter 31 at the first stage and ground.

In the third sampling circuit having the above-mentioned arrangement, the capacitor 72 having an appropriate capacity is inserted right after the inverter 31 at the first stage in the first path 71*a*; this increases the load of the inverter 31, thereby resulting in a signal delay. As a result, signal switchovers in the first and second paths 71*a* and 71*b* are operated at the same time in the following stage of the inverter 31. Therefore, noises in the sampling transistors 13*a* and 13*b* are cancelled at the time of cutoff, thereby making it possible to write analog signal to the data signal line SL with high accuracy.

Additionally, the insertion of such a capacitor functioning as a load is not intended to be limited to one location: such capacitors may be inserted at a plurality of locations.

FOURTH SAMPLING CIRCUIT

Figure 25:
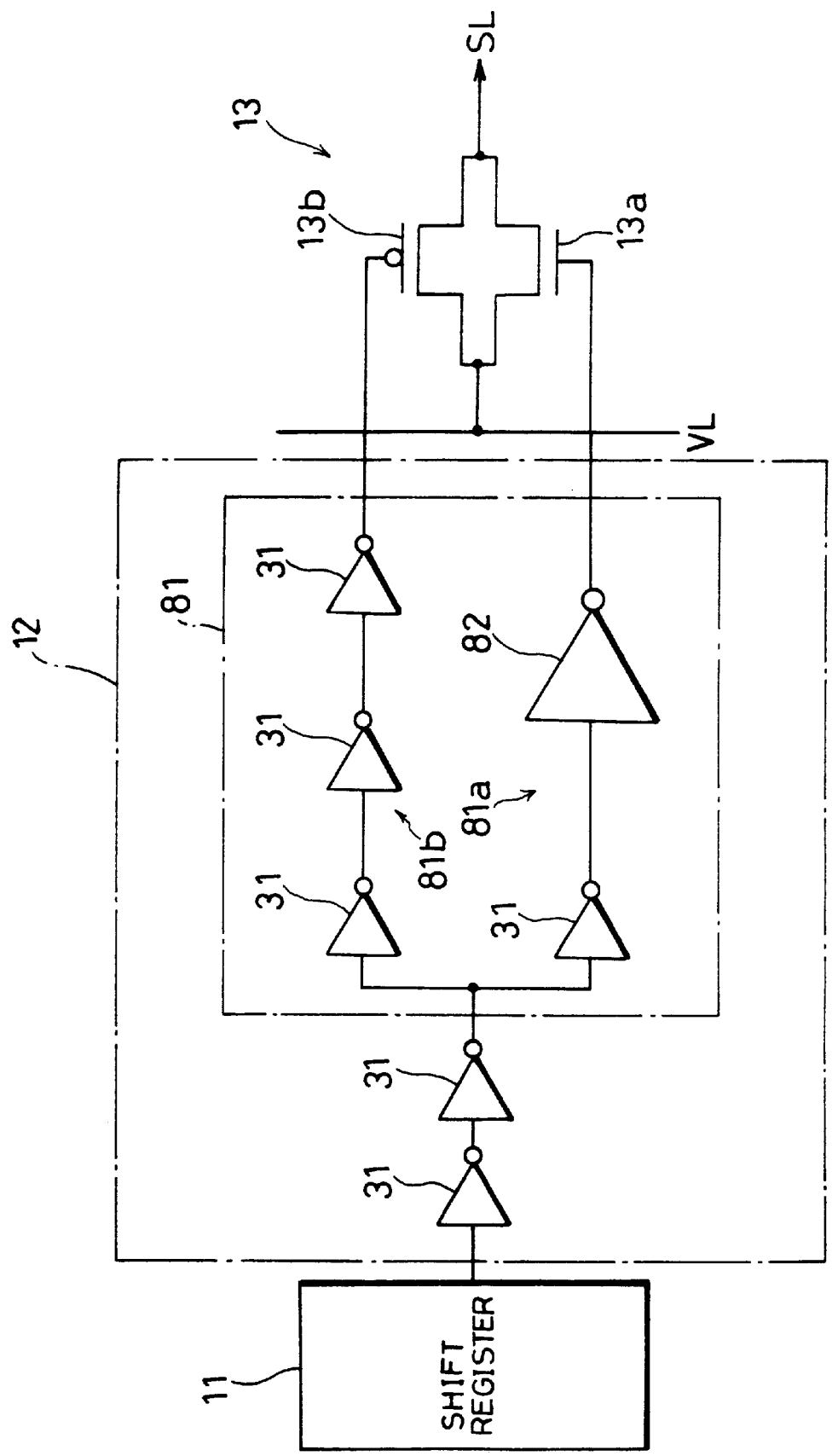
FIG. 25 is a circuit diagram showing a construction of the fourth sampling circuit in the second embodiment of the present invention.

As shown in FIG. 25, the fourth sampling circuit is provided with a branch circuit 81 having the first path 81*a* and the second path 81*b* that is installed in an amplification circuit 12. The first path 81*a* has inverters 31 and 82, and the second path 81*b* has three stages of inverters 31. The inverter 82 has an input capacity greater than that of the inverter 31 at the output stage in the second path 81*b*. More specifically, the transistors constituting the inverter 82 are greater than those constituting the inverter 31 at the output stage both in their channel lengths and channel widths.

In the fourth sampling circuit, the transistors constituting the inverter 82 have a greater input capacity, while keeping their driving performance as an inverter, as it is. For this reason, the load of the inverter 31 at the preceding stage becomes greater, thereby resulting in a signal delay. As a result, signal switchovers in the first and second signal paths 81*a* and 81*b* are operated at the same time in the following stage of the inverter 82. Therefore, noises in the sampling transistors 13*a* and 13*b* are cancelled at the time of cutoff, thereby making it possible to write analog signal to the data signal line SL with high accuracy.

Additionally, one inverter 82 is installed in the above-mentioned sampling circuit; however, the present invention is not intended to be limited to this arrangement. A plurality of the inverters 82 may be installed in the first path 81*a* in order to distribute loads.

FIFTH SAMPLING CIRCUIT

Figure 26:
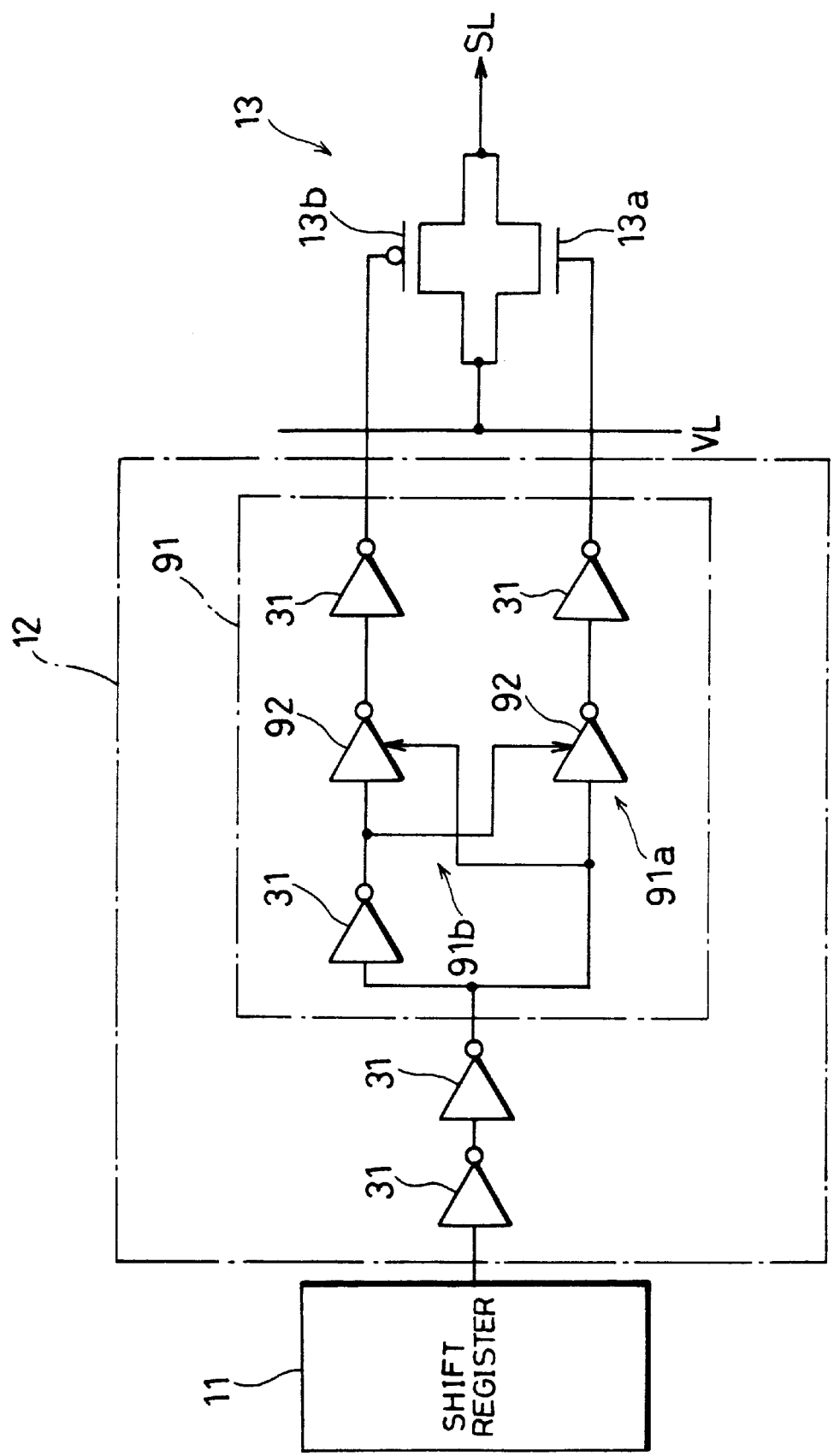
FIG. 26 is a circuit diagram showing a construction of the fifth sampling circuit in the second embodiment of the present invention.

As shown in FIG. 26, the fifth sampling circuit is provided with a branch circuit 91 having the first path 91*a* and the second path 91*b* that is installed in an amplification circuit 12. The first path 91*a* has an operation-control type inverter 92 and an inverter 31 that are aligned in this order, and the second path 91*b* has an inverter 31, an operation-control type inverter 92 and an inverter 31 that are aligned in this order. To the operation-control type inverters 92, are inputted timing signals through the input stages thereof as control signals in a replacing manner with each other.

Figure 27:
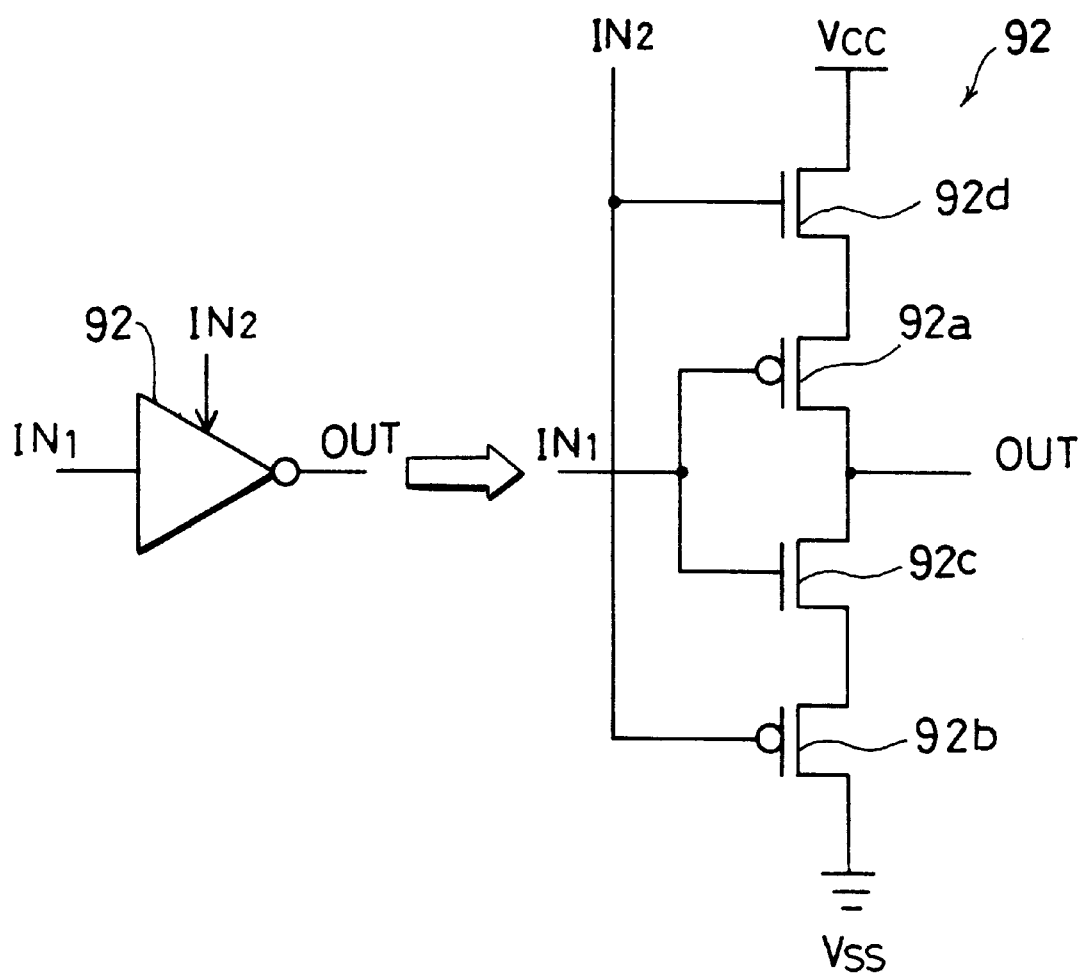
FIG. 27 is a circuit diagram showing a construction of an operation-control-type inverter in the fifth sampling circuit.

As shown in FIG. 27, each of the operation-control type inverters 92 is provided with two p-channel transistors 92*a* and 92*b* and two n-channel transistors 92*c* and 92*d*. The p-channel transistor 92*a* and the n-channel transistor 92*c*, which provide an inverting function, are connected in series with each other. To the gates of the transistors 92*a* and 92*c*, are inputted through the input terminal $IN_1$ timing signals that pass through the operation-control type inverters 92 and 92 in the respective paths.

Further, the n-channel transistor 92*d* is installed between the p-channel transistor 92*a* and the power source terminal on the high-potential side, and the p-channel transistor 92*b* is installed between the n-channel transistor 92*c* and the power source terminal on the low-potential side. To the gates of the p-channel transistor 92*b* and the n-channel transistor 92*d*, are inputted through the input terminal $IN_2$ timing signals that pass through the operation-control type inverters 92 and 92 located in the respectively different paths.

Here, the pair of the p- and n-transistors 92*a* and 92*d* and the pair of the p- and n-transistors 92*b* and 92*c* may be changed in their places respectively.

In the fifth sampling circuit, the operation-control type inverters 92 operate as inverters with respect to the input terminal $IN_1$ only when the signals passing through the two paths 91*a* and 91*b* have phases reversed to each other. In the other periods, they come into a high-impedance state. As a result, signal switchovers in the two signal paths occur at the same time in the following stages in the first and second paths 91*a* and 91*b*. Therefore, noises in the sampling transistors 13*a* and 13*b* are cancelled at the time of cutoff, thereby making it possible to write analog signal to the data signal line SL with high accuracy.

Additionally, although it is only for a moment when the signal switchovers are made so that the outputs of the operation-control type inverters 92 are kept at the high-impedance state, no input is made to the inverters 31 at the following stages during that moment. This results in a possibility of unstable operation. In the same manner as the first sampling circuit, the present sampling circuit provides the following modified examples of the sampling circuit in order to solve the above-mentioned problem.

Figure 28:
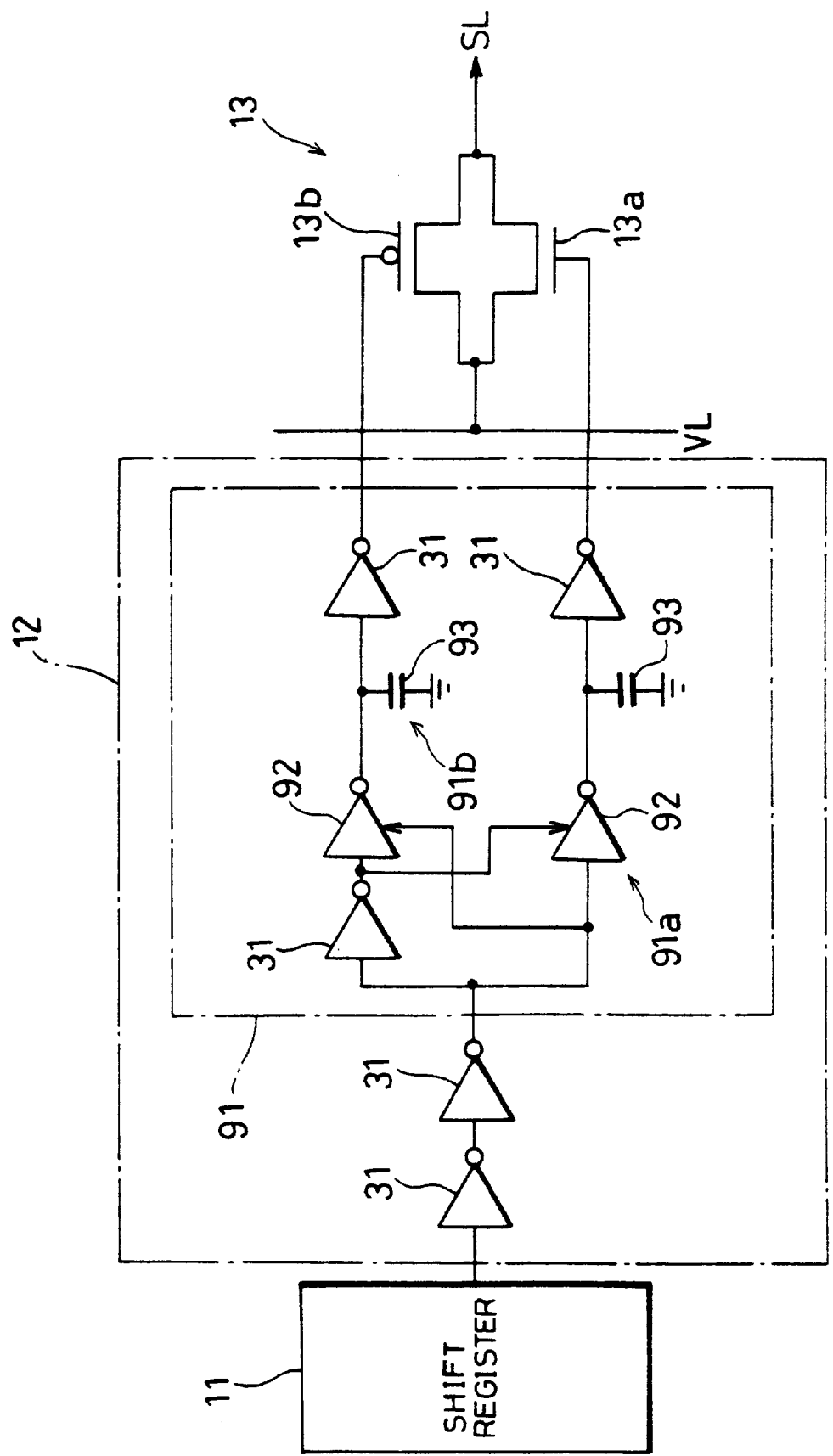
FIG. 28 is a circuit diagram showing a sampling circuit in accordance with the first modified example of the fifth sampling circuit.

As shown in FIG. 28, in a sampling circuit in accordance with the first modified example of the fifth sampling circuit, capacitors 93 are installed right after the operation-control type inverters 92. With this arrangement, the output signals of the operation-control type inverters 92 can be held, although it is a short period of time, thereby making it possible to stabilize the operation.

Figure 29:
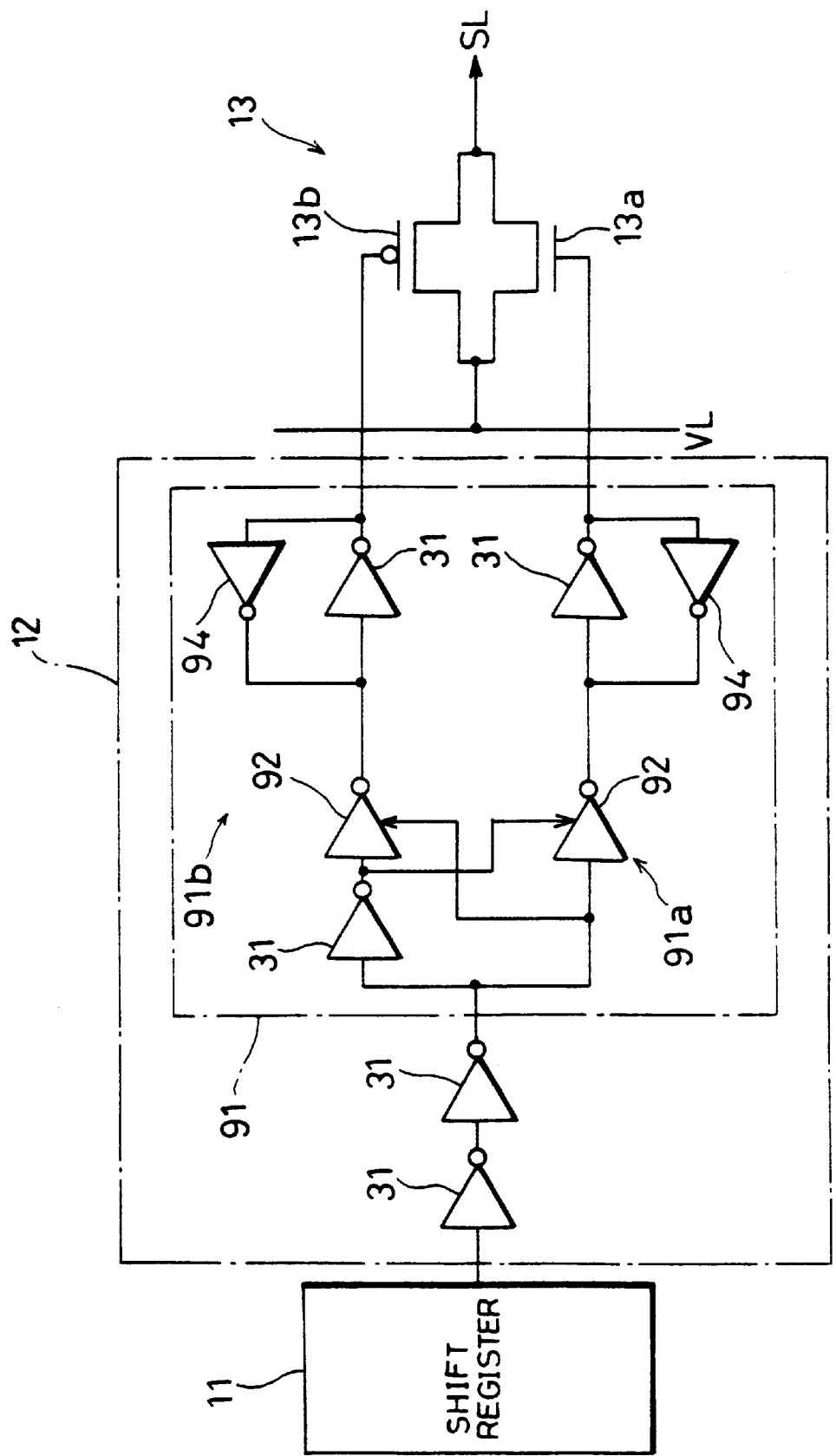
FIG. 29 is a circuit diagram showing a sampling circuit in accordance with the second modified example of the fifth sampling circuit.

Further, as shown in FIG. 29, in a sampling circuit in accordance with the second modified example of the fifth embodiment, inverters 94 are connected in parallel and in the reversed direction with the inverters 31 that are located right after the operation-control type inverters 92. In this sampling circuit, the inverters 31 and 94 form a latch circuit; this makes it possible to stabilize the operation. In this case, it is necessary to minimize the driving power of the inverters 94 in order not to affect the operation of the operation-control type inverters 92.

SIXTH SAMPLING CIRCUIT

Figure 30:
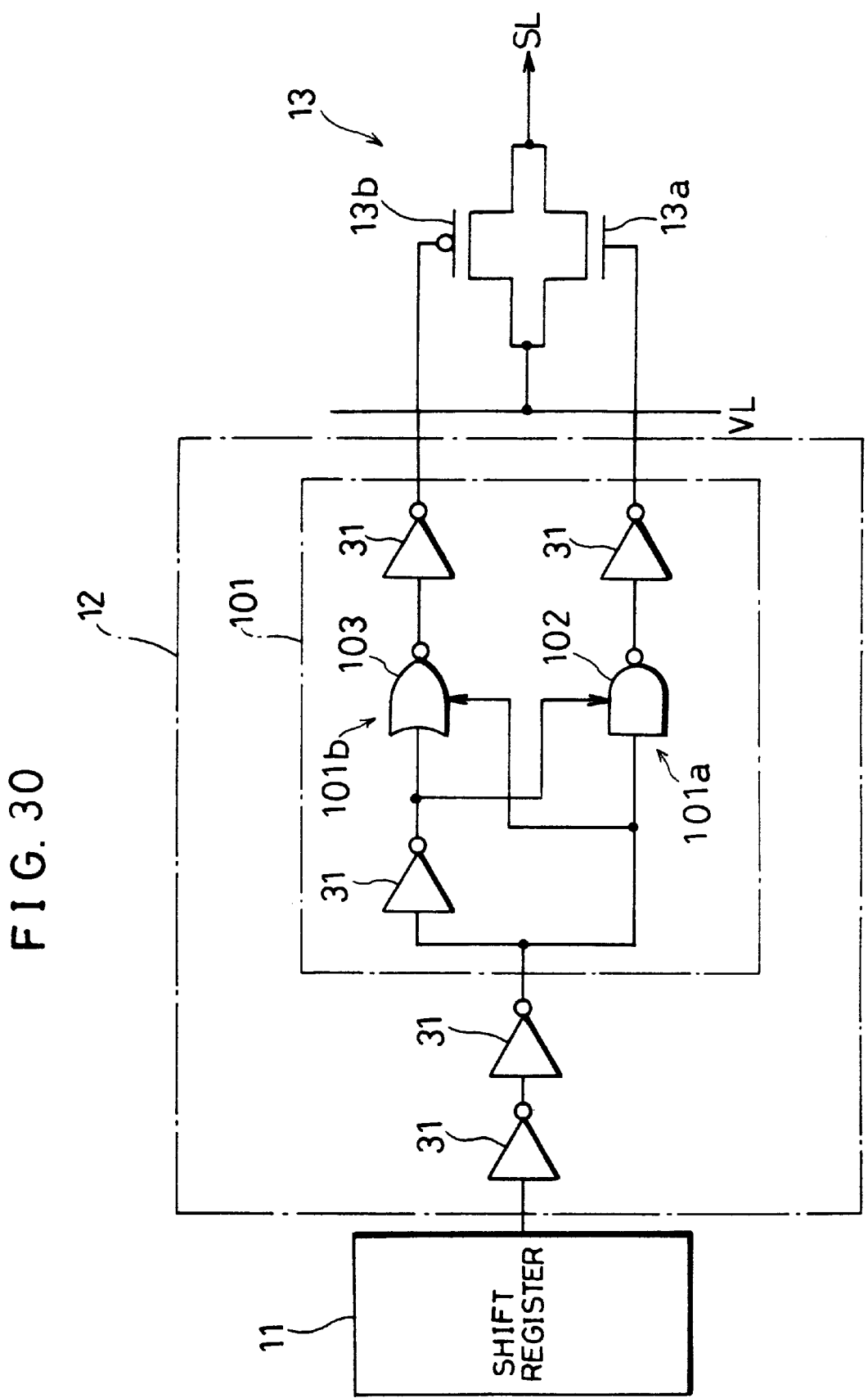
FIG. 30 is a circuit diagram showing a construction of the sixth sampling circuit in the second embodiment of the present invention.

As shown in FIG. 30, the sixth sampling circuit is provided with a branch circuit 101 having the first path 101a and the second path 101b that is installed in an amplification circuit 12. The first path 101a has an operation-control type inverter 102 and an inverter 31 that are aligned in this order, and the second path 101b has an inverter 31, an operation-control type inverter 103 and an inverter 31 that are aligned in this order. To the operation-control type inverters 102 and the operation-control type inverters 103, are inputted timing signals through the respective input stages thereof as control signals in a replacing manner with each other.

Figure 31:
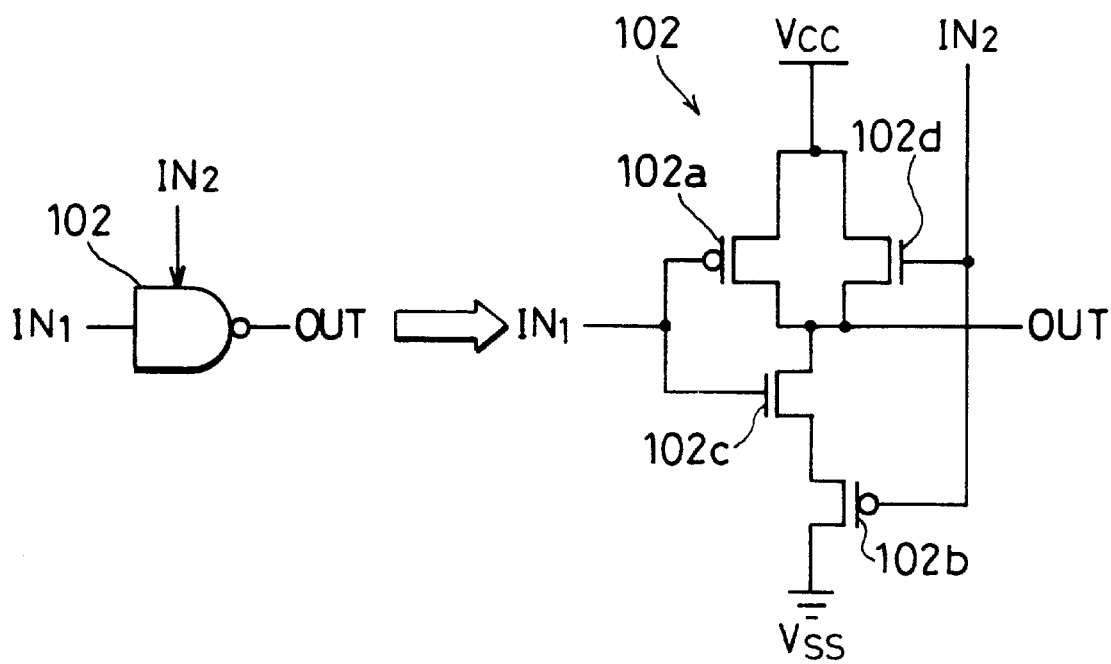
FIG. 31 is a circuit diagram showing a construction of an operation-control-type inverter in the sixth sampling circuit.

As shown in FIG. 31, the operation-control type inverters 102 is provided with two p-channel transistors 102a and 102b and two n-channel transistors 102c and 102d. The p-channel transistor 102a and the n-channel transistor 102c, which provide an inverting function, are connected in series with each other, and are installed on the power-source terminal (voltage $V_{cc}$) side on the high-potential side. Further, the p-channel transistor 102b is installed between the n-channel transistor 102c providing an inverting function, connected in series with the p-channel transistor 102a, and the power-source terminal (voltage $V_{ss}$) on the low-potential side.

To the gates of the p- and n-channel transistors 102a and 102c, are inputted through the input terminal $IN_1$ timing signals that pass through the first path 101a. To the gates of the p- and n-channel transistors 102b and 102d, are inputted through the input terminal $IN_2$ timing signals that pass through the second path 101b.

Here, the pair of the p- and n-transistors 102b and 102c may be changed in their places respectively.

Figure 32:
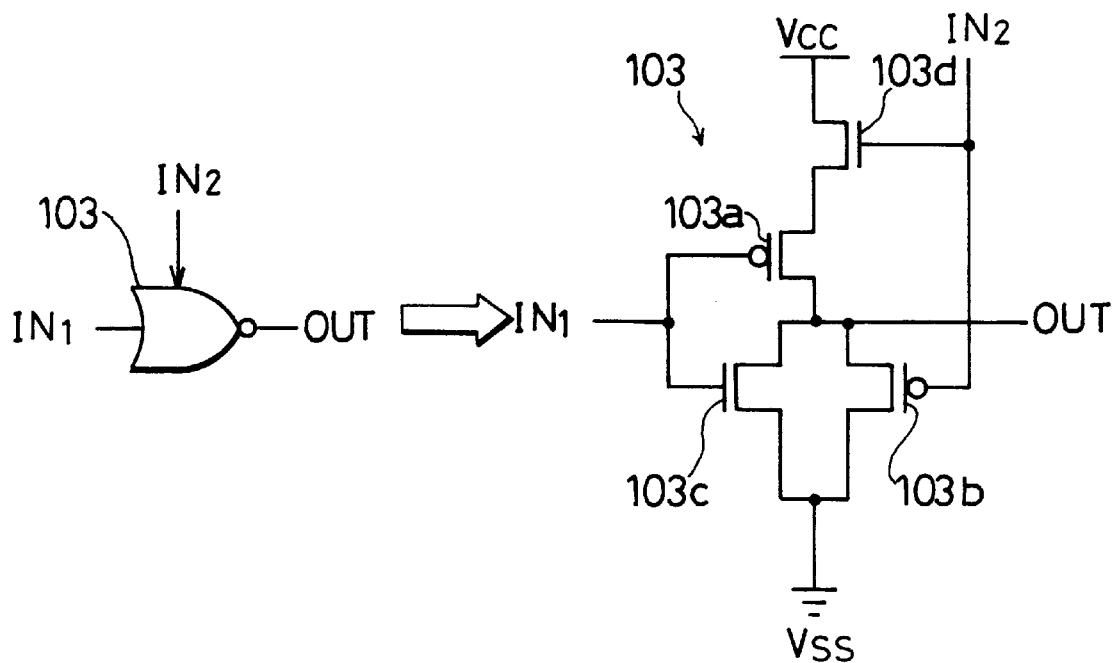
FIG. 32 is a circuit diagram showing a construction of another operation-control-type inverter in the sixth sampling circuit.

As shown in FIG. 32, the operation-control type inverters 103 is provided with two p-channel transistors 103a and 103b and two n-channel transistors 103c and 103d. The n-channel transistor 103d is installed between the p-channel transistor 103a providing an inverting function and the high-potential power-source terminal. Further, the n-channel transistor 103c, which is series connected to the p-channel transistor 103a and provides an inverting function, is connected in parallel with the p-channel transistor 103b, and these transistors are installed on the low-potential power-source terminal side.

To the gates of the p- and n-channel transistors 103a and 103c, are inputted through the input terminal $IN_1$ timing signals that pass through the second path 101b. To the gates of the p- and n-channel transistors 103b and 103d, are inputted through the input terminal $IN_2$ timing signals that pass through the first path 101a.

Here, the pair of the p- and n-transistors 103a and 103d may be changed in their places respectively.

In the sixth sampling circuit, the operation-control type inverter 102 releases a signal with low potential only when a signal with high potential is applied to the input terminal $IN_1$ and a signal with low potential is applied to the input terminal $IN_2$. It releases a signal with high potential upon receipt of the other inputs. In contrast, the operation-control type inverter 103 releases a signal with high potential only when a signal with low potential is applied to the input terminal $IN_1$ and a signal with high potential is applied to the input terminal $IN_2$. It releases a signal with low potential upon receipt of the other inputs.

Therefore, the two operation-control type inverters 102 and 103 function as inverters only upon receipt of signals that allow conduction of both the transistors 13a and 13b, and always release signals that cutoff both the transistors 13a and 13b during the other periods. As a result, signal switchovers in the first and second signal paths 101a and 101b in the following stages of the operation-control type inverters 102 and 103 occur at the same time. Thus, noises in the sampling transistors 13a and 13b are cancelled at the time of cutoff, thereby making it possible to write analog signal to the data signal line SL with high accuracy.

At this time, since the outputs of the operation-control type inverters 102 and 103 are not brought into a high-impedance state, it is possible to stabilize the operation of the sampling circuit.

When the above-mentioned first through sixth sampling circuits are applied to thin-film transistors formed on a substrate which has at least an insulating surface, such as multi-crystal silicon thin-film transistors, its effectiveness in construction is further demonstrated. The reason is that since the driving performance of these transistors is comparatively smaller than that of transistors on a mono-crystal substrate, the transistors constituting the sampling switch need to be large in their size (in channel width). This causes a greater delay for each stage of the inverters in the sampling circuit, resulting in a high possibility of noise due to parasitic capacity of the transistors.

Additionally, the arrangements of the above-mentioned first through sixth sampling circuits may be applied to the first through sixth sampling circuits of the first embodiment; this makes it possible to make switchovers in the signals of the first and second paths coincident with each other.

APPLICATION OF THE SAMPLING CIRCUITS TO LIQUID CRYSTAL DISPLAYS

As was described in the first embodiment, in an active-matrix-type liquid crystal display using the point-sequential driving method shown in FIG. 3, the writing period in which the video signal is written to the data signal line SL is very short. In contrast, the holding time in the data signal line SL needs to be not less than several tens of microseconds. Further, in a liquid crystal display, such as shown in FIG. 1, the liquid crystal needs to be driven while inverting its phase in order to prevent deterioration of the liquid crystal; consequently, the video signal needs to have a greater amplitude. In order to write such great signals at high speeds, it is necessary to use a sampling switch 13 having a great driving power: in other words, the sampling switch 13 has to be constituted of transistors having great channel widths. In this case, as was described earlier, there is a possibility that comparatively large noise is superimposed on the writing signal due to parasitic capacity of the transistors.

Therefore, the application of the first through sixth sampling circuits to the liquid crystal display of the point-sequential method makes it possible to suppress the generation of noise.

Similarly, in an active-matrix-type liquid crystal display using the line-sequential driving method shown in FIG. 6, the writing period in which the video signal is written to the sampling capacity 16 is very short, while the holding time in the sampling capacity 16 needs to be not less than several tens of micro seconds. In the line-sequential driving method, the writing operation is easily carried out since its load capacity is small, compared to the point-sequential driving method. However, with the trend of large screens and high precision in image displays, the sampling capacity 16 also tends to become large, thereby resulting in the same problems as the point-sequential driving method.

Therefore, the application of the first through sixth sampling circuits to the liquid crystal display using the line-sequential driving method makes it possible to provide the same effects that are obtained in the point-sequential driving method.

As described above, the application of the first through sixth sampling circuits of the present embodiment to liquid crystal displays makes it possible to suppress the generation of noise due to parasitic capacity of transistors when the video signal is written to the data signal line SL or the sampling capacity 16; therefore, the writing operation of video signal is carried out with high precision and it is possible to display high-quality images with multi-gradation.

In particular, in liquid crystal displays having a newly developed monolithic construction, that is, a construction wherein pixel arrays and driving circuits are integrally formed on the same substrate, the arrangements of the present embodiment are more effectively applied, since thin-film transistors having inferior characteristics are used as the elements of the driving circuits.

In the above-mentioned embodiments, the descriptions have been given mainly on the application to liquid crystal displays of the active-matrix type; however, the present invention is not intended to be limited to this application, and can be applied to other display apparatuses, in the same manner as the sampling circuits of the first embodiment.

(EMBODIMENT 3)

Referring to FIGS. 1, 6, as well as FIGS. 33 through 39, the following description will discuss the third embodiment of the present invention. Here, in the present embodiment, those members that have the same functions and that are described in the first embodiment are indicated by the same reference numerals and the description thereof is omitted.

FIRST SIGNAL AMPLIFIER

Figure 33:
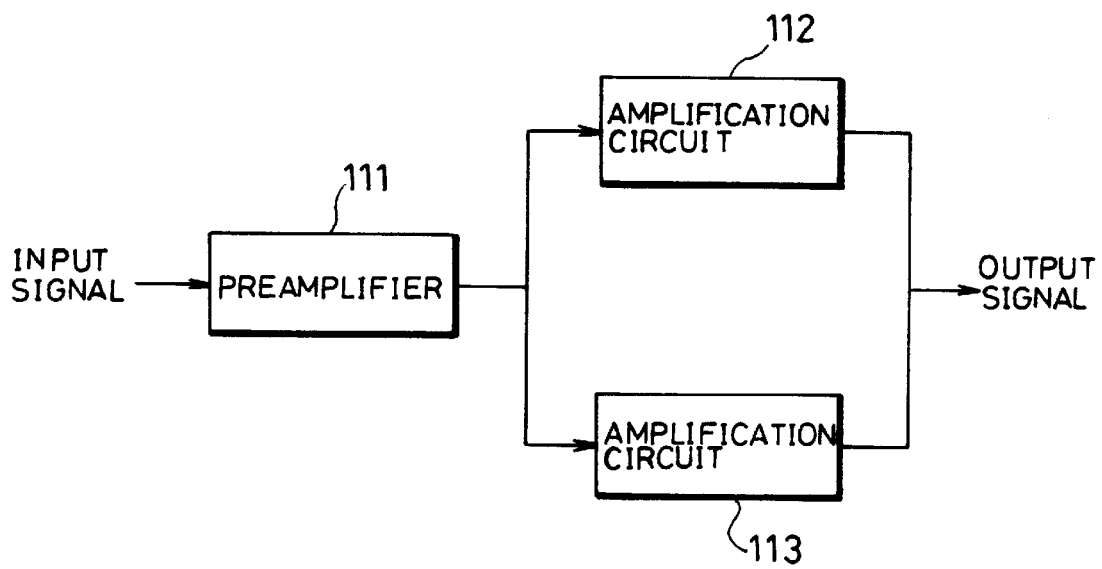
FIG. 33 is a block diagram showing a construction of the first signal amplifier in the third embodiment of the present invention.

As shown in FIG. 33, the first signal amplifier is provided with a preamplifier 111 for linearly amplifying an input signal and amplification circuits 112 and 113 which are connected in parallel with each other and which linearly amplify the output from the preamplifier 111.

In the amplification circuit 112, the slue rate (response rate) with respect to a level change that causes an increase in the level of the output from the preamplifier 111 is set to be greater than the slue rate in the amplification circuit 113. In the amplification circuit 113, the slue rate with respect to a level change that causes a decrease in the level of the output from the preamplifier 111 is set to be greater than the slue rate in the amplification circuit 112.

In the above-mentioned arrangement, the preamplifier 111 linearly amplifies the input signal to a predetermined level. The output from the preamplifier 111 is linearly amplified by the amplification circuits 112 and 113. Thus, the signal amplifier releases a sum of the output of the amplification circuit 112 and the output of the amplification circuit 113 as an output signal.

When there is a level change that causes an increase in the level of the output from the preamplifier 111, that is, when there is a level change that increases the level of the input signal, the amplification circuit 112 responds the level change at high speeds, and releases a corresponding output signal. When there is a level change that causes a decrease in the level of the output from the preamplifier 111, that is, when there is a level change that decreases the level of the input signal, the amplification circuit 113 responds the level change at high speeds, and releases a corresponding output signal. In other words, the first signal amplifier provides an output that is obtained by responding to the input signal at high speeds irrespective of level changes in the input signal.

In this case, the slue rate of the amplification circuit 112 with respect to a level change that causes a decrease in the level of the input signal and the slue rate of the amplification circuit 113 with respect to a level change that cause an increase in the level of the input signal hardly affect the slue rate of the first signal amplifier of the present embodiment from the point of view of principle. For this reason, as for the amplification circuit 112, it is possible to reduce the slue rate with respect to the level change that causes a decrease in the level of the input signal. As for the amplification circuit 113, it is possible to reduce the slue rate with respect to the level change that causes an increase in the level of the input signal.

Therefore, the application of the amplification circuits 112 and 113 whose stationary currents are reduced by minimizing the slue rates makes it possible to achieve a signal amplifier having high response speeds with small power consumption.

Figure 34:
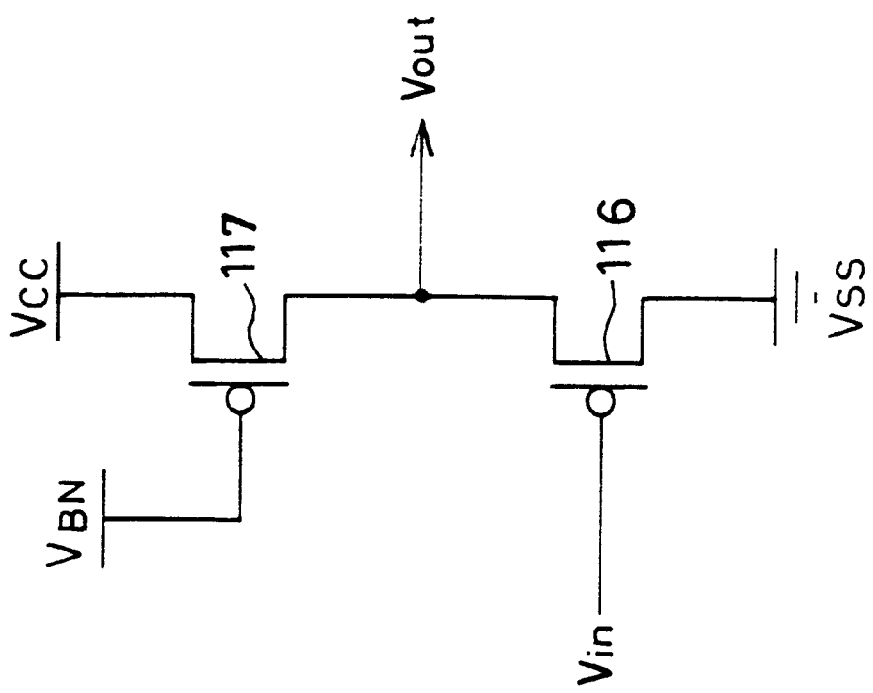
FIG. 34($a$) is a circuit diagram showing a construction of a cascode-type linear circuit that is preferably applied to one of the amplifiers in the first signal amplifier as well as in the second signal amplifier in the third embodiment of the present invention.
Figure 34:
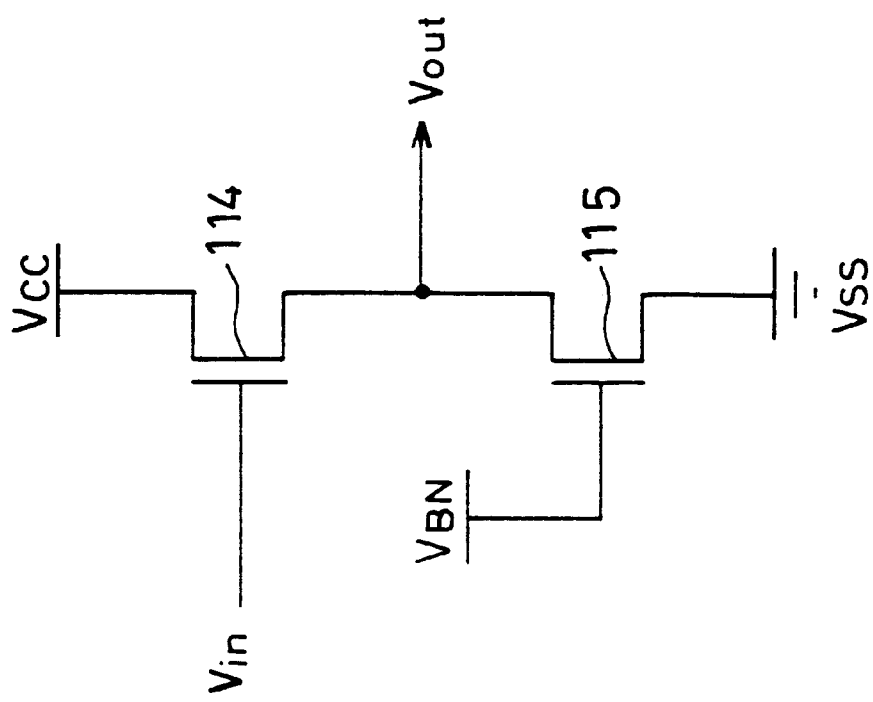
Figure 35:
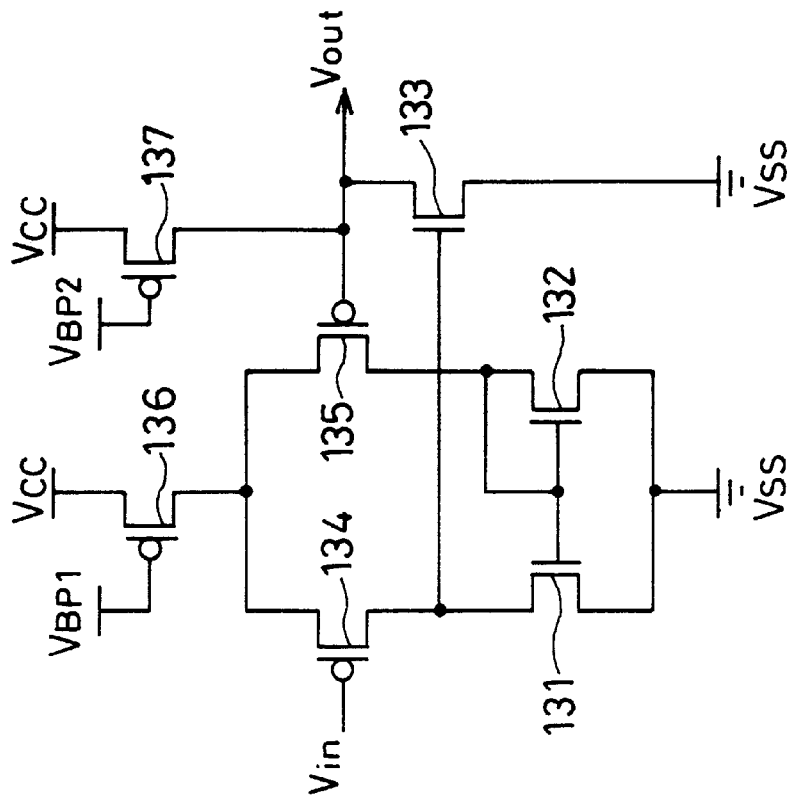
FIG. 35($a$) is a circuit diagram showing a construction of another operational-amplifier-type linear circuit that is preferably applied to one of the amplifiers in the first signal amplifier.
Figure 35:
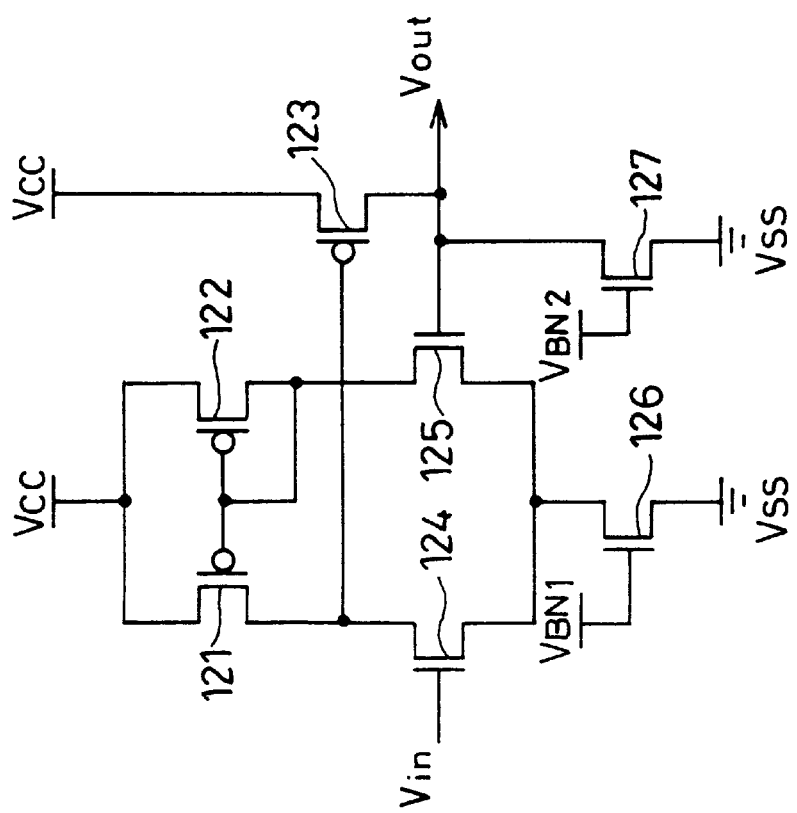

Specific examples of the amplification circuits 112 and 113 are shown in FIGS. 34(*a*) and 34(*b*).

FIG. 34(*a*) shows a cascode-type linear circuit wherein n-channel transistors 114 and 115 are connected in series with each other between the high-potential power supply ($V_{CC}$) and the low-potential power supply ($V_{SS}$). In the n-channel transistor 114 on the high-potential power supply side, an input voltage $V_{in}$ is applied to its gate electrode, and in the n-channel transistor 115 on the low-potential power supply side, a bias voltage $V_{BN}$ is applied to its gate electrode so that it is operated within the saturated area. Further, the output signal $V_{out}$ is outputted from the junction between the n-channel transistors 114 and 115.

With this arrangement, the feature of the linear circuit constituted by the n-channel transistors is that the slue rate becomes greater upon receipt of a change in the signal level toward the high-potential side, while the slue rate becomes smaller upon receipt of a change in the signal level toward the low-potential side. Therefore, this linear circuit is suitable for the amplification circuit 112.

FIG. 34(*b*) shows a cascode-type linear circuit wherein two p-channel transistors 116 and 117 are connected in series with each other between the low-potential power supply ($V_{SS}$) and the high-potential power supply ($V_{CC}$). In the p-channel transistor 116 on the low-potential power supply side, an input voltage $V_{in}$ is applied to its gate electrode, and in the p-channel transistor 117 on the high-potential power supply side, a bias voltage $V_{BN}$ is applied to its gate electrode so that it is operated within the saturated area. Further, the output signal $V_{out}$ is outputted from the junction between the p-channel transistors 116 and 117.

With this arrangement, the feature of the linear circuit constituted by the p-channel transistors is that the slue rate becomes greater upon receipt of a change in the signal level toward the low-potential side, while the slue rate becomes smaller upon receipt of a change in the signal level toward the high-potential side. Therefore, this linear circuit is suitable for the amplification circuit 113.

In both of these circuits, the output signal has a linear relationship with the input signal, but it has a constant offset. The amount of the offset coincides with the potential difference between the gate electrode and sour-e electrode of the transistor 115 or 117 that functions as a constant current supply.

Therefore, in the circuit of FIG. 34(a), the output voltage $V_{out}$ is given as follows:

$$V_{out}=V_{in}-(V_{BN}-V_{CC}).$$

In the circuit of FIG. 34(b), the output voltage $V_{out}$ is given as follows:

$$V_{out}=V_{in}-(V_{BP}-V_{SS}).$$

Other specific examples of the amplification circuits 112 and 113 are shown in FIGS. 35(a) and 35(b) respectively.

FIG. 35(a) shows an arrangement wherein p-channel transistors 121 through 123 and n-channel transistors 124 through 127 are installed. In this circuit, a differential amplifier, which is constituted of the p-channel transistors 121 and 122 and the n-channel transistors 124 through 126, is disposed at the preceding stage and a source-follower circuit constituted of the p-channel transistor 123 and the n-channel transistor 127 is disposed at the following stage.

In the above-mentioned circuit, an input voltage $V_{in}$ is applied to the gate electrode of the n-channel transistor 124, and the junction between the p-channel transistor 121 and the n-channel transistor 124 is connected to the gate electrode of the p-channel transistor 123. Further, the junction between the p-channel transistor 123 and the n-channel transistor 127 is connected to the gate electrode of the n-channel transistor 125 from which the output voltage $V_{out}$ is outputted.

In the above-mentioned linear circuit, the slue rate becomes greater upon receipt of a change in the signal level toward the high-potential side, while it becomes smaller upon receipt of a change in the signal level toward the low-potential side; thus, this circuit is suitable for the amplification circuit 112.

FIG. 35(b) shows an arrangement wherein n-channel transistors 131 through 133 and p-channel transistors 134 through 137 are installed. In this circuit, a differential amplifier, which is constituted of the n-channel transistors 131 and 132 and the p-channel transistors 134 through 136, is disposed at the preceding stage and a source-follower circuit constituted of the n-channel transistor 133 and the p-channel transistor 137 is disposed at the following stage. This circuit has a modified arrangement of transistors of the circuit shown in FIG. 35(a), and operates in the same manner.

In the above-mentioned linear circuit, the slue rate becomes greater upon receipt of a change in the signal level toward the low-potential side, while it becomes smaller upon receipt of a change in the signal level toward the high-potential side; thus, this circuit is suitable for the amplification circuit 113.

In both of these circuits also, the output signal has a linear relationship with the input signal, and the amount of the offset coincides with the potential difference between the gate electrode and source electrode of the transistor 127 or 137 that functions as a constant current supply.

Therefore, in the circuit of FIG. 35(a), the output voltage $V_{out}$ is given as follows:

$$V_{out}=V_{in}-(V_{BN2}-V_{CC}).$$

In the circuit of FIG. 35(b), the output voltage $V_{out}$ is given as follows:

$$V_{out}=V_{in}-(V_{BP2}-V_{SS}).$$

Here, $V_{BN2}$ and $V_{BP2}$ represent bias voltages that are respectively applied to the gate electrodes of the transistors 127 and 137.

Additionally, any circuits may be adopted as the amplification circuits 112 and 113, as long as they have the above-mentioned characteristics. Further, the amplification circuits 112 and 113 are not necessarily formed by individual linear circuits respectively. They may be formed by combining a plurality of linear circuits.

SECOND SIGNAL AMPLIFIER

Figure 36:
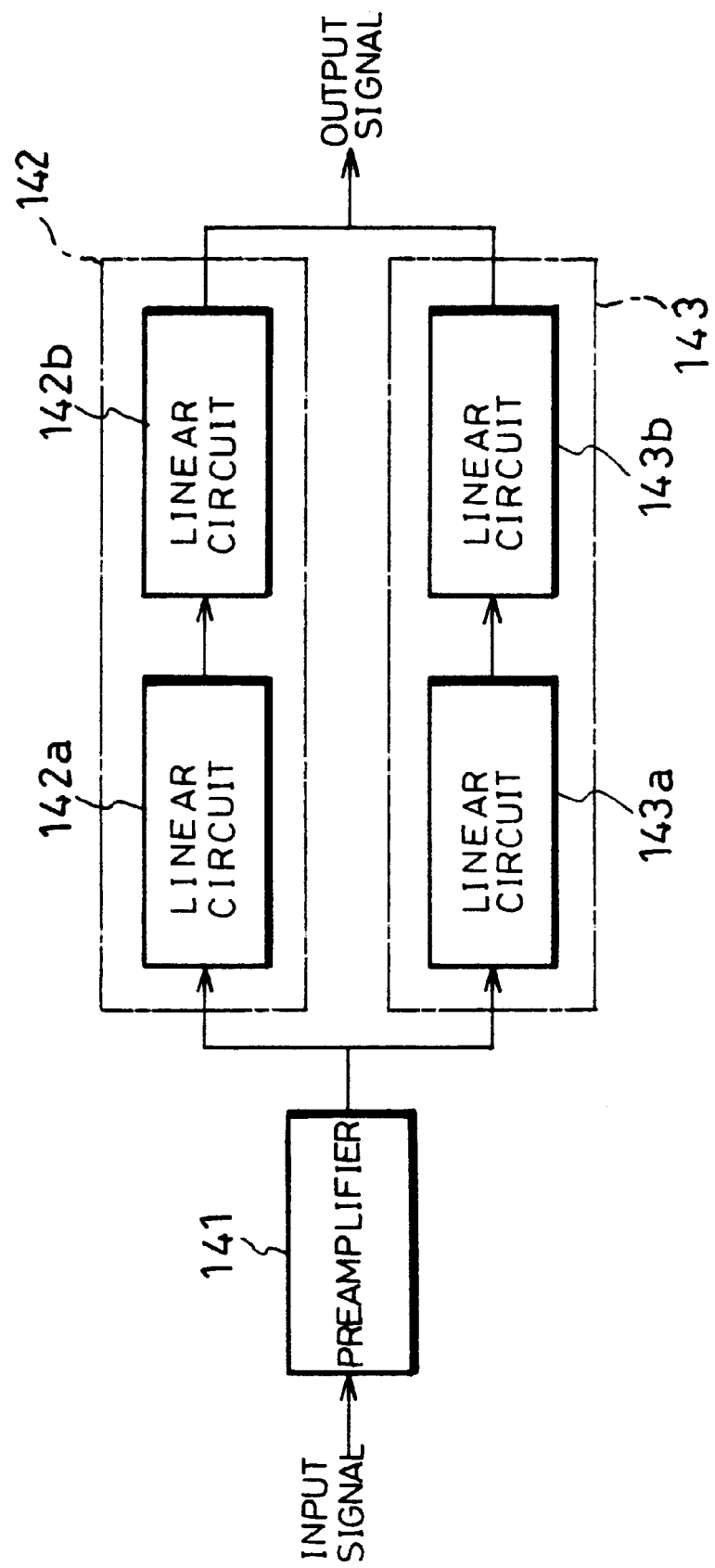
FIG. 36 is a block diagram showing a construction of the second signal amplifier in the third embodiment of the present invention.

As shown in FIG. 36, the second signal amplifier is provided with a preamplifier 141 for linearly amplifying an input signal and amplification circuits 142 and 143 which are connected in parallel with each other and which linearly amplify the output from the preamplifier 141. The amplification circuit 142 is constituted of linear circuits 142a and 142b that are connected in series with each other, and the amplification circuit 143 is constituted of linear circuits 143a and 143b that are connected in series with each other.

In the linear circuit 142b, the slue rate with respect to a level change that causes an increase in the level of the output is set to be greater than the slue rate in the amplification circuit 143b. In the linear circuit 143b, the slue rate with respect to a level change that causes a decrease in the level of the output is set to be greater than the slue rate in the amplification circuit 142b.

The output from the preamplifier 141 is inputted to the linear circuit 142a of the amplification circuit 142 as well as to the linear circuit 143a of the amplification circuit 143. Then, the output of the linear circuit 142a is inputted to the linear circuit 142b and the output of the linear circuit 143a is inputted to the linear circuit 143b. Thus, the signal amplifier releases a sum of the output of the amplification circuit 142 and the output of the amplification circuit 143 as an output signal.

When there is a level change that causes an increase in the level of the output from the preamplifier 141, the linear circuit 142b responds the level change at high speeds, and releases a corresponding output signal. When there is a level change that causes a decrease in the level of the output from the preamplifier 141, the linear circuit 143b responds the level change at high speeds, and releases a corresponding output signal. In other words, the second signal amplifier provides an output that is obtained by responding to the input signal at high speeds irrespective of level changes in the input signal.

Figure 37:
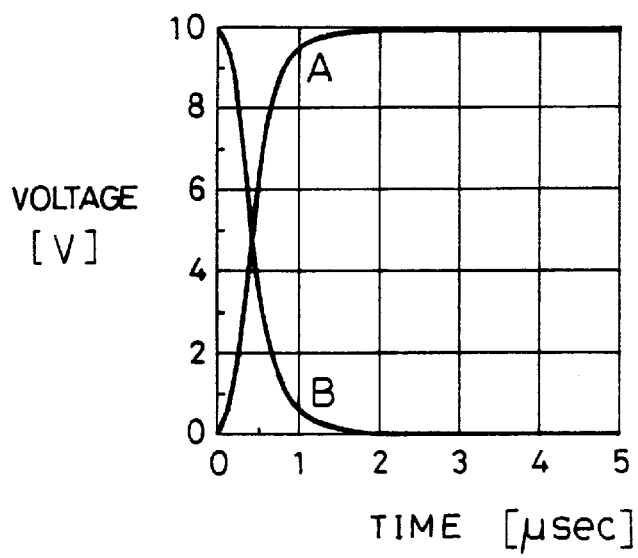
FIG. 37 is a graph showing response characteristics of the second signal amplifier wherein the operational-amplifier-type linear circuits, shown in FIGS. 34($b$) and ($a$), are adopted.

FIG. 37 shows the response characteristics of the present signal amplifier wherein the cascode-type linear circuit consisting of n-channel transistors, shown in FIG. 34(a), is used as the linear circuit 142b and the cascode-type linear circuit consisting of p-channel transistors, shown in FIG. 34(b), is used as the linear circuit 143b.

Curves A and B represent output signals that are obtained when a signal whose level increases and decreases in a step-like manner is inputted to the preamplifier 141. FIG. 37 clearly shows that the output voltages increase and decrease abruptly in a short period in response to either level change, and that a high-speed response is thus made with respect to either level change.

For comparative purposes, FIGS. 38(a) and 38(b) show the response characteristics of a signal amplifier that is constituted of cascode-type linear circuits whose linear circuits 142b and 143b are made of transistors having the same polarity.

Figure 38:
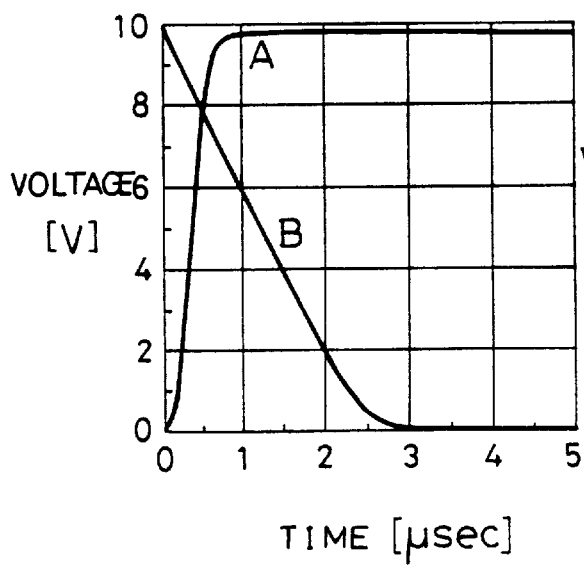
FIG. 38($a$), which shows comparative examples to the response characteristics of FIG. 37, is a graph that shows response characteristics of a signal amplifier which has slow response speeds with respect to an input signal with a decreasing level.
Figure 38:
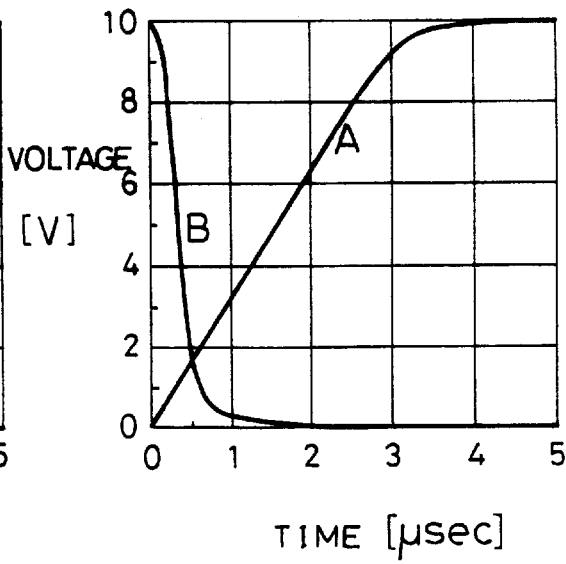

When the cascode-type linear circuits consisting of n-channel transistors are used, the response speed is fast upon receipt of an input signal whose level increases in such a manner as indicated by curve A in FIG. 38(a); however, the response speed is slow upon receipt of an input signal whose level decreases in such a manner as indicated by curve B. Moreover, when the cascode-type linear circuits consisting of p-channel transistors are used, the response speed is fast upon receipt of an input signal whose level decreases in a step-like manner as indicated by curve B in FIG. 38(*b*); however, the response speed is slow upon receipt of an input signal whose level increases in such a manner as indicated by curve A.

Here, the slue rate of the linear circuit 142*b* with respect to a level change that causes a decrease in the level of the input signal and the slue rate of the linear circuit 143*b* with respect to a level change that cause an increase in the level of the input signal hardly affect the slue rate of the second signal amplifier from the point of view of principle. For this reason, as for the linear circuit 142*b*, it is possible to reduce the slue rate with respect to the level change that causes a decrease in the level of the input signal. As for the linear circuit 143*b*, it is possible to reduce the slue rate with respect to the level change that causes an increase in the level of the input signal.

Therefore, the application of the linear circuits 142*b* and 143*b* whose stationary currents are reduced by minimizing the slue rates makes it possible to achieve a signal amplifier having high response speeds with small power consumption.

Additionally, the output load of the preamplifier 141 is only the input capacities of the linear circuits 142*a* and 143*a*, and the output loads of the liner circuits 142*a* and 143*a* are only the input capacities of the linear circuits 142*b* and 143*b*. For this reason, the driving power for the preamplifier 141 and the linear circuits 142*a* and 143*a* may be set to a small value. Therefore, it is possible to adopt the preamplifier 141 and the linear circuits 142*a* and 143*a* whose stationary currents are small, thereby making it possible further suppress the power consumption.

As described above, in accordance of the second signal amplifier which has suppressed power consumption, it is possible to adopt transistors having only small driving performances, such as those formed on multi-crystal silicon thin-films or mono-crystal silicon thin-films. Therefore, this arrangement achieves a signal amplifier with high response-speeds at low costs.

Moreover, the linear circuits 142*a* and 143*a* may be constituted of cascode-type linear circuits consisting of transistors with polarities that are respectively reversed to the linear circuits 142*b* and 143*b*. This allows the offset of the amplification circuit 142 and the offset of the amplification circuit 143 to coincide with each other. More specifically, in this arrangement, the linear circuit 142*a* is constituted of a cascode-type linear circuit consisting of p-channel transistors, and the linear circuit 143*a* is constituted of a cascode-type linear circuit consisting of n-channel transistors.

Therefore, the output level of the amplification circuit 142 becomes coincident with the output level of the amplification circuit 143, thereby reducing interference between the outputs of the amplification circuits 142 and 143. As a result, it is possible to obtain an output signal that has a superior linearity with respect to input signals.

Additionally, any circuits may be adopted as the amplification circuits 142 and 143, as long as they have the above-mentioned characteristics. Further, the amplification circuits 142 and 143 may be formed by combining three or more linear circuits.

THIRD SIGNAL AMPLIFIER

Figure 39:
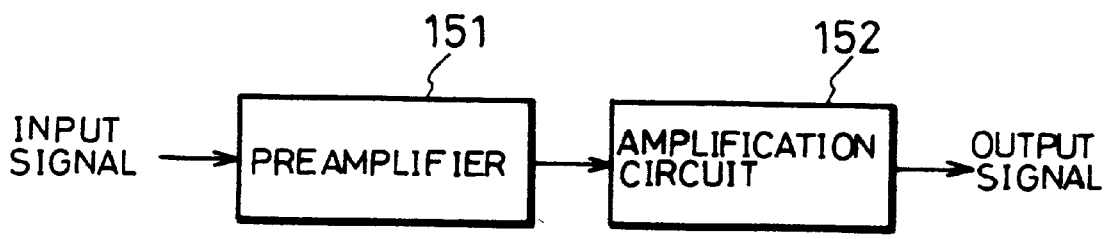
FIG. 39 is a block diagram showing a construction of the third signal amplifier in the third embodiment of the present invention.

As shown in FIG. 39, the third signal amplifier is provided with a preamplifier 151 for linearly amplifying an input signal and amplification circuit 152 which linearly amplifies the output from the preamplifier 151. The preamplifier 151 and the amplification circuit 152 are constituted of, for example, cascode-type linear circuits shown in FIG. 34.

The amplification circuit 152 is constituted of transistors that are selected from the n-channel transistors and the p-channel transistors formed on silicon thin films so as to have a greater conductance per channel width. For example, if the p-channel transistors have a greater conductance per channel width than the n-channel transistors, the preamplifier 151 is constituted by a cascode-type linear circuit consisting of the n-channel transistors, and the amplification circuit 152 is constituted by a cascode-type linear circuit consisting of the p-channel transistors.

In such a circuit, the amplification circuit has a greater driving power per unit area of the transistors. Therefore, in the case of the same occupied area of transistors, it is capable of providing response speeds faster than those of conventional circuits. In other words, it is possible to achieve a signal amplifier which has high response speeds with less occupied area of the transistors.

Additionally, the amplification circuit 152 is not necessarily constituted of a single linear circuit. A plurality of linear circuits may be combined to formed the amplification circuit 152. In this arrangement also, the transistors having the greater conductance per channel width are used in the linear circuit at the last stage.

In general, n-channel transistors, which have a carrier mobility greater than that of p-channel transistors, have a greater conductance per channel width. However, the opposite case is seen depending on the structure of transistors and the manufacturing conditions of transistors.

For example, in the case of transistors formed on a multi-crystal silicon thin-film on an insulating substrate, the threshold voltage may differ greatly between the n-channel transistors and the p-channel transistors. Moreover, even in the case of the same structure of transistors, the withstand voltage between the source and drain may differ greatly between the n-channel transistors and the p-channel transistors. When the offset construction or the LDD (Lightly Doped Drain) construction is adopted in order to make these differences as small as possible, the effective carrier mobility is lowered; therefore, the conductance per channel width may become greater in the p-channel transistors than in the n-channel transistors.

In such a case, in order to form the last stage of the amplification circuit 152, it is more effective to adopt a linear circuit constituted of transistors having a greater conductance per channel width than to adopt a linear circuit constituted of the n-channel transistors.

APPLICATION OF THE SIGNAL AMPLIFIER TO LIQUID CRYSTAL DISPLAYS

In the case of applying the above-mentioned first through third signal amplifiers to an active-matrix-type liquid crystal display shown in FIG. 1, these signal amplifiers are used as the buffer amplifier 18 in the data-signal-line driving circuit 3 of the line-sequential driving type as shown in FIG. 6.

The application of the first through third signal amplifiers having high-speed response characteristics to the buffer amplifier 18 makes it possible to provide more spare time in writing data Therefore, this ensures a better displaying operation in image displays with high resolution and image displays with large screens which have less writing time for data.

For example, in the VGA (Video Graphics Array) standard that has been adopted in personal computers and other apparatuses, it is necessary to write data approximately within 30 μsec. Further, in the case of using a liquid crystal panel corresponding to 25 cm (10-inch type) as an image display, the load becomes more than several tens of pF. Even in such a case where a large amount of load has to be driven in a short period, the signal amplifiers of the present embodiment provide a sufficient data-writing operation.

In particular, in liquid crystal displays having the monolithic construction that are being developed in recent years, thin-film transistors having inferior characteristics (in factors, such as carrier mobility, threshold voltage, and withstand voltage) have to be used as elements of the data-signal-line driving circuit 3. However, the signal amplifiers of the present embodiment are well suited for this application.

Moreover, in the case of using inexpensive glass substrates to meet the demand for large liquid crystal displays having the monolithic construction, the devices have to be manufactured below the distortion point (about 600° C.), and the devices manufactured under such processes are further inferior in their characteristics. Even if these devices having inferior characteristics are used, the signal amplifiers of the present embodiment can achieve a high-speed response characteristic. In addition, the same effects of the signal amplifiers can be obtained even in the case where the driving circuits are formed on a glass substrate and the substrate is assembled on a substrate whereon pixel arrays are disposed.

In the above-mentioned embodiments, the descriptions have been given mainly on the application of the signal amplifiers to liquid crystal displays of the active-matrix type; however, the present invention is not intended to be limited to this application, and can be applied to other image displays of the active-matrix type, or to other systems (for example, video signal processing circuits).

(EMBODIMENT 4)

Referring to FIGS. 1, 6, as well as FIGS. 40 through 46, the following description will discuss the fourth embodiment of the present invention. Here, in the present embodiment, those members that have the same functions and that are described in the first embodiment are indicated by the same reference numerals and the description thereof is omitted. The first through fourth signal amplifiers which are described below are applied to the buffer amplifier 18 in the data-signal-line driving circuit of the line-sequential driving method shown in FIG. 6, in the same manner as the signal amplifiers in the third embodiment.

FIRST SIGNAL AMPLIFIER

Figure 40:
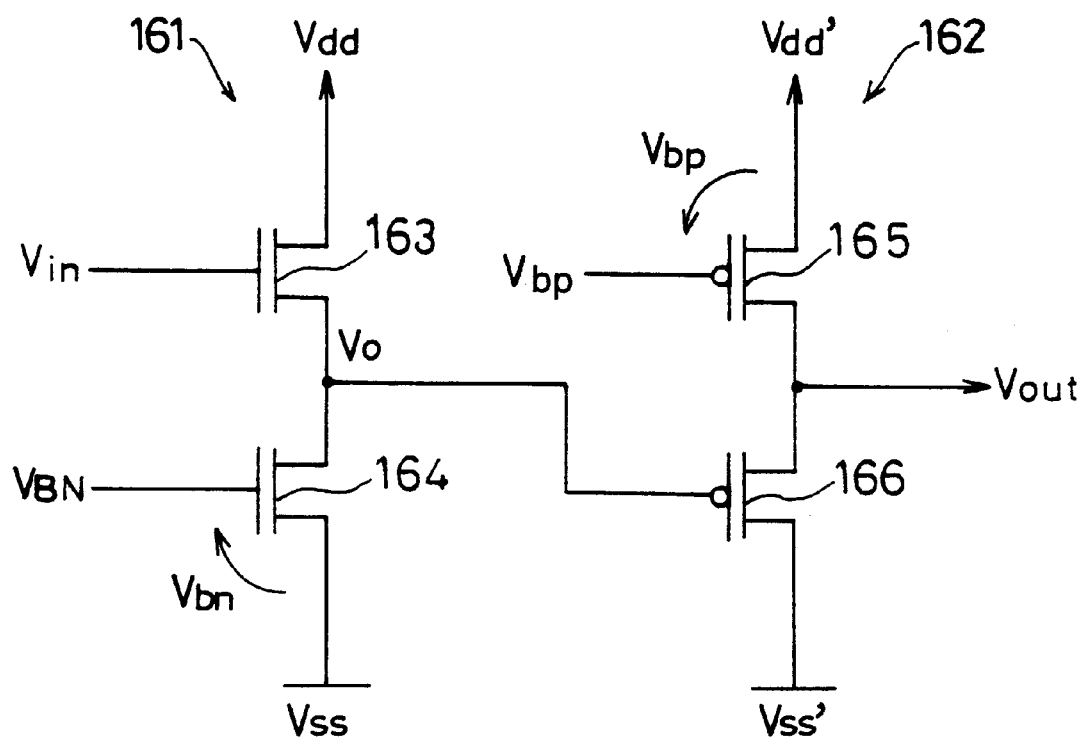
FIG. 40 is a circuit diagram showing a construction of the first signal amplifier in the fourth embodiment of the present invention.

As shown in FIG. 40, the first signal amplifier is constituted of two stages of source-follower-type linear circuits 161 and 162 that form the former stage and the latter stage.

The linear circuit 161 is an NMOS linear circuit which is constituted of n-channel transistors 163 and 164 of the MOS type that have the same device characteristics.

The transistors 163 and 164 are connected in series with each other between the first power supply ($V_{dd}$) with high potential and the second power supply ($V_{ss}$) with low potential. In the n-channel transistor 163 on the first power-supply side, an input voltage $V_{in}$ is inputted to its gate electrode, and in the n-channel transistor 164 on the second power-supply side, a bias voltage $V_{BN}$ is applied to its gate electrode.

The linear circuit 162 is an PMOS linear circuit which is constituted of p-channel transistors 165 and 166 of the MOS type that have the same device characteristics. The transistors 165 and 166 are connected in series with each other between the third power supply ($V_{dd}'$) with high potential and the fourth power supply ($V_{ss}'$) with low potential that are different from those of the above-mentioned NMOS linear circuit. In the p-channel transistor 165 on the third power-supply side, a bias voltage $V_{BP}$ is applied to its gate electrode, and in the p-channel transistor 166 on the fourth power-supply side, its gate electrode is connected to the junction between the n-channel transistors 163 and 164. Thus, an output voltage $V_{out}$ is outputted from the junction between the transistors 165 and 166.

Figure 53:
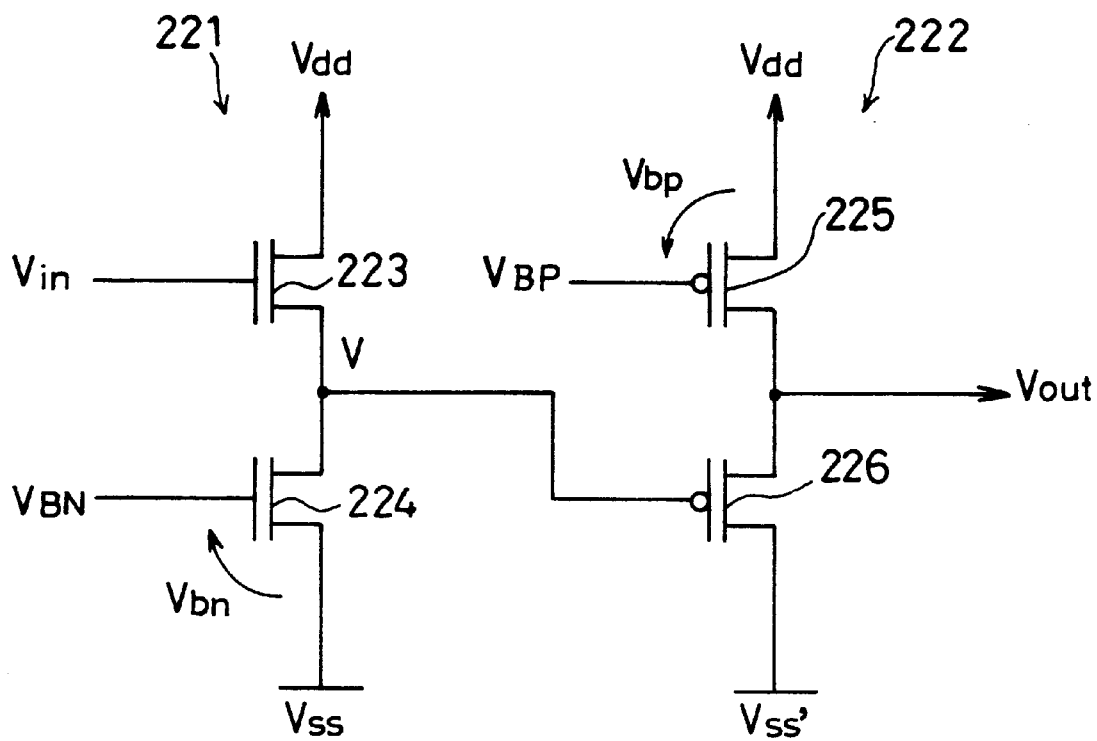
FIG. 53 is a circuit diagram showing another construction of a conventional signal amplifier.
Figure 54:
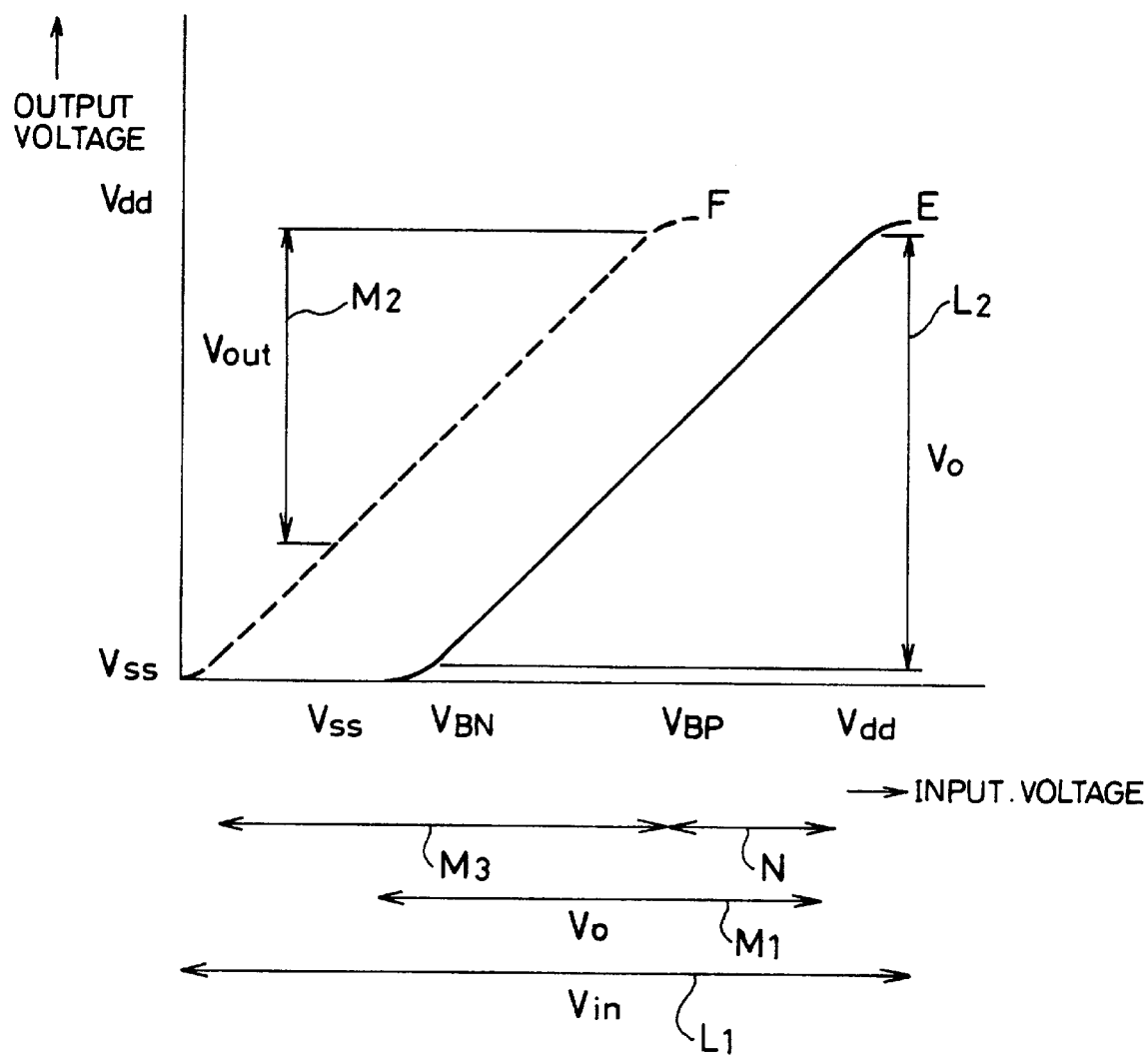
FIG. 54 is a graph showing the input-to-output characteristics of the signal amplifier of FIG. 53.

The first signal amplifier having the above-mentioned arrangement is the same as the signal amplifier (see FIG. 53) that was discussed in BACKGROUND OF THE INVENTION except that the supply voltage of the linear circuit 161 is different from the supply voltage of the linear circuit 162.

Figure 41:
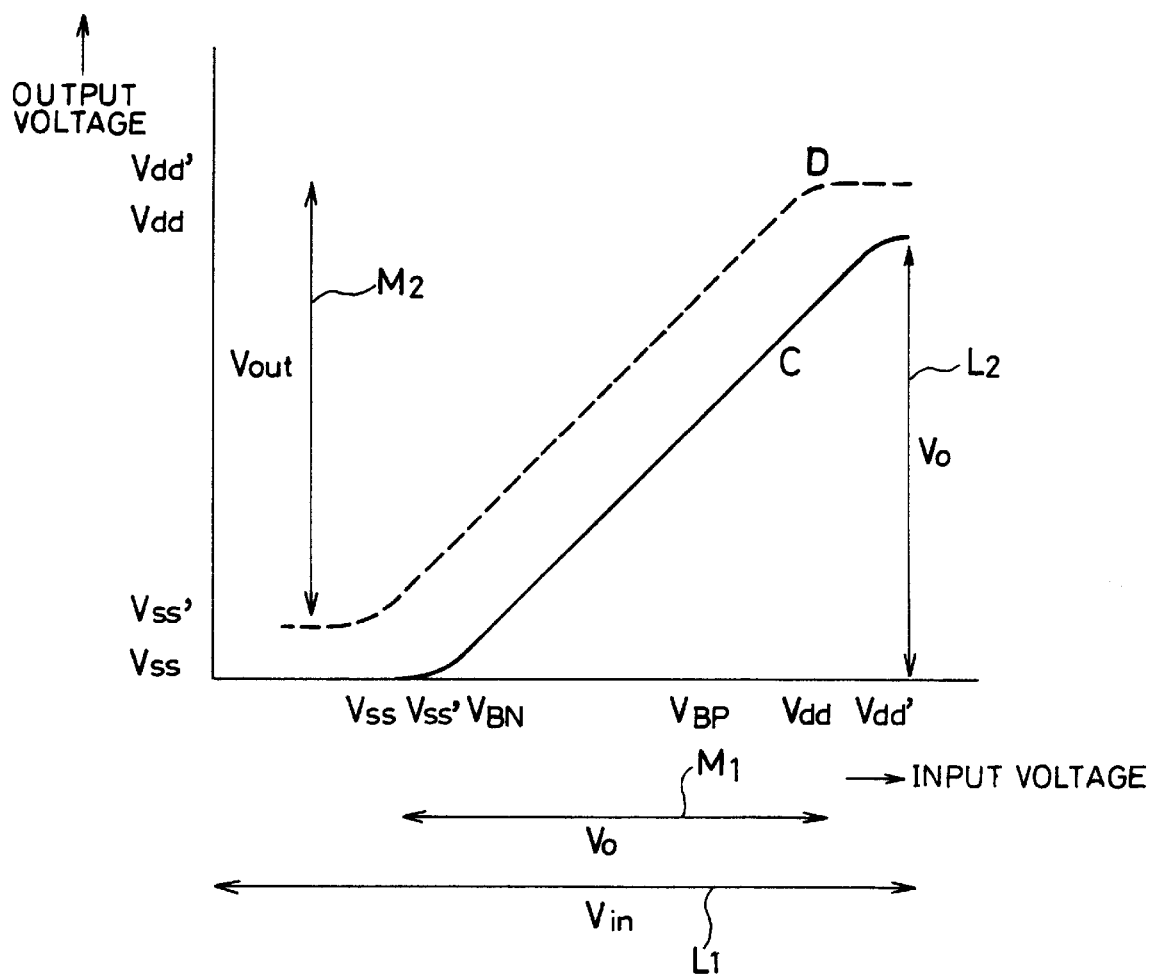
FIG. 41 is a graph showing input-to-output characteristics of respective linear circuits that constitute the first signal amplifier.

FIG. 41 shows input-to-output characteristics of the first signal amplifier. In FIG. 41, curve C indicates input-to-output characteristics of the linear circuit 161, and curve D indicates input-to-output characteristics of the linear circuit 162. Supposing that the input voltage to the present signal amplifier is $V_{in}$, the input voltage $V_{in}$ is represented by line segment $L_1$. The output voltage $V_o$ is represented by line segment $L_2$ that corresponds to the straight line component in curve C, which matches a linear area within the output range of the linear circuit 161. The output voltage $V_o$ of the linear circuit 161 is also represented by line segment $M_1$ as an input voltage to be inputted to the linear circuit 162. Moreover, the output voltage $V_{out}$ of the linear circuit 162 is represented by line segment $M_2$ that corresponds to the straight line component in curve D, which matches a linear area within the output range of the linear circuit 162.

In the first signal amplifier, the source voltage for the linear circuit 162 is shifted in such a direction that a portion of the linear output range of the linear circuit 161 that is offset from the linear input range of the linear circuit 162 is rendered to zero. Therefore, the linear area of the output voltage $V_o$ in the linear circuit 161 is effectively released as the output voltage $V_{out}$ of the present signal amplifier.

Here, an explanation will be given on an optimum amount of shift with reference to FIG. 40. Supposing that a gate voltage is $V_G$, a drain voltage is $V_D$, the threshold voltage of the n-channel transistor is $V_{thn}$, and the threshold voltage of the p-channel transistor is $V_{thp}$, the condition wherein the operational state of the n-channel transistor reaches a saturated area is given as follows:

$$V_G \leq V_D + V_{thn}$$

Further, the condition wherein the operational state of the p-channel transistor reaches a saturated area is given as follows:

$$V_G \leq V_D + V_{thp}$$

Therefore, the area that satisfy the above-mentioned conditions provides the linear area of the present signal amplifier. When the above-mentioned conditions are applied to the n-channel transistors 163 and 164 having the NMOS construction, the following relationships are obtained:

As to the n-channel transistor 163:

$$V_{in} - V_o \leq V_{dd} - V_o + V_{thn} \qquad (20)$$

As to the n-channel transistor 164:

$$V_{BN} - V_{ss} \leq V_o - V_{ss} + V_{thn}$$

$$V_{BN} \leq V_o + V_{thn} \qquad (21)$$

Here, as described earlier, the output $V_o$ of the linear circuit 161 is:

$$V_o = V_{in} - (V_{BN} - V_{ss}) \quad (22)$$

In accordance with (20), (21) and (22), the linear area of the input voltage $V_{in}$ is represented as follows:

$$2V_{BN} - V_{thn} - V_{ss} \leq V_{in} \leq V_{dd} + V_{thn}$$

The linear area of the output voltage $V_o$ is, on the other hand, represented as follows:

$$V_{BN} - V_{thn} \leq V_o \leq V_{dd} - V_{BN} + V_{thn} + V_{ss} \quad (23)$$

As long as the above-mentioned areas are satisfied, the input-to-output characteristic of the linear circuit 161 is given in a linear fashion.

Similarly, as for the p-channel transistors 165 and 166 having the PMOS construction, the following relationships are obtained when the above-mentioned conditions are applied thereto:

As to the p-channel transistor 165:

$$V_{BP} - V_{dd}' \geq V_{out} - V_{dd}' + V_{thp}$$

$$V_{BP} \geq V_{out} + V_{thp} \quad (24)$$

As to the p-channel transistor 166:

$$V_o - V_{out} \geq V_{ss}' - V_{out} + V_{thp}$$

$$V_o \geq V_{ss}' + V_{thp} \quad (25)$$

Here, as described earlier, the output voltage $V_{out}$ of the linear circuit 162 is:

$$V_{out} = V_o - (V_{BP} - V_{dd}') \quad (26)$$

In accordance with (24), (25) and (26), the linear area of the output (input) voltage $V_o$ is represented as follows:

$$V_{thp} + V_{ss}' \leq V_o \leq 2V_{BP} - V_{dd}' - V_{thp} \quad (27)$$

The linear area of the output voltage $V_{out}$ is represented as follows:

$$V_{ss}' + V_{thp} - V_{BP} + V_{dd}' \leq V_{out} \leq V_{BP} - V_{thp}$$

As long as the input voltage $V_o$ and the output voltage $V_{out}$ are located within the above-mentioned areas, the input-to-output characteristic of the linear circuit 162 is given in a linear fashion.

In order to maximize the linear area as the signal amplifier, the linear areas of the linear circuits 161 and 162 are made coincident with each other. Here, conditions on the lower potential side are given as follows in accordance with (23) and (27).

$$V_{BN} - V_{thn} - V_{thp} + V_{ss}'$$

$$V_{ss}' = V_{BN} - V_{thn} - V_{thp} \quad (28)$$

Further, according to FIG. 40, the bias voltages $V_{BN}$ and $V_{BP}$ are represented by the following equations:

$$V_{BN} = V_{ss} + V_{thn} + \alpha \quad (29)$$

$$V_{BP} = V_{dd}' + V_{thp} - \alpha \quad (30)$$

In the above-mentioned equations, $\alpha$ represents a margin voltage which allows the n-channel transistor and the p-channel transistor to operate within the saturated areas with certain amounts of currents.

By substituting equation (29) to equation (28), $V_{ss}'$ is represented as follows:

$$V_{ss}' = V_{ss} - V_{thp} + \alpha \quad (31)$$

Therefore, a necessary shift of $V_{ss}'$ with respect to $V_{ss}$ is given as: $-V_{thp} + \alpha$ $(= V_{dd}' - V_{BP} = -V_{bp})$.

Conditions on the higher voltage side are, on the other hand, given as follows:

$$V_{dd} - V_{BN} + V_{thn} + V_{ss} = 2V_{BP} - V_{dd}' - V_{thp}$$

$$V_{dd}'32\ 2V_{BP} - V_{thp} - V_{dd} + V_{BN} - V_{thn} - V_{ss} \quad (32)$$

By substituting equations (29) and (30) to equation (32), $V_{dd}'$ is represented as follows:

$$V_{dd}' = V_{dd} - V_{thp} + \alpha \quad (33)$$

Therefore, a necessary shift of $V_{dd}'$ with respect to $V_{dd}$ is given as: $-V_{thp} + \alpha$ $(= -V_{BP})$.

Consequently, it is possible to bring the reduction of the linear areas to zero by shifting the power supply for the linear circuit 162 by $-V_{thp} + \alpha$ with respect to the power supply for the linear circuit 161.

Additionally, the first signal amplifier is constituted by two stages of linear circuits 161 and 162. However, the present invention is not intended to be limited to this arrangement, further multiple stages of linear circuits may be adopted. Moreover, as to the respective stages of the linear circuits constituting the signal amplifier, any combination of the NMOS and PMOS circuits may be adopted. Furthermore, although the present embodiment requires a number of power supplies, it is possible to reduce the number of the power supplies by using additional circuits (see FIG. 46) which will be described later.

SECOND SIGNAL AMPLIFIER

Figure 42:
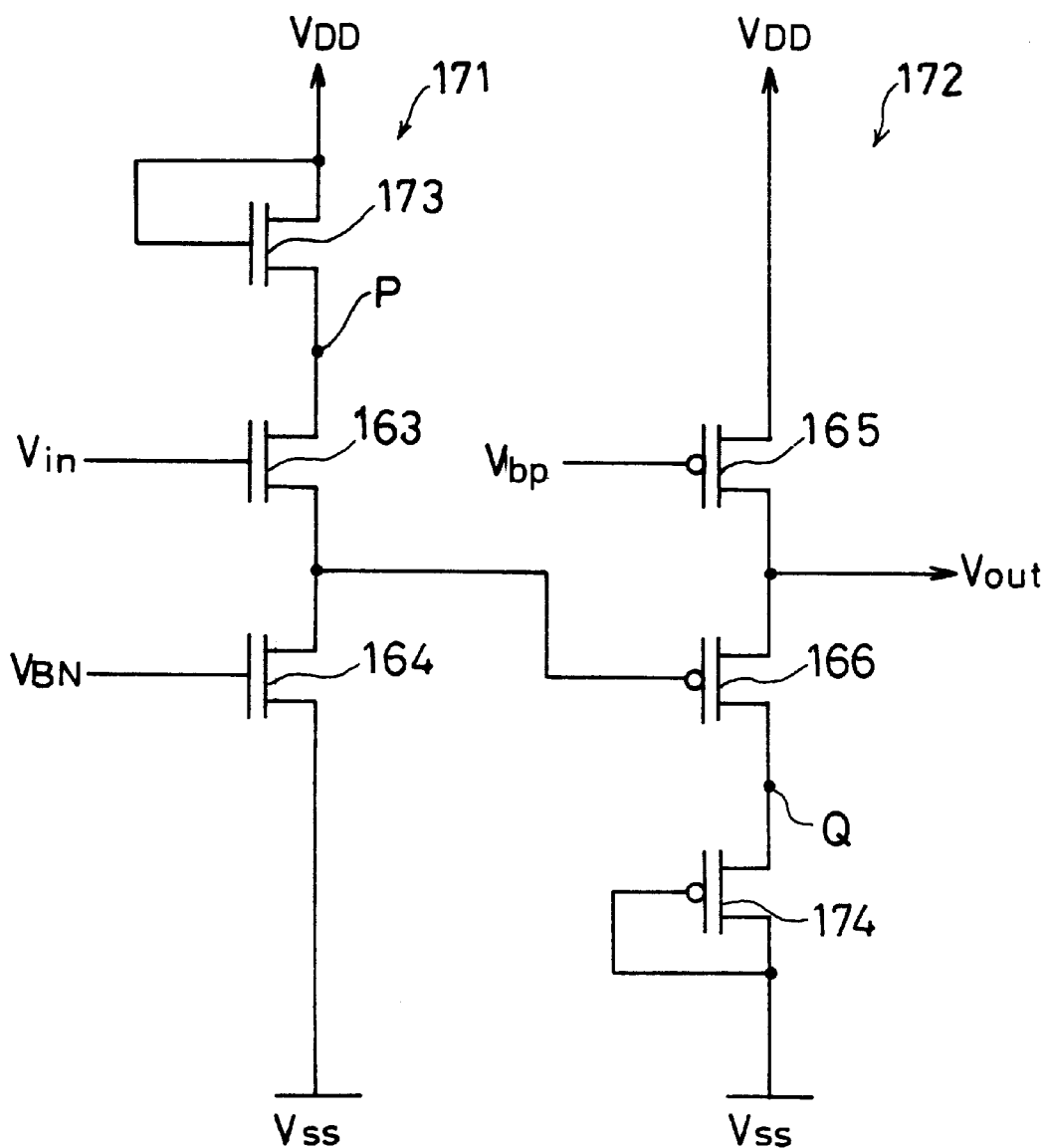
FIG. 42 is a circuit diagram showing a construction of the second signal amplifier in the fourth embodiment of the present invention.

As shown in FIG. 42, the second signal amplifier is constituted of two stages of source-follower-type linear circuits 171 and 172 that form the former stage and the latter stage. This signal amplifier has an arrangement wherein both of the source voltages $V_{dd}$ and $V_{dd}'$ for the first signal amplifier (see FIG. 40) are replaced by a source voltage $V_{DD}$ while both of the source voltages $V_{ss}$ and $V_{ss}'$ are replaced by a source voltage $V_{ss}$, and it is thus driven by a single power supply.

The linear circuit 171 has an arrangement wherein an n-channel transistor 173 is connected in series with the n-channel transistor 163 in the first signal amplifier. The n-channel transistor 173 has its gate electrode and drain electrode short-circuited, and its drain electrode is connected to the high-potential side of the power supply (voltage $V_{DD}$). The linear circuit 172, on the other hand, has an arrangement wherein a p-channel transistor 174 is connected in series with the p-channel transistor 166 in the first signal amplifier. The p-channel transistor 174 has its gate electrode and drain electrode short-circuited, and its drain electrode is connected to the low-potential side of the power supply (voltage $V_{SS}$).

Figure 43:
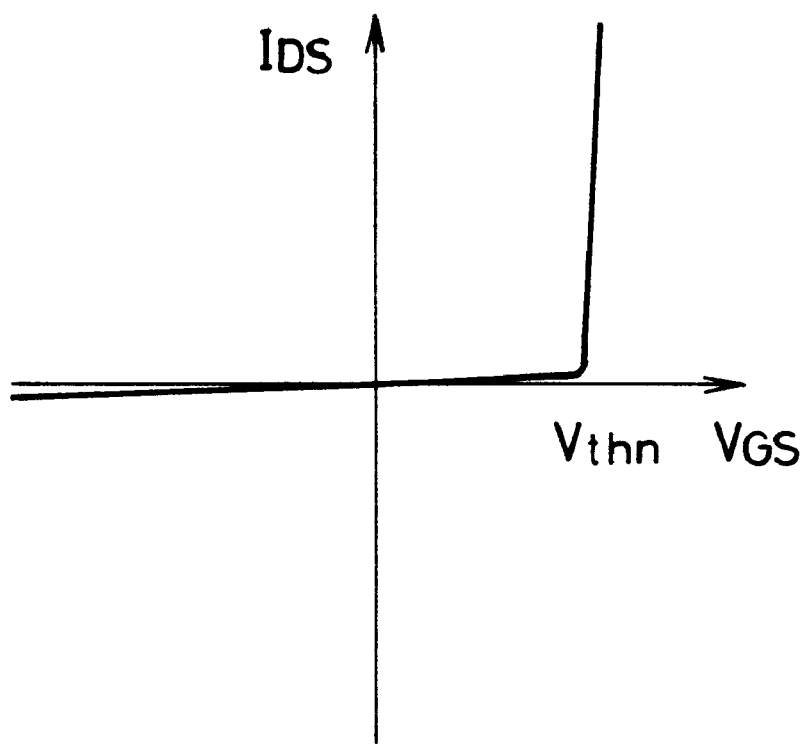
FIG. 43 is a graph showing characteristics of n-channel transistors in the second signal amplifier.

With this arrangement, the relationship of voltage $V_{GS}$ between the source and gate and the source-drain current $I_{DS}$ in the n-channel transistor 173 is given as characteristics shown in FIG. 43. Here, the p-channel transistor 174 has characteristics that are reversed to those of the n-channel transistor 173.

Supposing that the threshold voltage of the n-channel transistor 173 is $V_{thn}$ and the threshold voltage of the p-channel transistor 174 is Vthp, the voltage at junction P between the n-channel transistors 163 and 173 is given as $V_{DD}-V_{thn}$ and the voltage at junction Q between the p-channel transistors 166 and 174 is given as $V_{SS}-V_{thp}$. Therefore, the linear circuit 171 is allowed to operate within a range from $V_{DD}-V_{thn}$ to $V_{SS}$, and similarly, the linear circuit 172 is allowed to operate within a range from $V_{DD}$ to $V_{SS}-V_{thp}$.

As described above, in the present signal amplifier, the n-channel transistor 173 and the p-channel transistor 174 have a function that is the same as the voltage limiter adopted in the fourth sampling circuit of the first embodiment. For this reason, merely by using the same source voltages $V_{DD}$ and $V_{SS}$, the linear circuits 171 and 172 are allowed to operate within respectively different voltage areas.

Additionally, in the present signal amplifier, the n-channel transistor 173 and the p-channel transistor 174 are used; however, another arrangement may be adopted wherein resistors are inserted in place of the transistors 173 and 174 so as to adjust the source voltages in the same manner as described above.

THIRD SIGNAL AMPLIFIER

Figure 44:
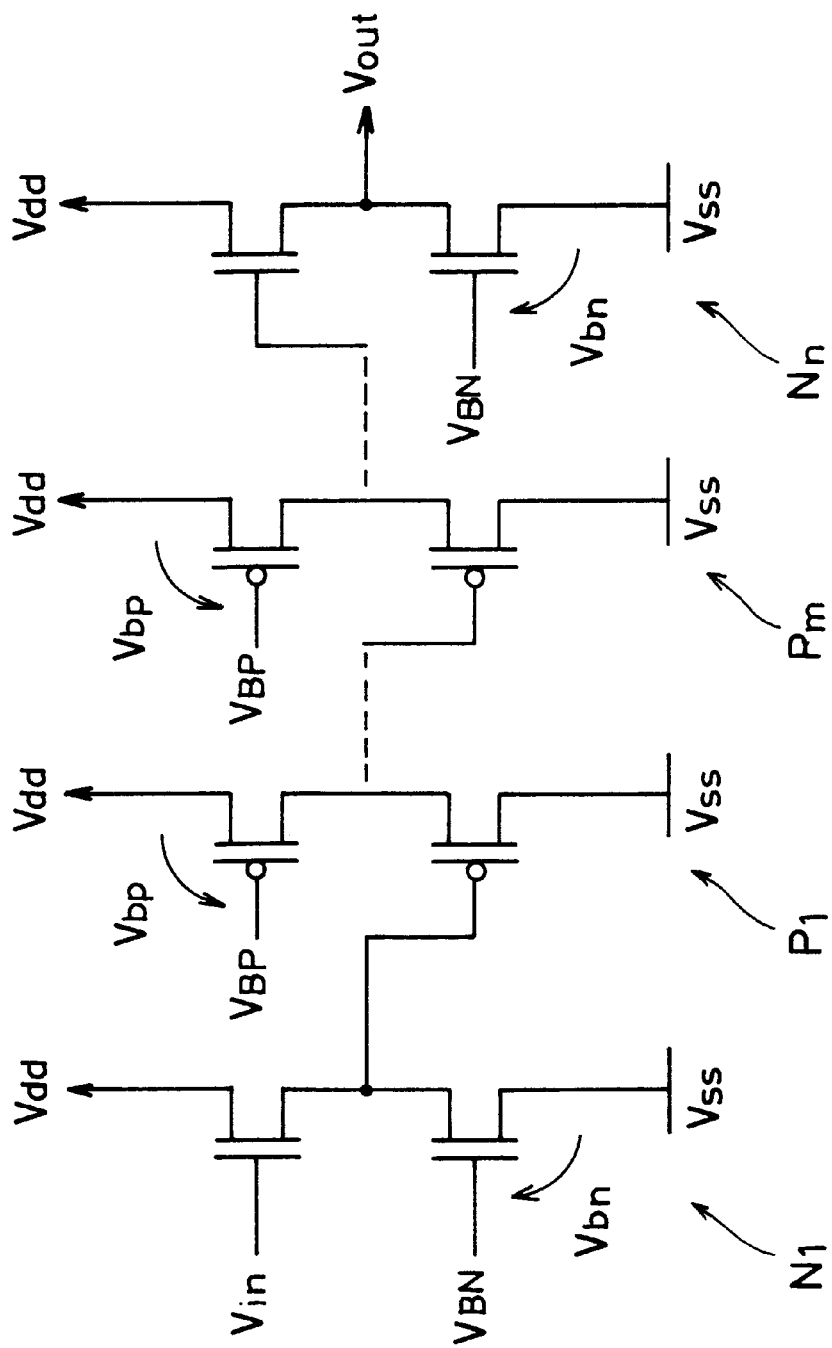
FIG. 44 is a circuit diagram showing a construction of the third signal amplifier in the fourth embodiment of the present invention.

As shown in FIG. 44, the third signal amplifier has a circuit that is constituted of NMOS linear circuits and PMOS linear circuits of the source-follower-type that are connected to one another to form a plurality of stages. In this signal amplifier, a n-number of stages of linear circuits $N_1 \ldots Nn$ (NMOS) and a m-number of stages of linear circuits $P_1 \ldots Pm$ (PMOS) are connected one after the other stage by stage. Here, m and n are positive integers. Each of the linear circuits $N_1 \ldots Nn$ is a circuit consisting of two n-channel transistors connected in series with each other, and each of the linear circuits $P_1 \ldots Pm$ is a circuit consisting of two p-channel transistors connected in series with each other. Further, in the present signal amplifier, source voltages $V_{dd}$ and $V_{ss}$ are supplied to each stage of the linear circuits from the common power-supply system.

In the present signal amplifier, the bias voltage $V_{BN}$ for each n-channel transistor in the linear circuits $N_1 \ldots Nn$ is set to such a voltage as to generate a potential difference $V_{bn}$ between the gate and source, and the bias voltage $V_{BP}$ for each p-channel transistor in the linear circuits $P_1 \ldots Pm$ is set to such a voltage as to generate a potential difference $V_{bp}$ between the gate and source.

In the third signal amplifier having the above-mentioned arrangement, potentials each of which is shifted by a potential difference $V_{bn}$ with respected to an input voltage are released from the linear circuits $N_1 \ldots Nn$ and potentials each of which is shifted by a potential difference $V_{bp}$ with respect to an input voltage are released from the linear circuits $P_1 \ldots Pm$, as was described in BACKGROUND OF THE INVENTION. Accordingly, the output voltage $V_{out}$ is represented as follows:

$$V_{out}=V_{in}-m \cdot V_{bp}-n \cdot V_{bn}$$

Therefore, in the third signal amplifier, the margin voltage α is suppressed to a minimum value required, by setting the positive integers m and n to appropriate values so as to satisfy $m \cdot V_{bp}+n \cdot V_{bn}=0$. This makes it possible to reduce the offset to 0 while maintaining a wide linear characteristic. Here, the integers m and n are preferably set to comparatively small numbers in an actual operation; therefore, it is preferable to adjust the margin a to such a suitable value (different values may be used between the stages of NMOS construction and the stages of PMOS construction).

In the third signal amplifier also, the respective linear circuits may be operated using different power supplies, as was described in the first signal amplifier.

FOURTH SIGNAL AMPLIFIER

Figure 45:
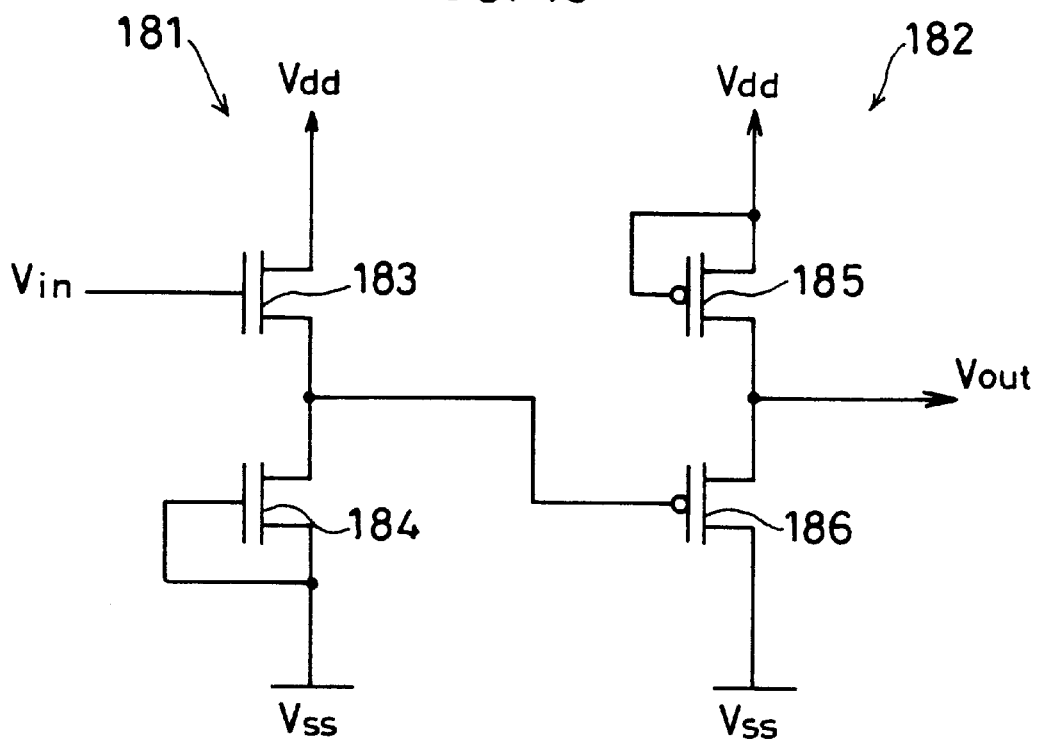
FIG. 45 is a circuit diagram showing a construction of the fourth signal amplifier in the fourth embodiment of the present invention.

As shown in FIG. 45, the fourth signal amplifier is constituted of two source-follower-type linear circuits 181 and 182 that form the former and the latter stages.

The linear circuit 181 is an NMOS linear circuit which is constituted of n-channel transistors 183 and 184 of the depletion type that have the same device characteristics. The transistors 183 and 184 are connected in series with each other between the high-potential power supply ($V_{dd}$) and the low-potential power supply ($V_{ss}$). In the n-channel transistor 183 on the high-potential power-supply side, an input voltage $V_{in}$ is inputted to its gate electrode, and the n-channel transistor 184, placed on the low-potential power-supply side, has its gate electrode and source electrode short-circuited.

The linear circuit 182 is a PMOS linear circuit which is constituted of p-channel transistors 185 and 186 of the depletion type that have the same device characteristics. The transistors 185 and 186 are connected in series with each other between the high-potential power supply ($V_{dd}$) and the low-potential power supply ($V_{ss}$). The p-channel transistor 185, placed on the high-potential power-supply side, has its gate electrode and source electrode connected to each other, and the p-channel transistor 186, placed on the low-potential power-supply side, has its gate electrode connected to the junction between the n-channel transistors 183 and 184. Thus, an output voltage $V_{out}$ is outputted from the junction between the transistors 185 and 186.

In the third signal amplifier having the above-mentioned arrangement, all the transistors 183 through 186 are those of the depletion type. Therefore, even if the potential difference between the gate and source of the bias-use transistors 184 and 185 is zero, the transistors 184 and 185 are allowed to operate within the saturated areas; thus, the present signal amplifier is operated with its input-to-output characteristics kept in a linear fashion.

In other words, it is possible to satisfy $V_{bn}=0$ and $V_{bp}=0$; therefore, $V_{in}=V_{out}$ holds in equation (7). This enables an optimum signal amplifier without offsets.

Additionally, other arrangements may be adopted wherein more stages of the NMOS and PMOS source-follower-type linear circuits are used or only the same linear circuits of the conduction type are used.

Moreover, the above-mentioned first through fourth signal amplifiers are preferably applied to the buffer amplifier 18 of the data-signal-line driving circuit in a liquid crystal display. These signal amplifiers may be also applied to other apparatuses, such as video signal processing circuits.

POWER SUPPLY SYSTEM FOR SIGNAL AMPLIFIERS

Figure 46:
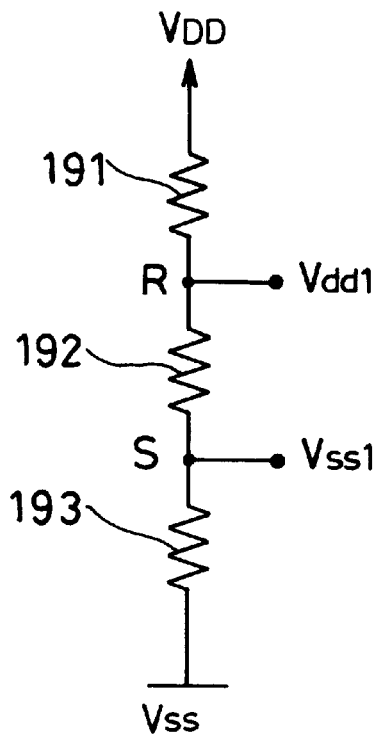
FIG. 46 is a circuit diagram showing a construction of a power supply system that is applied to the first through fourth signal amplifiers.
Figure 47:
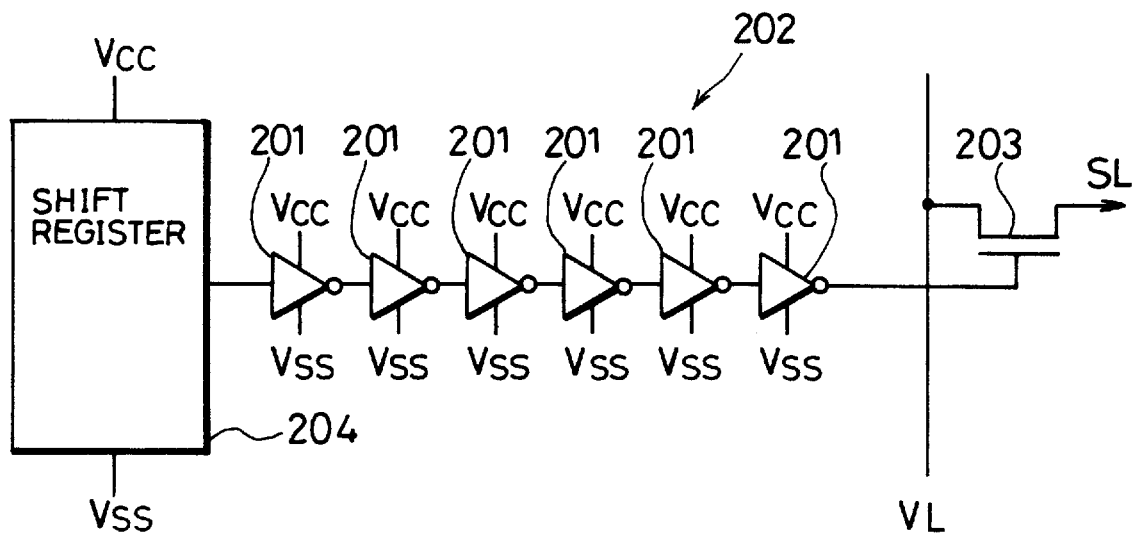
FIG. 47 is a circuit diagram showing a construction of a conventional sampling circuit.
Figure 48:
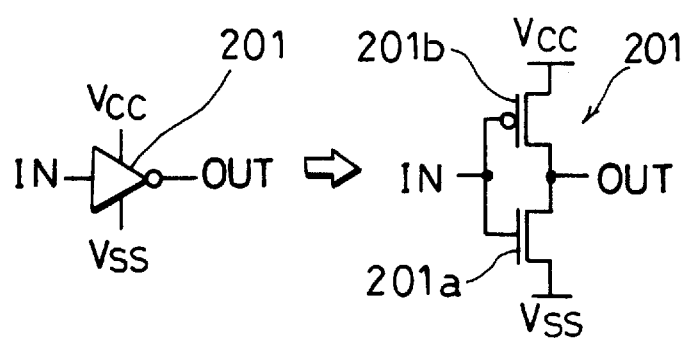
FIG. 48 is a circuit diagram showing a detailed construction of an inverter used in the sampling circuit of FIG. 47.
Figure 49:
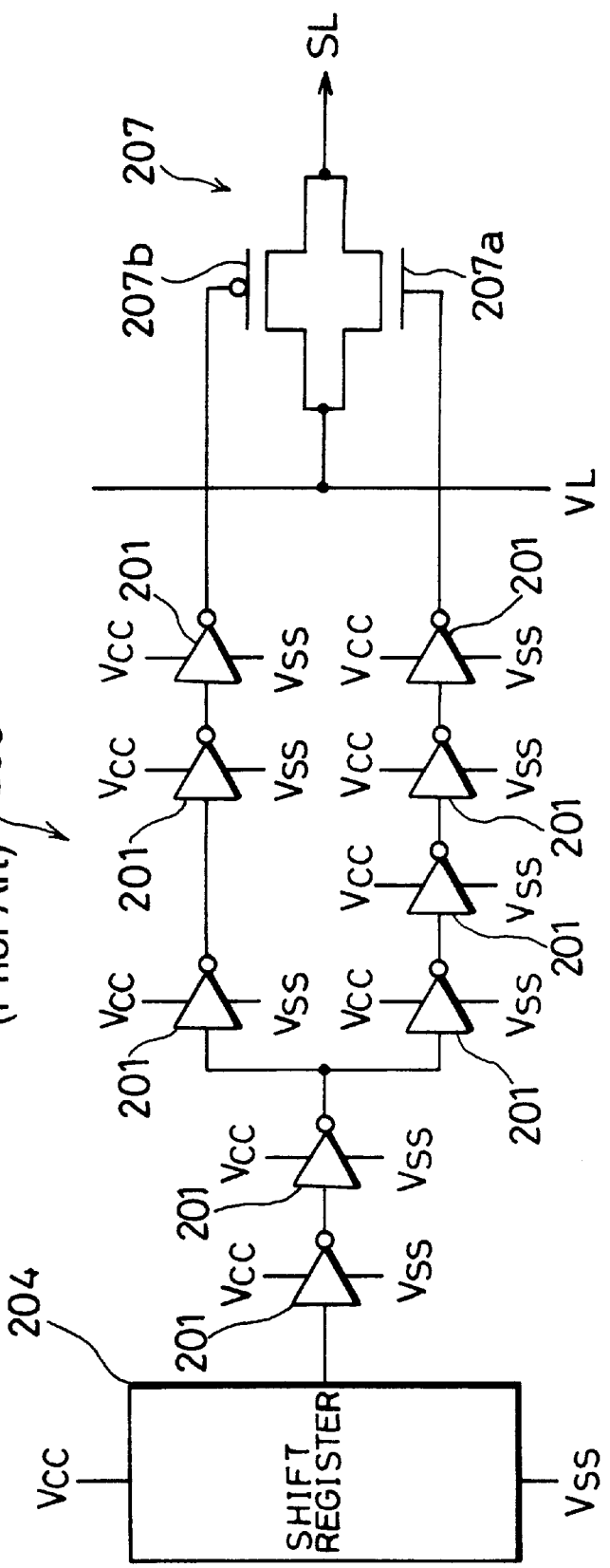
FIG. 49 is a circuit diagram showing a construction of another conventional sampling circuit.
Figure 50:
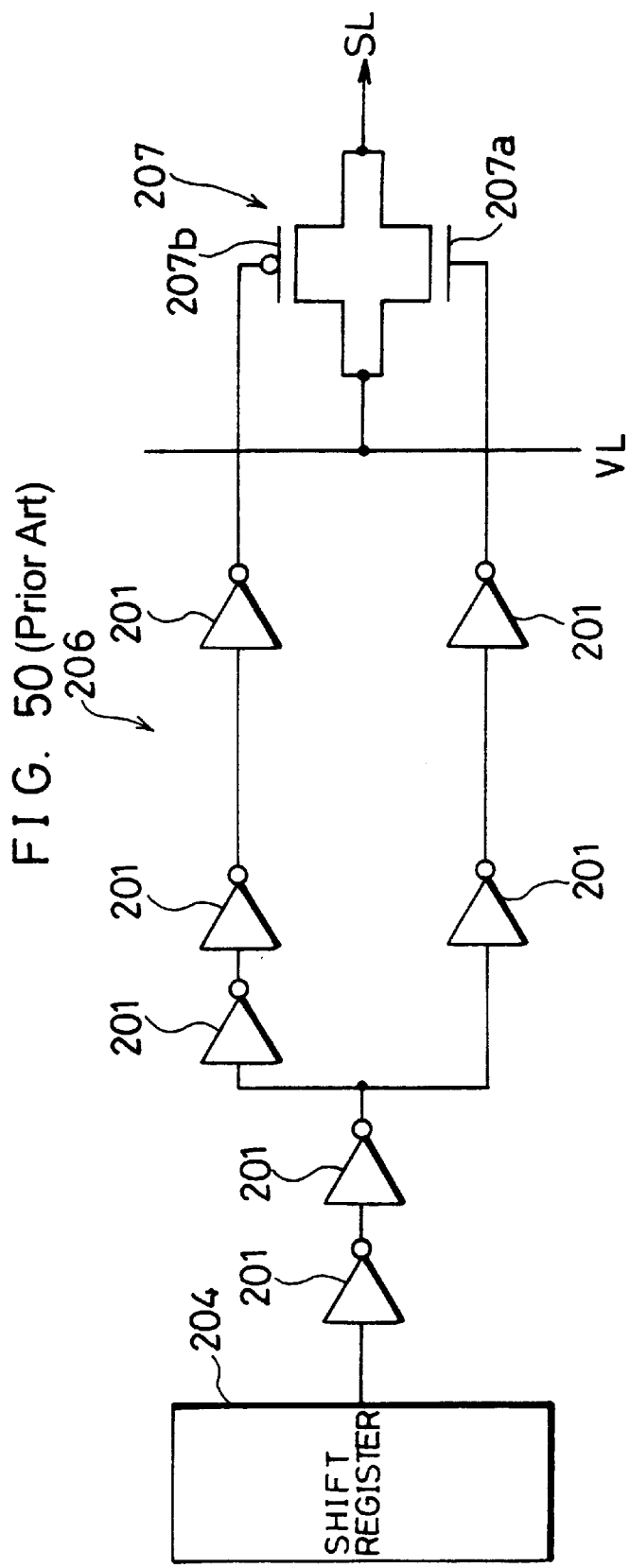
FIG. 50 is a circuit diagram showing a construction of still another conventional sampling circuit.
Figure 51:
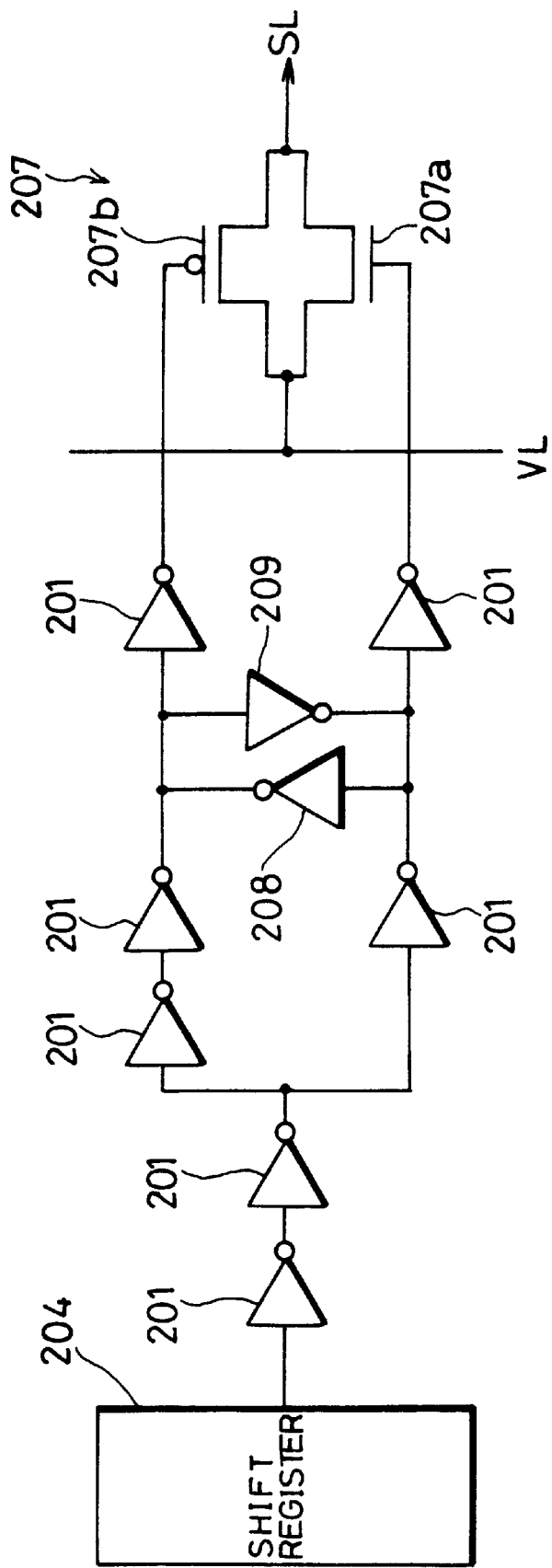
FIG. 51 is a circuit diagram showing a construction of a conventional sampling circuit which is made by adding a latch circuit to the sampling circuit of FIG. 50.
Figure 52:
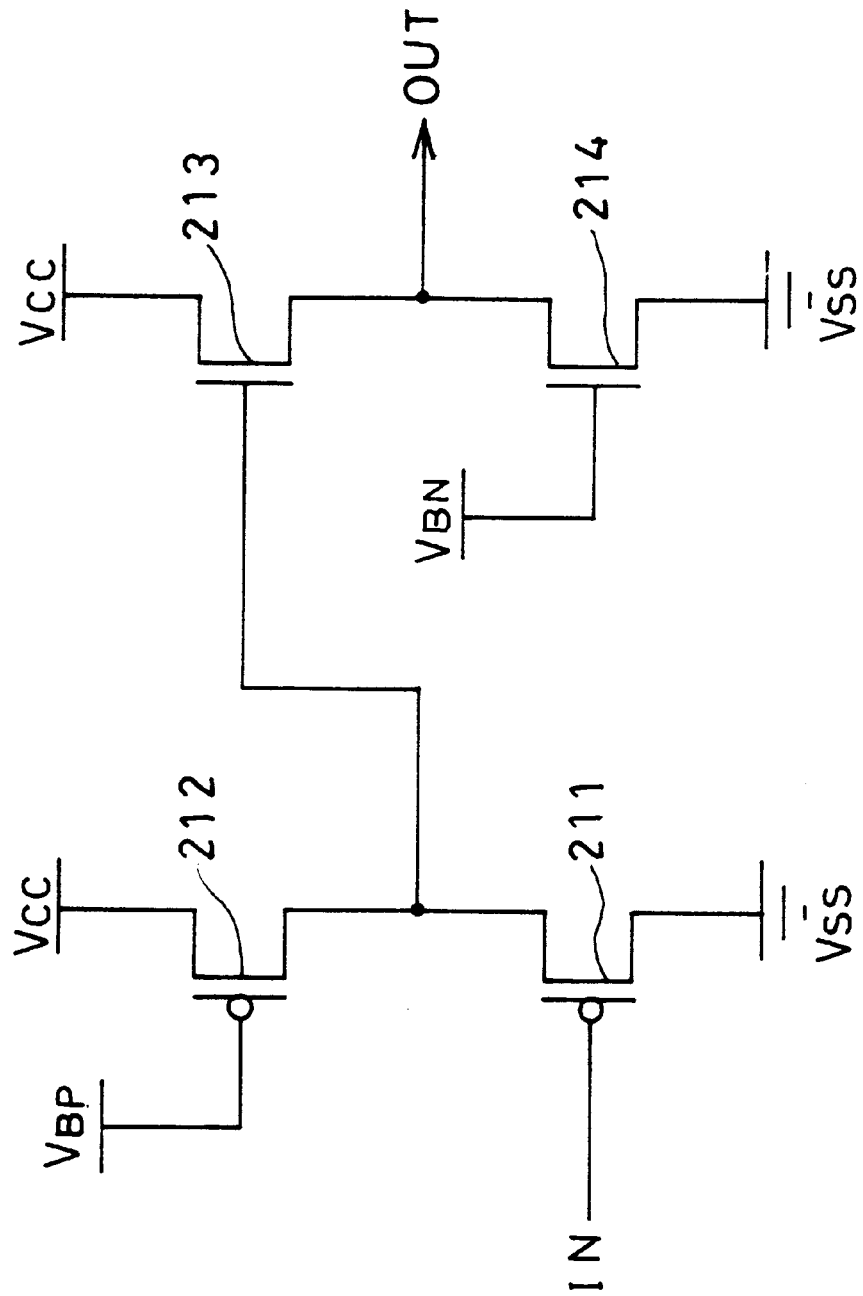
FIG. 52 is a circuit diagram showing a construction of a conventional signal amplifier.

For example, a power supply system, shown in FIG. 46, supplies the first through fourth signal amplifiers with source voltages. In this power supply system, for example, three resistors 191 through 193 are connected in series with one another between the high-potential power supply ($V_{DD}$) and the low-potential power supply ($V_{SS}$) so that the source voltage is divided by the resistors. In the power supply system, different source voltages are applied to the respective linear circuits from point R, that is, the junction between the resistors 191 and 192, and point S, that is, the junction between the resistors 192 and 193.

The above-mentioned power-supply system is applied to a signal amplifier, such as the first and second signal amplifiers, that is constituted of one stage of an NMOS linear circuit consisting of n-channel transistors and one stage of a PMOS linear circuit consisting of p-channel transistors. In addition, the power-supply system is also applied to a signal amplifier that is constituted by using multiple stages of linear circuits and a signal amplifier that is constituted by using only homopolar linear circuits. Moreover, in accordance with the number of stages and characteristics of the linear circuits, it is possible to increase the numbers of the n-channel transistors 173 and the p-channel transistors 174 or the number of the resistors in the second signal amplifiers, or the number of resistive divisions in the present power-supply system.

APPLICATION OF THE SAMPLING CIRCUITS TO LIQUID CRYSTAL DISPLAYS

In the case of applying the above-mentioned first through fourth signal amplifiers to an active-matrix-type liquid crystal display shown in FIG. 1, these signal amplifiers are used as the buffer amplifier 18 in the data-signal-line driving circuit 3 of the line-sequential driving type as shown in FIG. 6. Here, in the first through fourth signal amplifiers, the respective linear circuits, their peripheral circuits, active devices, active circuits (for example, the switching device 5 of the pixel 4), and other components are all formed on the same insulating substrate.

The application of the first through fourth signal amplifiers to the buffer amplifier 18 makes it possible to expand the linear-operation region of the data-signal-line driving circuit 3. Moreover, in this arrangement wherein the respective linear circuits are formed on the same insulating substrate together with other circuits, that is, in the monolithic construction applied to liquid crystal displays, thin-film transistors having inferior characteristics (in factors, such as carrier mobility, threshold voltage, and withstand voltage) have to be used. However, the signal amplifiers of the present embodiment are well suited for this application.

Furthermore, in the case of using inexpensive glass substrates to meet the demand for large liquid crystal displays having the monolithic construction, the devices have to be manufactured below the distortion point (about 600° C.), and the devices manufactured under such processes are further inferior in their characteristics. Even if these devices having inferior characteristics are used, the signal amplifiers of the present embodiments can expand the linear-operation region in the same manner as described above. In addition, the same effects of the signal amplifiers can be obtained even in the case where the driving circuits are formed on a glass substrate and the substrate is assembled on a substrate whereon pixel arrays are disposed.

In the above-mentioned embodiment, the descriptions have been given mainly on the application of the signal amplifiers to liquid crystal displays of the active-matrix type; however, the present invention is not intended to be limited to this application, and can be applied to other image displays of the active-matrix type, as was described in the third embodiment.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A signal amplifier comprising:

a first amplification circuit and a second amplification circuit for amplifying respective input signals almost linearly, the first and second amplification circuits being connected in parallel with each other, wherein upon receipt of an increasing level change in the input signal, the first amplification circuit has a response speed that is greater than that of the second amplification circuit, and upon receipt of a decreasing level change in the input signal, the second amplification circuit has a response speed that is greater than that of the first amplification circuit.

2. The signal amplifier as defined in claim 1, wherein the first amplification circuit is a cascode-type linear circuit constituted of a plurality of series connected n-channel transistors of MOS type and the second amplification circuit is a cascode-type linear circuit constituted of a plurality of series connected p-channel transistors of MOS type.

3. The signal amplifier as defined in claim 1, wherein each of the first and second amplification circuits is made up of a differential amplifier that is constituted of n-channel transistors and p-channel transistors of MOS type and that is disposed at the former stage, and a source-follower circuit that is constituted of n-channel transistors and p-channel transistors of MOS type and that is disposed at the latter stage.

4. The signal amplifier as defined in claim 1, wherein: the first amplification circuit is provided with a first linear circuit for amplifying an input signal almost linearly and a second linear circuit for amplifying an output signal from the first linear circuit almost linearly; and the second amplification circuit is provided with a third linear circuit for amplifying an input signal almost linearly and a fourth linear circuit for amplifying an output signal from the third linear circuit almost linearly.

5. The signal amplifier as defined in claim 4, wherein: the second linear circuit is a cascode-type linear circuit constituted of a plurality of series connected n-channel transistors of MOS type; and the fourth linear circuit is a cascode-type linear circuit constituted of a plurality of series connected p-channel transistors of MOS type.

6. The signal amplifier as defined in claim 4, wherein each of the second and fourth linear circuits is made up of a differential amplifier that is constituted of n-channel transistors and p-channel transistors of MOS type and that is disposed at the former stage, and a source-follower circuit that is constituted of n-channel transistors and p-channel transistors of MOS type and that is disposed at the latter stage.

7. The signal amplifier as defined in claim 4, wherein the first linear circuit is constituted of p-channel transistors of MOS type and the third linear circuit is constituted of n-channel transistors of MOS type.

8. The signal amplifier as defined in claim 1, wherein the first and second amplification circuits are installed on a multi-crystal silicon thin film formed on an insulating substrate.

9. The signal amplifier as defined in claim 1, wherein the first and second amplification circuits are installed on a mono-crystal silicon thin film formed on an insulating substrate.

* * * * *